(12) United States Patent
Ishitsuka et al.

(10) Patent No.: US 7,084,477 B2
(45) Date of Patent: Aug. 1, 2006

(54) SEMICONDUCTOR DEVICE AND MANUFACTURING METHOD OF THE SAME

(75) Inventors: Norio Ishitsuka, Chiyoda (JP); Tomio Iwasaki, Tsukuba (JP); Hiroyuki Ohta, Tsuchiura (JP); Hideo Miura, Sendai (JP); Masahito Takahashi, Tachikawa (JP); Norio Suzuki, Mito (JP); Shuji Ikeda, Koganei (JP); Hideki Tanaka, Chino (JP); Hiroyuki Mima, Hitachinaka (JP)

(73) Assignees: Hitachi, Ltd., Tokyo (JP); Trecenti Technologies, Inc., Hitachinaka (JP)

( * ) Notice: Subject to any disclaimer, the term of this patent is extended or adjusted under 35 U.S.C. 154(b) by 0 days.

(21) Appl. No.: 10/600,771

(22) Filed: Jun. 23, 2003

(65) Prior Publication Data

US 2004/0058499 A1    Mar. 25, 2004

(30) Foreign Application Priority Data

Jun. 24, 2002    (JP)    ............................. 2002-182323
Nov. 26, 2002   (JP)    ............................. 2002-342143

(51) Int. Cl.
    *H01L 29/00* (2006.01)
(52) U.S. Cl. ..................... 257/501; 257/503; 257/510
(58) Field of Classification Search ........ 257/314–326, 257/499–523
    See application file for complete search history.

(56) References Cited

U.S. PATENT DOCUMENTS 5,561,078 A * 10/1996 Tasaka ..................... 438/437
5,930,633 A * 7/1999 Liaw ....................... 438/296
5,972,759 A * 10/1999 Liaw ....................... 438/296
6,184,071 B1 * 2/2001 Lee ......................... 438/197
6,235,606 B1 * 5/2001 Huang et al. .............. 438/400
6,243,286 B1   6/2001 Kumagai et al.
6,395,598 B1   5/2002 Hirai et al.
6,406,987 B1 * 6/2002 Huang ...................... 438/595
6,642,124 B1  11/2003 Yamauchi
2002/0008019 A1 * 1/2002 Nishioka ................ 204/192.37
2002/0137282 A1 * 9/2002 Su ............................ 438/257
2003/0100166 A1 * 5/2003 Pividori ..................... 438/424

FOREIGN PATENT DOCUMENTS

| JP | 8-97210 | 4/1996 |
| JP | 8-279566 | 10/1996 |
| KR | 1998-015456 | 5/1998 |
| WO | WO 02/063690 | 8/2002 |

* cited by examiner

*Primary Examiner*—H. Jey Tsai
(74) *Attorney, Agent, or Firm*—Antonelli, Terry, Stout and Kraus, LLP.

(57) ABSTRACT

To suppress defects occurred in a semiconductor substrate, a semiconductor device is constituted by having: the semiconductor substrate; an element isolating region having a trench formed in the semiconductor substrate and an embedding insulating film which is embedded into the trench; an active region formed adjacent to the element isolating region, in which a gate insulating film is formed and a gate electrode is formed on the gate insulating film; and a region formed in such a manner that at least a portion of the gate electrode is positioned on the element isolating region, and a first edge surface of an upper side of the embedding insulating film in a first element isolating region where the gate electrode is positioned is located above a second edge surface of the embedding insulating film in a second element isolating region where the gate electrode film is not positioned.

12 Claims, 40 Drawing Sheets

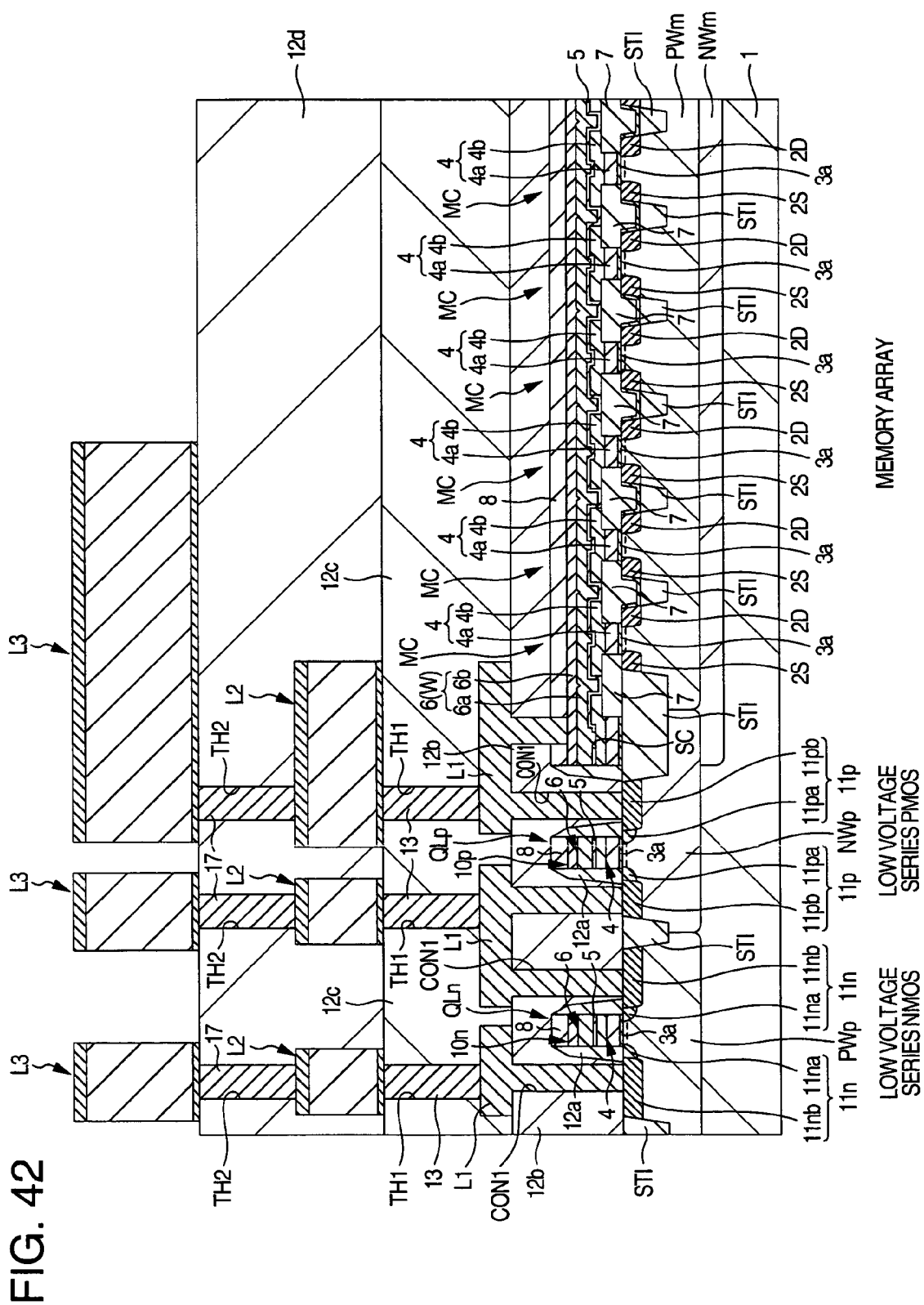

SEMICONDUCTOR DEVICE AND MANUFACTURING METHOD OF THE SAME

BACKGROUND OF THE INVENTION

1. Field of the Invention

The present invention generally relates to a semiconductor device. More specifically, the present invention is directed to a semiconductor device having an element isolating region provided with a trench and an insulating film embedded in the trench, and a manufacturing method thereof.

2. Description of the Related Art

In MOS transistors, while insulating films which constitute side walls are formed on side walls of gate electrodes of these MOS transistors, impurities are implanted in both ends of the insulating films so as to form source regions and drain regions. There are many cases in which crystalline defects may occur in silicon substrates at edge portions of the source regions and drain regions of MOS transistors. As one such method that is capable of preventing the above-described crystalline defects, JP-A-08-97210 (patent publication No. 1) discloses a semiconductor device structure, as indicated in FIG. 8, in which the oxide film is interposed between the side surface of the gate electrode, the silicon nitride film which constitutes the side wall, and the substrate under this silicon nitride film.

Also, nonvolatile semiconductor memory devices capable of electrically writing/erasing data can be easily used, for instance, data are rewritable under such a condition that these nonvolatile semiconductor memory devices are assembled on wiring boards. As a result, these nonvolatile semiconductor memory devices have been widely utilized in various sorts of products which require memories.

More specifically, electrically erasable programmable read-only memories (EEPROM, will be also referred to as "flash memories" hereinafter) own such a function capable of electrically erasing data of a predetermined range (e.g., all memory cells of a memory array, or a predetermined memory cell group of a memory array) within a memory array in a batch manner. Furthermore, since flash memories may have 1-transistor stacked layer gate structures, memory cells thereof may be gradually made compact and, therefore, higher levels of integration of these memory cells may be greatly expected.

A 1-transistor stacked layer gate structure, constituting one nonvolatile memory cell (will be abbreviated as "memory cell" hereinafter), is basically formed of one two-layer gate metal-insulator-silicon field-effect transistor (will be abbreviated as "MISFET" hereinafter). This two-layer gate MISFET is formed in such a way that a floating gate electrode is formed via a tunnel insulating film on a semiconductor substrate, and, further, a control gate electrode is stacked via an interlayer film on this formed floating gate electrode. A data storing operation is carried out in which electrons are injected into the floating gate electrode and electrons are extracted from the floating gate electrode.

As to flash memories, both a parallel type flash memory having such a memory array structure, and a method of using this parallel type flash memory are disclosed in, for example, JP-A-08-97210. This parallel type flash memory is constructed by containing a plurality of memory cells which are arranged in a matrix shape on a semiconductor substrate in such a manner that source/drain regions of the above-explained plural memory cells are parallel connected to each other in the respective rows of this matrix, and word lines are elongated in the respective columns of this matrix. This sort of flash memory is also referred to as an "AND type flash memory."

However, the Inventors of the present invention have found that the memory structures of the above-described prior art cannot sufficiently suppress crystalline defects which occur in substrates of active regions containing source regions, drain regions, and the like. The reason for this is given as follows: the occurrences of the crystalline defects not only result from stresses of gate electrodes, but also stresses produced from element isolating regions as well as factors caused by implanted impurities, which may have unduly large influences.

The Inventors of the present invention have also found the below-mentioned problems in the development of semiconductor integrated circuit devices having the above-described AND type configured flash memories. Namely, since flash memories are being manufactured with higher levels of integration, memory cells are correspondingly made very fine. At the same time, occurrence of crystalline defects in substrates have correspondingly increased. Therefore, such has been determined that junction leaks in the memory cells may occur many times, so that data reading failures may occur in these memory cells, or data destroy modes may occur.

This crystalline defect may be caused by, for instance, stresses produced in regions into which impurity ions have been implanted, and stresses produced in the forming steps of either gate electrodes or element isolating portions. More specifically, in such a case that an element isolating portion is constructed of a shallow trench isolation (Shallow Trench Isolation; will be referred to as "STI" hereinafter), such a fact could be seen that a large number of crystalline defects are produced in a substrate.

An STI is formed in such a manner that, for example, after a shallow trench has been formed in a substrate, an insulating film is embedded inside this trench and a surface of this embedded insulating film is, furthermore, flattened (i.e., planarized). However, at a thermal processing step higher than, or equal to 800° C., which is executed after the STI has been formed, a volume expansion may occur which is caused by the growth of an oxide film on a side wall of the trench, and this volume expansion is restricted by the insulating film embedded inside the trench, so that compression stresses are produced in the substrate, which may cause the occurrences of the crystalline defects.

This compression stress may be easily concentrated to such a place that a width of an active region is relatively narrow and also pattern density is relatively high. As a consequence, in a flash memory, a large number of crystalline defects may occur in such a region that a width of an active region is relatively wide, for instance, in a memory array where a width of an active region is relatively narrower than that of a peripheral circuit region, which may conduct junction leaks of a memory cell.

BRIEF SUMMARY OF THE INVENTION

As a consequence, a primary object of the present invention is to provide a semiconductor device having superior performance, capable of effectively suppressing the formation of a crystalline defect in a substrate, and also to provide a method of manufacturing the semiconductor device.

A secondary object of the present invention is to provide such a technique capable of improving margin of a junction leak of a memory cell, while suppressing the formation of a crystalline defect in a substrate of a flash memory.

To achieve the above-explained objects, the present invention is featured by that an embedding oxide film in an element isolating region is caused to fall in a semiconductor device. As a result, an occurrence of crystalline defects of a substrate can be suppressed. Concretely speaking, this semiconductor device of the present invention may be realized by employing the below-mentioned structure.

The Inventors of the present invention have investigated such a fact that crystalline defects may readily occur in such a case that while an element isolating region is formed on a silicon substrate of a semiconductor device and a gate structure is formed in an element forming region, such an impurity as either arsenic or phosphor is implanted into this silicon substrate in high concentration. As a result, when the impurity is implanted into the silicon substrate, a high stress (namely, impurity-caused stress) may be produced in such a region into which the impurity has been implanted (namely, impurity forming region). The Inventors of the present invention have determined that this impurity-caused stress is restricted by such a stress (STI stress) which is produced in the manufacturing steps of gate structures and element isolating regions, resulting in the crystalline defects. Based upon this fact, the present Inventors have ascertained that since the STI stress is reduced without restricting the impurity-caused stress, the crystalline defects can be suppressed.

Alternatively, the element isolating region may correspond to such a region that a trench is formed in a silicon substrate, and, for example, an embedding oxide film is embedded into this trench. There are many silicon substrate oxidization steps in a transistor manufacturing stage. Since oxygen which constitutes an oxidization seed is diffused via an embedding oxide film into an internal portion of this trench, an oxide film may also be grown on a side wall of the trench. When Si (silicon) is changed into $SiO_2$ (silicon oxide), an approximately twice volume expansion may occur. Since this volume expansion is restricted by the embedded oxide film, a high compression stress may be produced in the silicon substrate. As a result, in order to reduce this high compression stress, the embedding oxide film which has been embedded into the trench is caused to fall from the surface of this silicon substrate (i.e., the outer (or upper) surface of the embedding oxide film is recessed from the outer (or upper) surface of the silicon substrate). As a consequence, the stress caused by the oxidization process is reduced, so that the crystalline defects could be suppressed according to the present invention.

Also, concretely speaking, the present invention may be realized by the below-mentioned embodiment modes.

(1) A semiconductor device, according to an aspect of the present invention, is featured by such a semiconductor device comprising: a semiconductor substrate; an element isolating region having a trench formed in the semiconductor substrate and an embedding insulating film which is embedded into the trench; an active region formed adjacent to the element isolating region, in which a gate insulating film is formed and a gate electrode is formed on the gate insulating film; and a region formed in such a manner that at least a portion of the gate electrode is positioned on the element isolating region, and a first edge surface of an upper side of the embedding insulating film in a first element isolating region where the gate electrode is positioned is located above a second edge surface of the embedding insulating film in a second element isolating region where the gate electrode film is not positioned.

The second element isolating region where the gate electrode is not positioned may be realized by, for example, such a region located around the first element isolating region. The edge surface of the insulating film which is measured as the second element isolating region may be measured in such a measuring region which is separated from a trench-sided edge portion of the element isolating region by a depth of this trench. If the measuring region is not clearly defined, then a measurement may be carried out in a region which contains a center region of element isolating regions sandwiched by the active region. For instance, in such a case that a lowered portion which is located lower than the element isolating region is formed in the substrate-sided edge portion of the element isolating region, any regions except for this region may be employed as the measuring region.

It should be understood that the above-described first boundary plane corresponds to, for example, such a boundary plane of a region located opposite to the gate electrode located over the embedding insulating film among the boundary planes of the embedding insulating film. Also, for instance, this second boundary plane corresponds to such a boundary plane located opposite to an interlayer insulating film which is formed over the embedding insulating film among the boundary planes of this embedding insulating film.

(2) In the item (1), a difference between the first edge surface and the second edge surface is larger than a thickness of the gate insulating film.

In the step for forming the gate electrode, such a stepped portion may be formed by an amount larger than such a stepped portion which would probably be formed in the case that the present invention is not applied. As one example, this stepped portion is defined as the thickness of the gate insulating film in this embodiment mode.

(3) In the item (1), the active region owns an impurity region in which an impurity has been implanted into the semiconductor substrate in correspondence with the gate electrode; and a difference between the first edge surface and the second edge surface is larger than a distance defined from a surface of the semiconductor substrate up to a depth in the impurity region where concentration of the impurity becomes maximum.

(4) In the item (1), a difference between the first edge surface and the second edge surface is larger than, or equal to 40 nm. Otherwise, a difference between the first edge surface and the second edge surface is smaller than, or equal to 200 nm. More preferably, this difference between the first edge surface and the second edge surface may be located within a range of these values.

(5) The boundary plane of the embedding insulating film may be formed lower than the semiconductor substrate.

For instance, a semiconductor device is featured by comprising: a semiconductor substrate; an active region having a gate electrode formed on the semiconductor device; and an element isolating region having both a trench formed in the semiconductor substrate and an embedding insulating film embedded in the trench; in which as to a boundary plane between the embedding insulating film in the element isolating region and a film deposited on the embedding insulating film, a boundary plane of the embedding insulating film which is located at a position furthest from a bottom portion of the trench is formed at a position lower than a surface of the semiconductor substrate where the gate electrode is formed.

Also, the semiconductor device may be preferably comprised of the structure recited in the above-item (1).

It should also be noted that the boundary plane of the embedding insulating film implies such a boundary plane which is located furthest from the trench bottom portion. For example, the uppermost edge portion of this embedding insulating film may be employed. Otherwise, the boundary surface of the insulating film may be measured in such a measuring region which is separated from a trench-sided edge portion of the element isolating region by a depth of this trench. If the measuring region is not clearly defined, then a measurement may be carried out in a region which contains a center region of element isolating regions sandwiched by the active region. For instance, in such a case that a lowered portion which is located lower than the element isolating region is formed in the substrate-sided edge portion of the element isolating region, any regions except for this region may be employed as the measuring region.

(6) In the item (5), the active region owns an impurity region in which an impurity has been implanted into the semiconductor substrate in correspondence with the gate electrode; and a difference between the first edge surface and the second edge surface is lager than a distance defined from a surface of the semiconductor substrate up to a depth in the impurity region where concentration of the impurity becomes maximum.

(7) A semiconductor device is featured by comprising: a semiconductor substrate, the element isolating region, the gate insulating film, the active region, the element isolating region, and an interlayer insulating film deposited on both the element isolating region and the active region, having an upper edge surface located above the gate electrode; in which a portion of the gate electrode is located in the element isolating region; and a portion of the interlayer insulating film which is deposited on the element isolating region located at a peripheral portion of the gate electrode is formed on the bottom plane side of the trench from an upper plane of the embedding insulating film in the element isolating region located under the gate electrode.

As a more concrete example, both the gate electrode film and the gate insulating film are provided with a portion on the active region and the element isolating region. The boundary plane between the embedding oxide film of this element isolating region and this insulating film is caused to fall from the surface of the semiconductor substrate. Also, this boundary plane may be caused to fall from another boundary plane between the gate electrode film and the embedding oxide film over the element isolating region. Alternatively, a boundary plane between the embedding oxide film of this element isolating region and this insulating film is caused to fall from the boundary surface between the gate film provided on the element isolating region and the embedding oxide film, and further to fall from the surface of the semiconductor substrate by such a value larger than, or equal to a forming depth of the impurity.

(8) In the items (1) to (7), an embedding oxide film contains an HDP film which is manufactured by using plasma, the concentration of which is selected to be 1E10 to 1E12 atom/cm$^3$.

(9) A semiconductor device is featured by comprising an interlayer insulating film deposited on both the element isolating region and the active region, having an upper edge surface located above the gate electrode; in which a portion of the gate electrode is located in the element isolating region; and as to boundary planes located opposite to a film deposited on the embedding insulating film in the element isolating region, a first boundary plane in a first element isolating region where the gate electrode is positioned is formed at a position higher than a second boundary plane in a second element isolating region located at a peripheral portion of the first element isolating region; and also, the semiconductor device includes a region arranged in such a manner that a surface of the semiconductor substrate in a region where the gate electrode is arranged is positioned between the first boundary plane and the second boundary plane.

(10) A semiconductor device manufacturing method is featured by comprising: a step in which a trench is formed in a semiconductor substrate, an embedding insulating film having a lower conductivity than a conductivity of the semiconductor substrate is embedded into the trench, and an element isolating region and an active region located adjacent to the element isolating region are formed; a step in which a gate insulating film and a gate electrode film are deposited on the semiconductor substrate, on which an insulating film is deposited and patterned so as to form a gate electrode; and a step in which a portion of the embedding insulating film of the element isolating region is removed, a first region where the gate electrode is positioned is formed on a surface of the embedding insulating film, and a second region lower than the first region is formed around the first region.

(11) In the item (10), the embedding insulating film of the second region is removed by a value larger than, or equal to a thickness of the gate insulating film.

(12) In the item (10), the embedding insulating film of the second region is removed by a value larger than, or equal to 40 nm, and also is removed by a value smaller than, or equal to 200 nm.

(13) A semiconductor device manufacturing method is featured by comprising: a step in which a trench is formed in a semiconductor substrate, an embedding insulating film having a lower conductivity than a conductivity of the semiconductor substrate is embedded into the trench, and an element isolating region and an active region located adjacent to the element isolating region are formed; a step in which a gate insulating film and a gate electrode film are deposited on the semiconductor substrate, on which an insulating film is deposited and patterned so as to form a gate electrode; a step in which a resist is coated on the semiconductor substrate, and the coated resist is patterned; the resist is left in a first region where the gate electrode is positioned in the element isolating region; the resist of a second region where the gate electrode is not positioned is removed; and a portion of the embedding insulating film of the second region is removed; a step in which a thermal oxide film is formed on a surface of the semiconductor substrate; an impurity is implanted into the semiconductor substrate by penetrating the thermal oxide film; and then, the impurity-implanted semiconductor substrate is annealed so as to form an impurity region; a step in which an insulating film having a lower conductivity than a conductivity of the semiconductor substrate is deposited on the semiconductor substrate; a step in which a hole is pierced at a position of the impurity region in the deposited insulating film so as to form a contact hole; and a step in which a conductive material having a higher conductivity than a conductivity of silicon is embedded into the contact hole so as to form a plug.

(14) In the item (13), the embedding insulating film of the second region is removed by such a value larger than, or equal to a depth defined from the substrate in the impurity region up to a maximum concentration of the impurity.

(15) A semiconductor device manufacturing method is featured by comprising:
　(1) a step in which a trench is formed in a semiconductor substrate, an embedding oxide film is embedded into the trench, and both an element isolating region and an active region which is electrically isolated from the element isolating region are formed;

(2) a step in which a gate oxide film, a gate electrode film, and an insulating film are deposited on the semiconductor substrate, and then, the deposited films are patterned so as to form a gate electrode;

(3) a step in which a resist is coated on the semiconductor substrate, the coated resist is patterned, and a portion of the oxide film within the element isolating region is removed;

(4) a step in which a surface of the semiconductor substrate is thermally oxidized so as to form a thermal oxide film, an impurity is implanted from the upper portion of the thermal oxide film into the semiconductor substrate, and then, the implanted semiconductor substrate is annealed so as to form an impurity region;

(5) a step in which an interlayer insulating film is deposited on both the element isolating region and the active region;

(6) a step in which a hole is pierced in the interlayer insulating film so as to form a contact hole;

(7) a step in which a conductive material is embedded into the contact hole so as to form a plug which is electrically communicated to the impurity region; and (8) a step in which a wiring layer which is electrically communicated to the plug is formed on the interlayer insulating film.

(17) Also, the present invention is related to a semiconductor integrated circuit device and a manufacturing technique thereof. More specifically, the present invention is directed to provide a nonvolatile semiconductor memory device suitably realized in a high integration, and, also, such a technique capable of effectively being applied to a manufacturing method thereof.

To achieve the above-described object, for instance, a recess amount of an element isolating portion in a memory array is relatively increased, whereas a recess amount of an element isolating portion in a peripheral circuit region is reduced to zero, or to a relatively small amount. As a result, while the formation of a crystalline defect in a substrate can be suppressed in a flash memory, margin of junction leak of a memory cell can be improved.

Concretely speaking, the IC circuit device may have an isotropic structure.

A semiconductor device manufacturing method is featured by comprising: a step in which a first trench is formed in a region which constitutes an element isolating portion of the memory array of the substrate, and a second trench is formed in a region which constitutes an element isolating portion of the peripheral circuit region of the substrate; a step in which after a first insulating film has been deposited on the substrate, the first deposited insulating film is flattened so as to embed the insulating film into both the first and second trenches; and a step in which after the peripheral circuit region has been covered by a resist pattern, the first insulating film embedded into the first trench is etched in order that an upper surface of the first insulating film embedded into the first trench is caused to fall from an upper surface of the first insulating film embedded into the second trench, a first element isolating portion is formed in the memory array, and a second element isolating portion is formed in the peripheral circuit region.

As previously explained, since the recess amount of the element isolating portion of such a memory cell that the width of the activated region is relatively narrow is relatively increased, the stress occurring in the substrate, which is caused by the element isolating portion, can be reduced. As a consequence, while the formation of a crystalline defect in the substrate can be suppressed, the margin of the junction leak of the memory cell can be improved.

Other objects, features and advantages of the invention will become apparent from the following description of the embodiments of the invention taken in conjunction with the accompanying drawings.

BRIEF DESCRIPTION OF THE SEVERAL VIEWS OF THE DRAWINGS

FIG. 42 is a sectional view for representing a major portion of the same portion as that of FIG. 24 during manufacturing step of the flash memory subsequent to FIG. 40 and FIG. 41.

DETAILED DESCRIPTION OF THE INVENTION

Next, various embodiments of the present invention will now be explained. It should be noted that the present invention is not limited only to the below-mentioned embodiment modes, but may be modifications thereof and may include other embodiments modes and obvious modifications thereof which may achieve similar effects to those of the below-explained embodiment modes.

Figure 9:
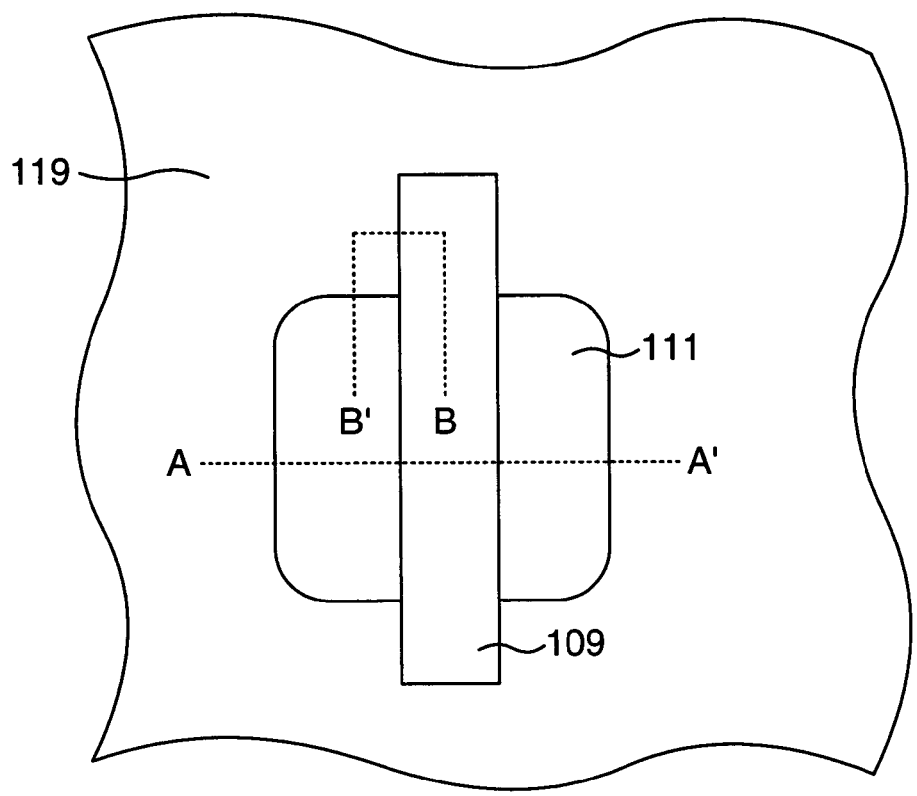
FIG. 9 is a schematic diagram for grasping the semiconductor device according to the embodiment of the present invention, namely, a diagram for showing an example of another embodiment mode.
Figure 10:
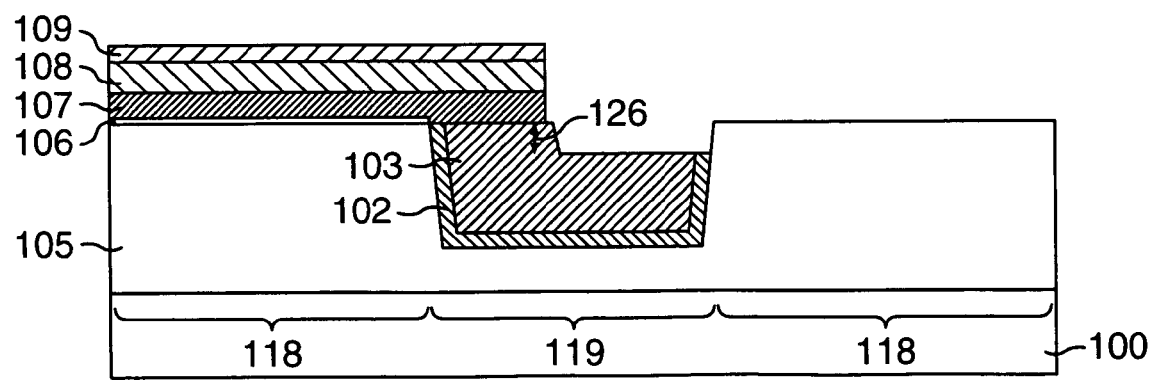
FIG. 10 is a schematic diagram for understanding the semiconductor device according to the embodiment of the present invention, namely, a diagram for representing an example of another embodiment mode.

Referring now to FIG. 1A to FIG. 1H, FIG. 9 and FIG. 10, manufacturing steps of a semiconductor device according to an embodiment of the present invention will be described. FIG. 9 is a plan layout diagram, FIG. 1A to FIG. 1H are sectional diagrams of the semiconductor device, taken along a line A to A' of FIG. 9. FIG. 10 is a sectional view for indicating the semiconductor device after a fall-in of an embedding oxide film has been formed, taken along a line B to B' of FIG. 9.

(1). A shallow trench is formed in a silicon substrate 100, and a thermal oxide film 102 having a thickness from 5 to 30 nm is formed by thermally oxidizing an inside of this shallow trench at a temperature of approximately 1000° C. Thereafter, an embedding insulating film is embedded inside the trench. For example, an embedding oxide film 103 such as a silicon oxide is embedded, which has been formed by way of either a CVD (Chemical Vapor Deposition) method or a sputtering method. For instance, the method of forming this shallow trench may be realized by employing the below-mentioned method. That is, after both a pad oxide film and a silicon nitride film have been deposited on the silicon substrate 100 and then are patterned, a trench having a depth from 200 to 400 nm is formed in the silicon substrate 100 by employing the dry etching method while this silicon nitride film is employed as a mask.

Thereafter, the embedding oxide film may be preferably made accurate. For instance, the resulting silicon substrate is annealed for 1 hour to 2 hours at a temperature of 1000° C. to 1150° C. within either a diluted oxidation atmosphere or a nitrogen gas atmosphere or Ar gas atmosphere. In addition, after an extra embedding oxide film 103 formed on the silicon substrate has been flattened by employing a CMP method, or the like and then is removed, an element isolating region (STI region) 119 is formed (see FIG. 1A). Regions other than this element isolating region may constitute an active region 118.

(2). The surface of the silicon substrate 100 is thermally treated, or processed at a temperature of 800–1000° C. within an oxygen atmosphere so as to form a sacrifice oxide film 125 having a thickness of approximately 10 nm. While this sacrifice oxide film 125 is employed as a buffer layer, such an impurity as boron, phosphorus, or the like is implanted into this surface of the silicon substrate 100 in concentration of approximately 1E13 (atom/cm$^2$) so as to form a well layer 105. Thereafter, the above-described sacrifice oxide film 125 is removed by diluted HF, and then, a gate oxide film 106, a polycrystal silicon film 107, a tungsten film 108, and also, a silicon nitride film 109 are sequentially deposited/patterned on the substrate so as to form a gate electrode (see FIG. 1B). In this case, it should be noted that the gate oxide film 106 may not be completely removed.

(3). Thereafter, a resist 104 is deposited, and the resist is left on the gate electrode by employing such a mask on which the gate electrode has been patterned. In this case, a dimension of the patterned resist is made slightly larger than a dimension of the mask in order that the entire gate electrode is covered by the resist.

Since the above-described mask is employed in order that the gate oxide film 106 located under the gate edge portion is not removed, a mask to be used may be realized by such a mask which was used when the shallow trench explained in the manufacturing step (1) was formed. Alternatively, if this purpose may be achieved, then, other methods may be employed (FIG. 1C). Also, if such a semiconductor product may be obtained in which the electric characteristic thereof is not changed even when the gate oxide film 106 formed under the gate edge portion is removed, then the dimension of the patterned resist need not be made larger than the mask dimension. This dimension of the patterned resist may be made equal to such a resist dimension corresponding to the mask dimension.

(4). The embedding oxide film 103 is removed from the surface of the silicon substrate 100 by employing a dry etching method (see FIG. 1D). Since the gate electrode is employed as the mask, an embedding oxide film formed under the gate electrode is not removed whereas a predetermined thickness of such an embedding oxide film formed in a region other than the above-explained region is removed, so that a stepped portion 126 equal to the fall-in portion is formed in the vicinity of the gate electrode edge portion (see FIG. 10). As apparent from a combined drawing between FIG. 1D and FIG. 10, on a surface of a region (namely, element isolating region) around a portion where the gate electrode to the element isolating region is extended, a stepped portion is made by being added to the embedding oxide film under the gate electrode (see FIG. 10), and a stepped portion is also made with respect to the substrate (see FIG. 1D). This surface implies a boundary surface between the embedding insulating film for forming the element isolating region and a layer which is deposited on this embedding insulating film.

(5). Thereafter, the resulting substrate is thermally treated at a temperature of 800–1000° C. in an oxygen atmosphere so as to form a thermal oxide film 110 having a thickness from 3 to 10 nm on the surface of the silicon substrate, and while this thermal oxide film is employed as a buffer layer, either boron (in case of PMOS) or arsenic (in case of NMOS) is implanted into the silicon substrate 100 in concentration of approximately 1E13 (atom/cm$^2$) in order to form a low concentration (low density) layer 111 (see FIG. 1E). In this embodiment, the polycrystal silicon 115 which will constitute an electrode plug is directly deposited on the contact region 120 to be contacted thereto in order to extract the electrode from the silicon substrate 100 in a manufacturing step (8). In such a case that the contact resistance at this time is required to be made lower, a silicide film may be preferably formed after a silicon nitride film 112 of a manufacturing step of FIG. 1F has been patterned. The above-described silicide film corresponds to, for example, $CoSi_2$, $TiSi_2$, $NiSi_2$, and so on.

It should be understood that this embodiment has been described with respect to a manufacturing mode in which the thermal oxide film 110 has been formed, and then, the impurity (added element) such as one of boron and arsenic has been conducted into the silicon substrate. Alternatively, in view of higher efficiencies of manufacturing steps, before the thermal oxide film 110 is formed, the surface is exposed and the impurity is conducted into the silicon substrate.

(6). Thereafter, after a silicon nitride film 112 which will constitute an insulating film has been deposited, the deposited silicon nitride film 112 is patterned, and either boron (in case of PMOS) or arsenic (in case of NMOS) is implanted into the exposed silicon substrate 100 in concentration of approximately 5E14 to 3E15 (atom/cm$^2$). Thereafter, the resulting silicon substrate is lamp-annealed for a short time at a temperature of, for example, 1000° C. so as to form a high concentration (high density) layer 114.

Figure 1A:
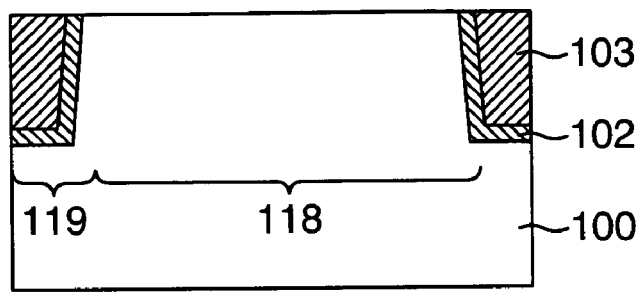
FIG. 1A to FIG. 1H are schematic diagrams illustrating manufacturing steps of a gate structure of a semiconductor device according to an embodiment of the present invention.
Figure 1B:
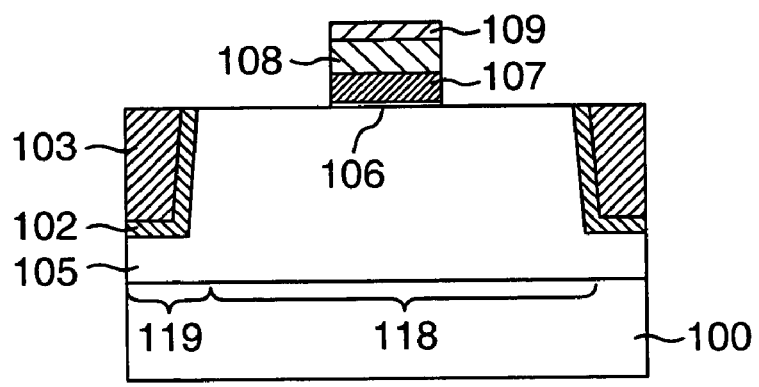
Figure 1C:
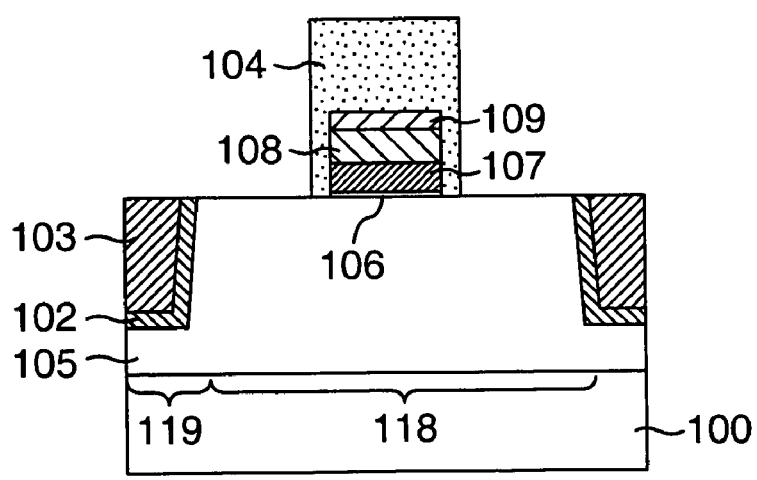
Figure 1D:
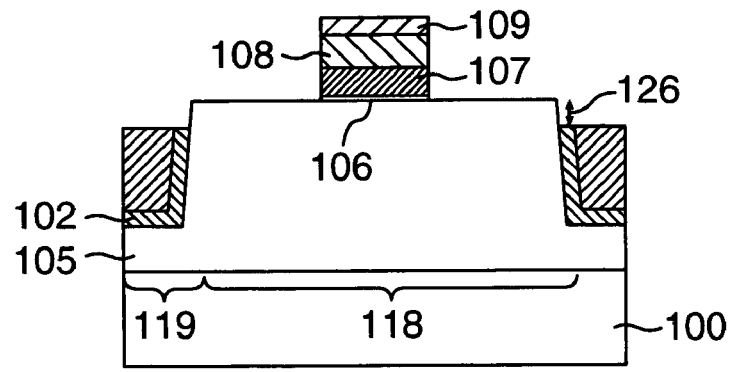
Figure 1E:
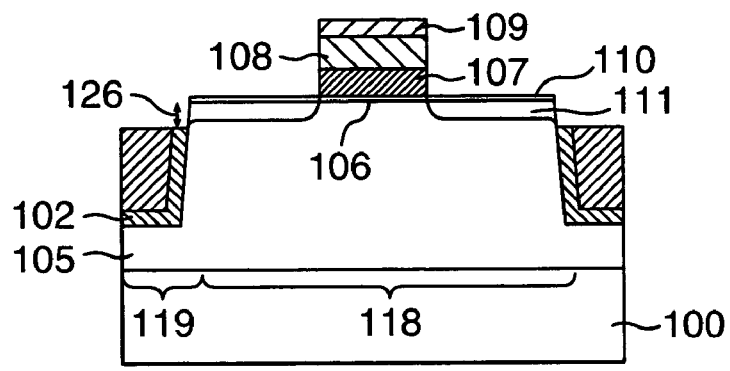
Figure 1F:
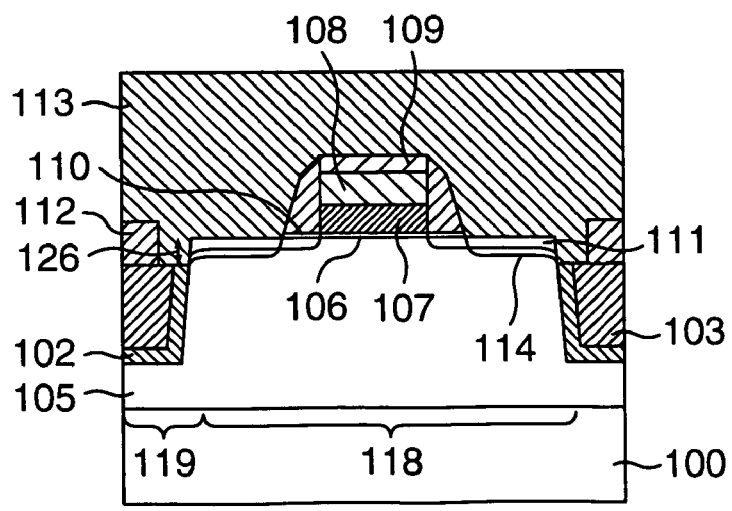
Figure 1G:
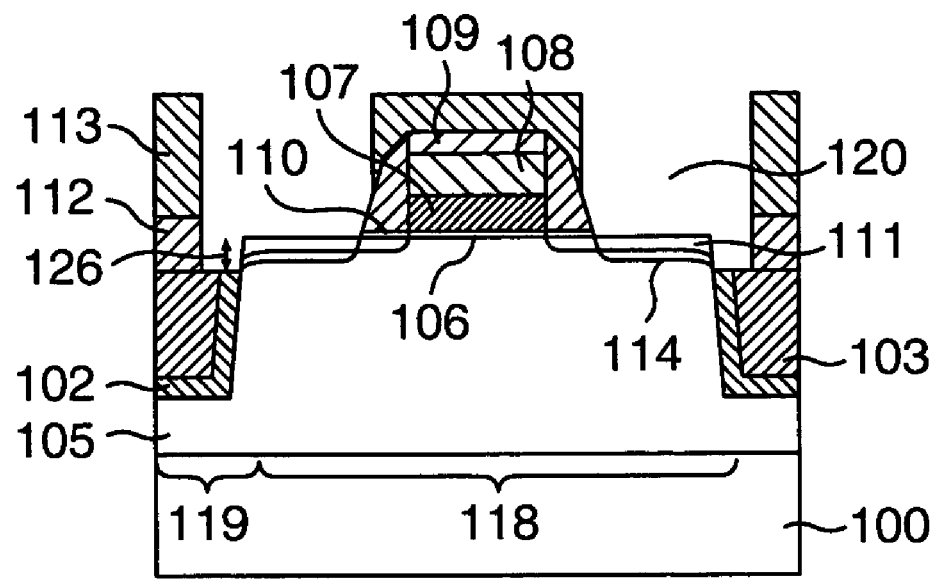
Figure 1H:
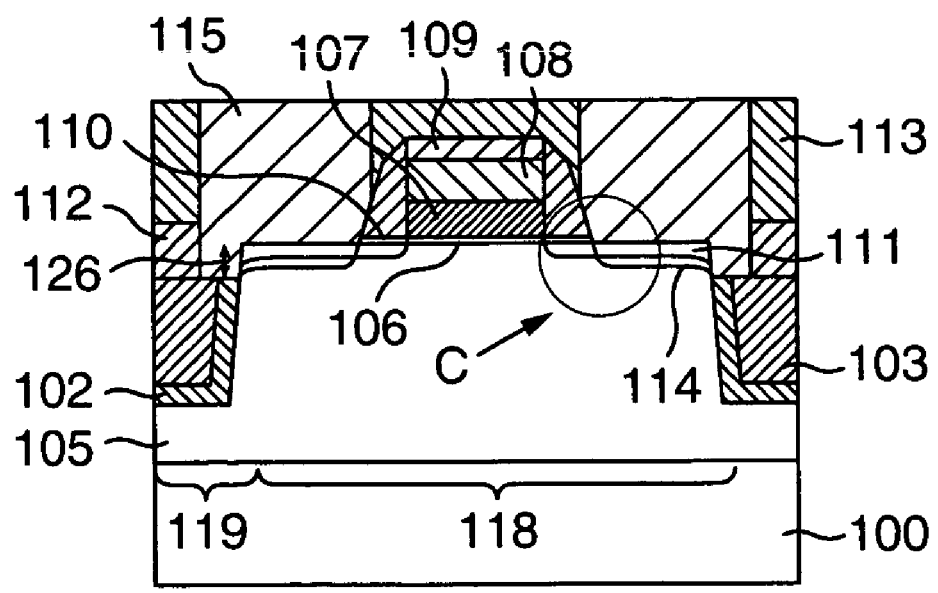

To form a so-called "an interlayer insulating film" by way of the chemical vapor deposition method, an oxide film 113 is deposited over the entire substrate, and then, the oxide film 113 is flattened by way of a CMP method, or the like (see FIG. 1F). In this case, an insulating film is referred to as such a film which is deposited on the embedding oxide film 103 after the gate electrode has been formed. Also, this insulating film implies such a film whose conductivity is lower than that of the above-explained semiconductor substrate.

(7). The oxide film 113 is partially removed by way of the anisotropic dry etching method so as to form a contact region 120 (see FIG. 1G).

(8). In order to extract an electrode from the silicon substrate 100, polycrystal silicon 115 which will constitute an electrode plug is deposited on the contact region 120, so that a transistor may be accomplished (see FIG. 1H). Also, a wiring layer which is coupled to the above-described electrode plug is formed on a layer located over the oxide film 113 corresponding to the above-explained interlayer insulating film, if necessary. It should also be noted that since this electrode plug may have a lower electric resistance value, any metals other than the polycrystal silicon, for example, tungsten may be employed.

Figure 2:
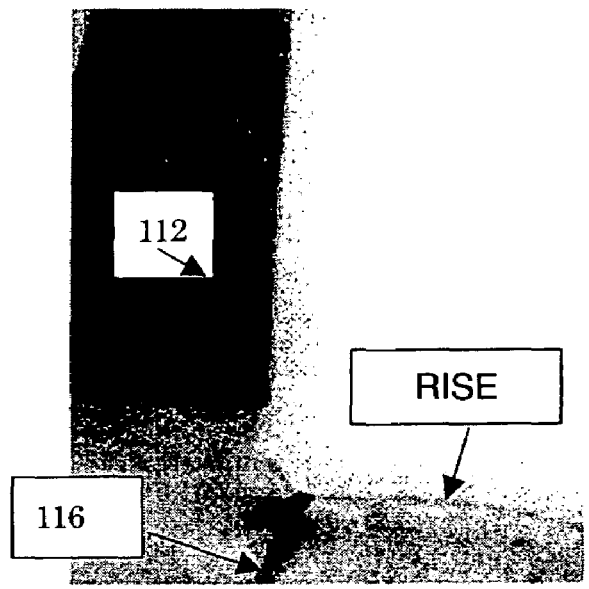
FIG. 2 is a schematic diagram for explaining the semiconductor device according to the embodiment of the present invention.
Figure 3:
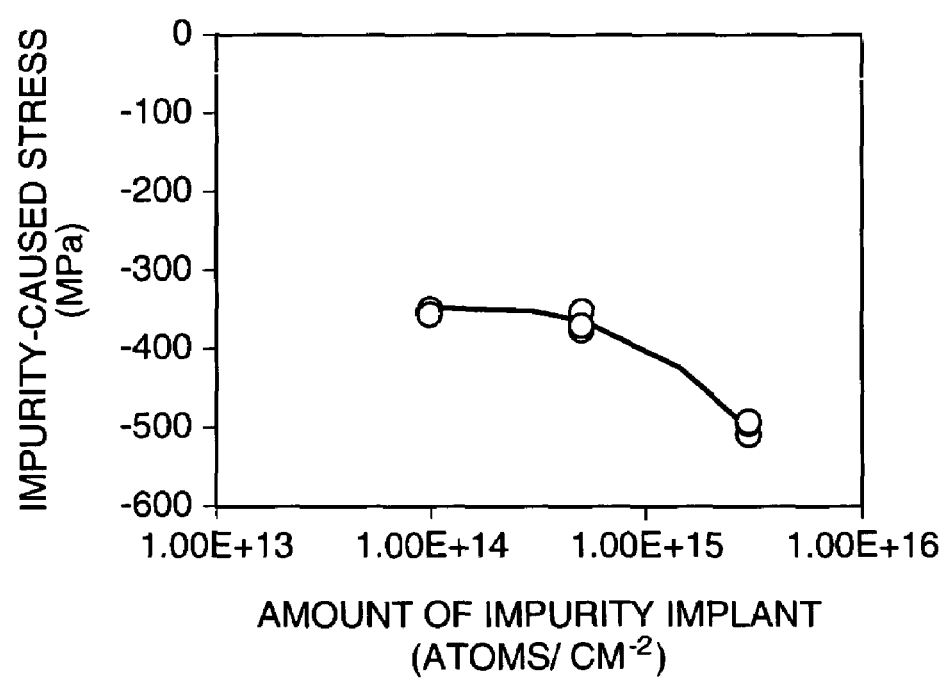
FIG. 3 is a schematic diagram for explaining the semiconductor device according to the embodiment of the present invention, namely, a diagram for representing a rise of a silicon substrate after an impurity has been implanted into this substrate.

Next, operations/effects of the present invention will now be described. FIG. 2 indicates a TEM (Transmission Electron Microscope) image of the region ("c" of FIG. 1H) in the vicinity of the gate edge portion in the case that the transistor is manufactured by omitting the above-described manufacturing steps (3) and (4), which may constitute this embodiment. As can be understood from FIG. 2, a crystalline defect occurs from the region in the vicinity of the edge portion of the silicon nitride, and, furthermore, the surface of the silicon substrate rises into which the impurity has been implanted. Considering this rise, it is so conceivable that a high stress may be produced in the region into which the impurity has been implanted. This stress (impurity-caused stress) has been evaluated by measuring a camber amount of the silicon substrate. As a result, as graphically represented in FIG. 3, after the impurity has been embedded, such a compression stress having a magnitude of approximately $-350$ MPa may occur up to the implantation amount of 5E14 pieces·cm$^{-2}$, and a compression stress having a magnitude of approximately $-500$ MPa may occur up to the implantation amount of 3E15 pieces·cm$^{-2}$, namely, it can been understood that the stress is increased in connection with the increase of the concentration. This fact may be conceived. That is, when the impurity is implanted into the silicon substrate, implanted atoms are present at positions among lattices of silicon atoms, so that high stresses may occur in the implanted region. Also, this rise may be conceived as follows. That is, after the thermal treatment subsequent to the implantation of the impurity, the impurity atoms are substituted by the silicon atoms, and furthermore, excessive atoms corresponding to be implanted impurity may rise.

There are large numbers of such crystalline defects in such a case that an element isolating region (STI region) is located in the vicinity of a region into which an impurity has been implanted. This STI structure corresponds to such a structure that a trench is formed in a silicon substrate, and, then, an embedding oxide film is embedded in this trench. Since an active width of this STI structure can be secured which is just fitted to a mask dimension as compared with the conventional LOCOS structure, it is preferable to use this STI structure after 0.25 µm process. However, this STI structure may cause such a risk that higher compression stresses may be produced in the silicon substrate, and thus, crystalline defects may occur. A stress generation mechanism by such an STI structure will now be explained as follows (see FIG. 4).

Figure 4:
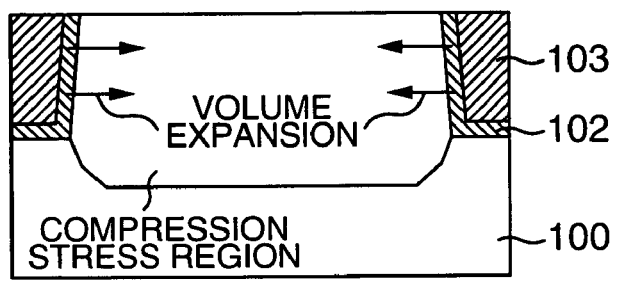
FIG. 4 is a diagram for illustratively showing a mechanism as to an occurrence of an element isolating stress, namely, a schematic diagram for explaining the semiconductor device according to the embodiment of the present invention.

FIG. 4 schematically shows a condition of a silicon substrate portion of an active region which is located adjacent to an STI region having both the embedding oxide film 103 and the thermal oxide film 102. Since a large number of the silicon substrate oxidization steps are present in the transistor forming steps, oxygen which may constitute an oxidation seed is diffused via the embedding oxide film 103 inside the trench, so that an oxide film may be grown on the side wall of the trench. When Si (silicon) is changed into SiO$_2$ (silicon oxide), a volume expansion of SiO$_2$ becomes approximately two times larger than a volume expansion of Si. Since this volume expansion receives a restriction made by the embedding oxide film 103, higher compression stresses (STI stresses) are produced in the silicon substrate.

It is so conceivable that a crystalline defect may be caused by such a fact that an impurity-caused stress receives a large restriction due to this STI stress. In other words, in order to prevent an occurrence of such a crystalline defect, the following discussion shows how to release this impurity-caused stress at a first stage, and then, how to reduce the STI stress which restricts the impurity-caused stress at a second stage.

Figure 5:
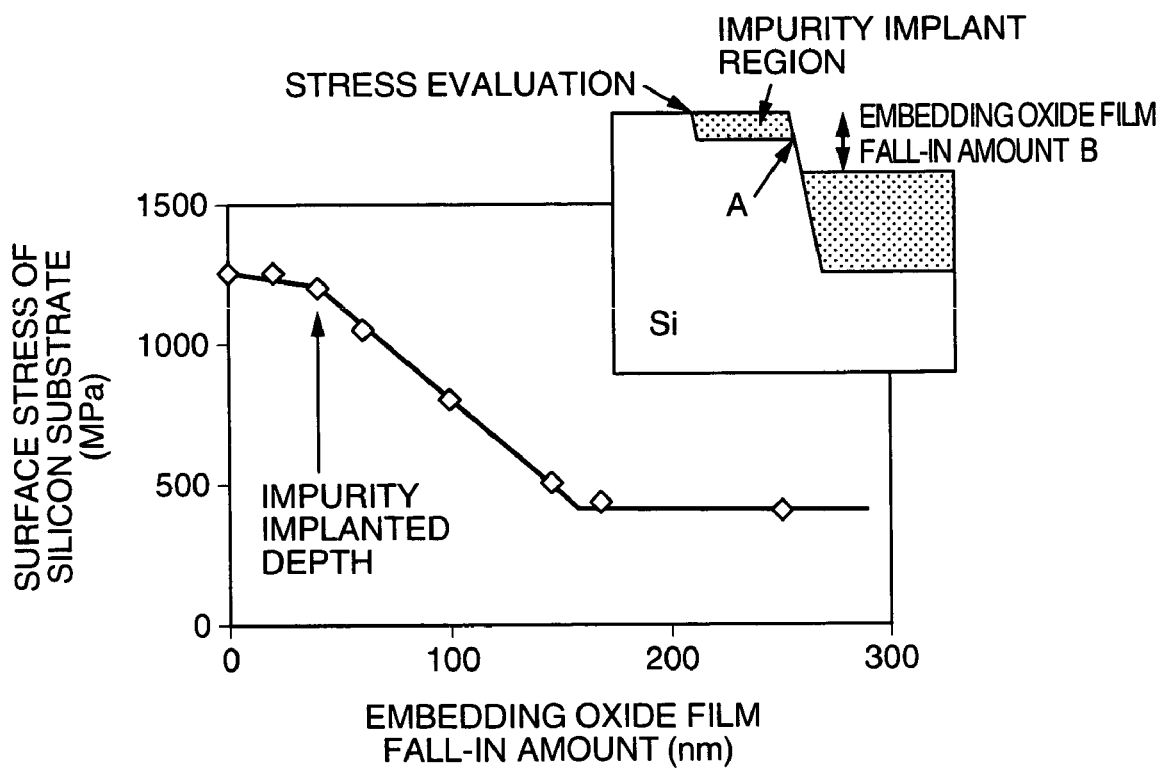
FIG. 5 is a schematic diagram for understanding the semiconductor device according to the embodiment of the present invention, namely, a diagram for representing a fall-in amount depending characteristic of an embedding oxide film of a stress occurring in a surface of a silicon substrate.
Figure 6:
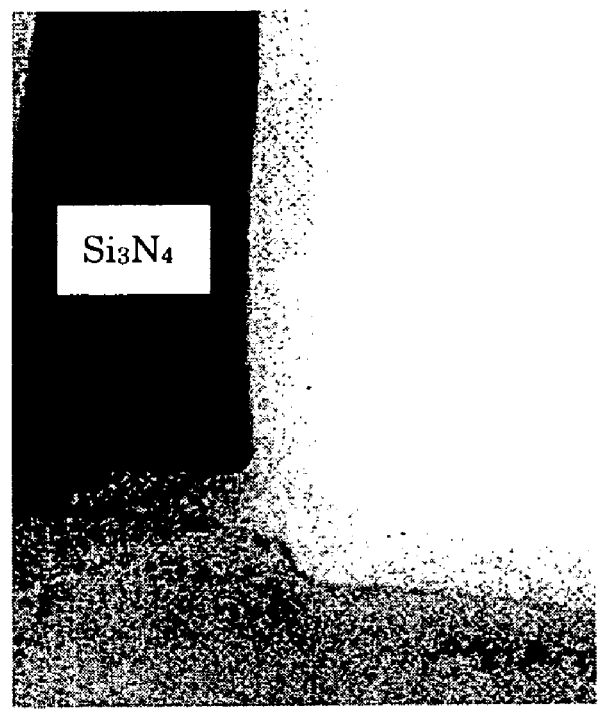
FIG. 6 is a schematic diagram for explaining the semiconductor device according to the embodiment of the present invention, namely, a diagram for indicating a result of the semiconductor device manufactured by an experimental manner based upon the embodiment.

The following solution was conceived. Since the embedding oxide film of the STI region is caused to fall from the silicon substrate, the side wall (namely, A portion of FIG. 5) of the trench becomes a free surface, so that the impurity-caused stress can be released and the STI stress can be reduced. FIG. 5 graphically represents an analysis as to an embedding oxide film fall-in amount (i.e. depth or recess amount) dependent characteristic of a stress which is produced on the silicon substrate surface in the case that after the STI structure has been formed, the impurity is implanted thereinto. This analysis is carried out under such a condition that the active width is 0.5 µm; the trench width of the STI structure is 0.3 µm; the depth of the trench is 0.35 µm; and the implanting depth of the impurity is 40 nm. An abscissa of FIG. 5 indicates a fall-in amount (symbol "B" of FIG. 5) of the embedding oxide film, and an ordinate of FIG. 5 indicates a stress which is produced on the surface of the silicon substrate. The stress which is produced on the silicon substrate surface is not so reduced in such a case that the fall-in amount (i.e., depth or recess amount) of the embedding oxide film is present within an impurity implanting region (namely, shorter than 40 nm of impurity implanting depth). However, when this fall-in amount of the embedding oxide film exceeds the impurity implanting region, this stress is rapidly reduced, and then this stress may become a substantially constant stress value when the fall-in amount of the embedding oxide film becomes an approximately half value of the trench depth, or shorter. The following fact can be revealed. That is, since the embedding oxide film of the STI region is caused to fall from the silicon substrate surface, the stress produced on the substrate surface can be reduced. FIG. 6 indicates such an experimental model that a transistor has been manufactured based upon this result. FIG. 6 shows a place which corresponds to the place of FIG. 2. FIG. 6 indicates such a result that while the transistor has been manufactured as the experimental model in accordance with the embodiment, the embedding oxide film was caused to fall by 50 nm from the substrate surface. It could become apparent that the crystalline defect occurring in FIG. 2 does not occur, and, therefore, this method of the present invention may become effective.

As previously explained, since the embedding oxide film of the STI region is caused to fall from the silicon substrate surface, the impurity-caused stress can be released, and/or, the STI stress which restricts the impurity-caused stress can be, furthermore, reduced. This can contribute to the prevention of this crystalline defect.

In this embodiment, in the manufacturing step (8), the polycrystal silicon 115 which will constitute the electrode plug is directly deposited on the contact region 120 so as to be contacted thereto in order to extract the electrode from the silicon substrate 100. In this case, when the contact resistance must be made low, after the silicon nitride film 112 of the step shown in FIG. 1F has been patterned, the silicide film may be preferably formed. This silicide film corresponds to, for example, COSi$_2$, TiSi$_2$, NiSi$_2$, and the like.

Also, as indicated in FIG. 5, it is preferable to make the fall-in amount of the embedding oxide film deeper than an implanting depth of an impurity in view of the stress reducing effect. In this specification, the expression "impurity implanting depth" implies such a value of "$R_p+\sigma$" which is defined by adding standard deviation "$\sigma$" of an impurity concentration fluctuation to a distance "$R_p$." This distance "$R_p$" is defined from the surface of the silicon substrate up to an impurity peak concentration position of the impurity profile located in this silicon substrate. This impurity implanting depth corresponds to such a portion that a concentration depth becomes uniform at the position "C" of the manufacturing step of FIG. 1H. Since the peak concentration depths are largely changed in both the gate electrode edge portion and the element isolating portion edge portion, an impurity implanting depth may be measured in such a region having a shallow peak concentration depth, which is sandwiched by these edge portions.

For example, an impurity implanting depth may be measured in an intermediate portion (for example, ½ place) of the distance between a side wall edge portion (otherwise, gate electrode edge portion in case that side wall is not provided) of a substrate and an element isolating trench edge portion.

It should be noted that this impurity implanting depth may be measured by way of, for example, energy-dispensive X-ray (EDX).

Concretely speaking, it is preferable to provide such a fall-in amount of the embedding oxide film, which is equal to a depth of peak concentration of an impurity, or more preferably equal to a depth which is 1.5 times longer than the above-described peak concentration depth, or, further preferably, a depth which is 2.0 times longer than, or more the peak concentration depth.

Otherwise, in view of the stress reducing effect, the embedding oxide film may be caused to fall by a distance longer than, or equal to 50 nm based upon the stress reducing effect of FIG. 5. It is a proper solution that an upper limit fall-in amount is selected to be smaller than, or equal to approximately 200 nm corresponding to such a stable region that a variation of the effects may become small. Even when the upper limit fall-in amount is made larger than 200 nm, there is such a risk that a conspicuous increase of the effect cannot be expected. Also, it is a proper solution that the upper limit fall-in amount may be suppressed lower than, or equal to 200 nm in view of another aspect that since the film is deposited on this film in the subsequent manufacturing step, the stepped portion is reduced. Although the above-explained effect may be deteriorated, the transistor may have the fall-in amount of the embedding oxide film longer than, or equal to, for example, 40 nm by considering the relationship of the impurity implanting region, or for the sake of manufacturing convenience.

As previously explained, while considering such a case that the peak of the low-concentration impurities is different from the peak of the high-concentration impurities, which are conducted into the substrate, the impurity peak concentration may be judged based upon the concentration peak in the high-concentration impurities.

Also, as a region deeper than a concentration peak of an impurity is located from a surface of a semiconductor substrate, the concentration of the conducted impurity is lowered. A recess amount of an element isolating film from the surface of the semiconductor substrate should be kept lower than such a depth of a junction plane where impurity concentration which constitutes a well is equal to implanted impurity concentration, which is a preferable technical aspect in view of an electric characteristic of a semiconductor device which will be thereafter formed. In view of a suppression of lowering the electric characteristic of a semiconductor device which will be thereafter formed. In view of a suppression of lowering the electric characteristic under stable condition by securing a sufficiently large margin irrespective of alignment error and the like, the recess amount may be preferably kept lower than, or equal to 80% of the depth of the above-described junction plane.

In this embodiment, while the resist is employed as the mask, the embedding oxide film within the element isolating region has been removed by way of the dry etching method. Apparently, other removing methods may also be employed.

As a manufacturing process of this alternative case, although such a manufacturing process similar to the above-described manufacturing process shown in FIG. 1A to FIG. 1H may be basically employed, there is such a feature that the below-mentioned manufacturing steps instead of those shown in FIG. 1C to FIG. 1E are carried out.

That is, the below-mentioned manufacturing steps (1) and (2) are executed before the manufacturing step of FIG. 1F.

As a result, a fall-in portion may be relatively easily formed in the embedding oxide film 103.

(1). An impurity such as either boron (in case of PMOS) or arsenic (in case of NMOS) is implanted into the silicon substrate 100 in concentration of approximately 1E13 (atom/$cm^2$) so as to form a low concentration layer 111. Thereafter, after a silicon nitride film 112 which will constitute an insulating film has been deposited, the deposited silicon nitride film 112 is patterned (see FIG. 16A).

(2). While the silicon nitride film 112 is employed as a mask, the embedding oxide film 103 is caused to fall from the surface of the silicon substrate 100 by employing the dry etching method. Then, an impurity such as either boron (in case of PMOS) or arsenic (in case of NMOS) is implanted into the exposed silicon substrate 100 in concentration of approximately 5E14 to 3E15 (atom/$cm^2$) so as to form a high concentration layer 114 (see FIG. 16B).

Subsequently, the resulting silicon substrate 100 is maintained at the temperature of approximately 1000° C. for a short time duration by way of the lamp anneal. Since the crystal structure which has been disturbed by implanting the impurity is recrystallized, a substrate surface of such a region where the above-explained high concentration layer 114 has been formed may be set to a better condition as a contact.

Figure 16A:
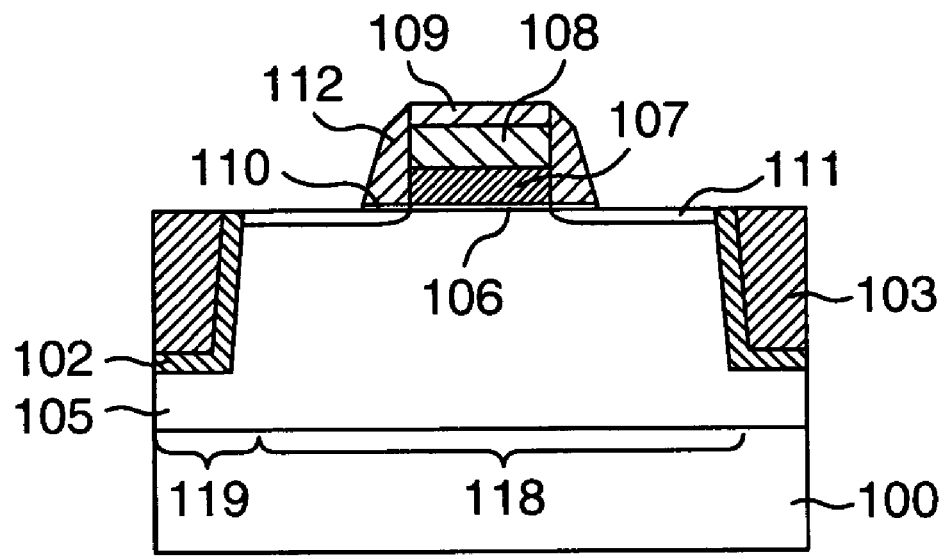
FIG. 16A and FIG. 16B are schematic diagrams for understanding the semiconductor device according to the embodiment of the present invention, namely, diagrams for representing an example of another embodiment mode.
Figure 16B:
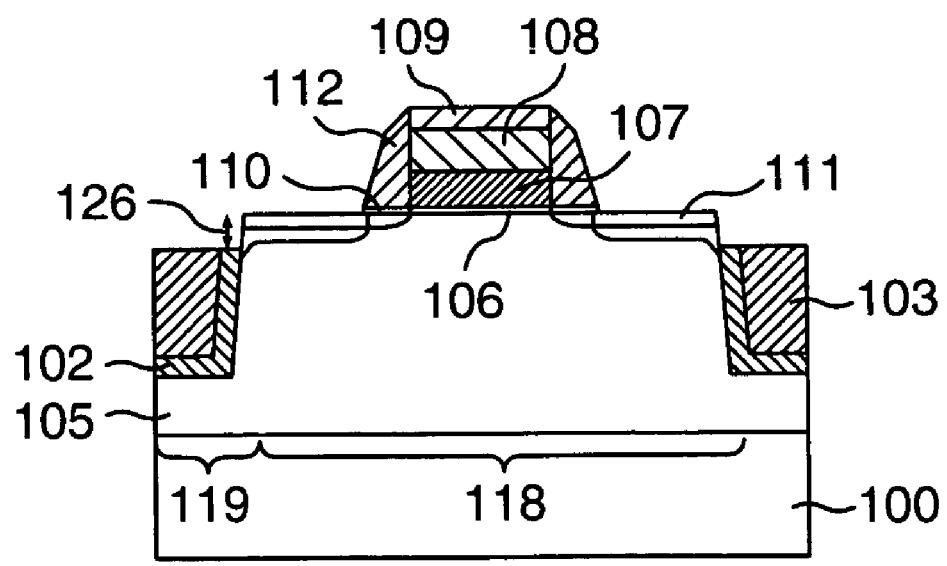

As a result, since the positioning operation by using the self-alignment technique can be carried out as compared with such a case that the positioning operation by using the resist is performed, a fluctuation of a device characteristic can be reduced. Also, this positioning operation may be applied to form very fine patterns. While the resist forming step of FIG. 1C is omitted, as indicated in FIG. 16A and FIG. 16B, the etching treatment is carried out for a longer time than that of the case corresponding to FIG. 1, so that the recess of the element isolating region can be formed in a higher effective manner.

The above-explained description describes that when the gate electrode is patterned in FIG. 1B, the silicon oxide film formed on the silicon substrate provided at the peripheral area of the gate electrode is removed. Alternatively, other embodiment modes may be conducted.

For instance, in FIG. 1B, when the gate electrode is patterned, the gate electrode may be formed without removing the thermal oxide film formed on the silicon substrate located at the peripheral area of the gate electrode. Such an embodiment mode is disclosed in which in the step for forming/patterning the silicon nitride film 112 on this side wall portion, the silicon substrate between the gate electrode and the element isolating portion is exposed. Alternatively, the following embodiment mode may be carried out.

For instance, in the step for forming/patterning the insulating film of the side wall of the gate electrode side wall, an etching amount is made smaller than that of the above-explained embodiment mode in order that such an oxide film as a pad oxide film may be left on the surface of the silicon substrate 100 of the above-described region. As a result, the step for forming the thermal oxide film 110 shown in FIG. 1E may be omitted, or may be reduced.

It should also be noted that the embedding oxide film is caused to uniformly fall from the silicon substrate surface in FIG. 1D. Alternatively, when even such a portion of the embedding oxide film falls from the silicon substrate surface, there is a similar effect. Alternatively, a majority of STI regions may be caused to fall among such SGI regions sandwiched by forming the element isolating layers sandwiched in the element forming regions (concretely speaking, such an arrangement may be formed in such a manner that a majority of surface regions of element isolating layers in a sectional plane drawn to be sandwiched by element forming regions).

As another fall-in measuring place, upper edge portions of the embedding insulating film may be compared with each other.

Figure 7:
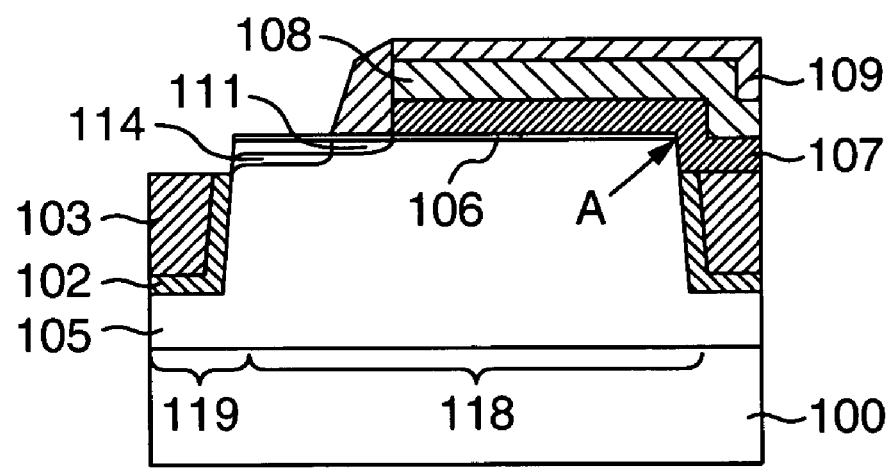
FIG. 7 is a schematic diagram for grasping the semiconductor device according to the embodiment of the present invention, namely, a diagram for showing an example of another embodiment mode.
Figure 8:
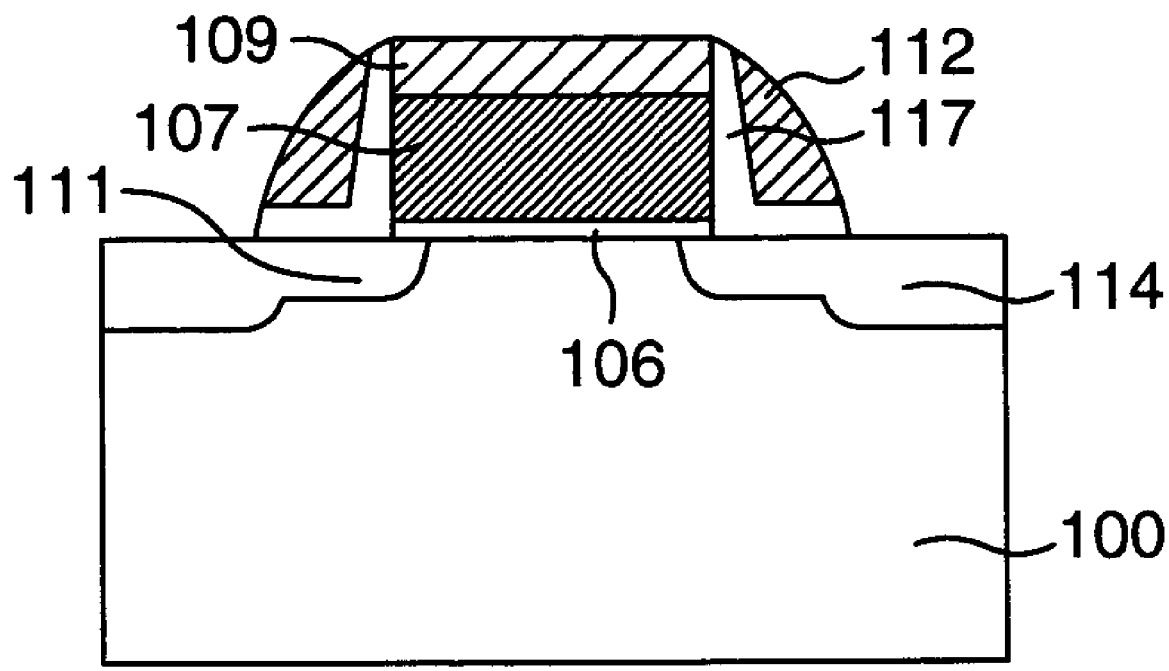
FIG. 8 is a schematic diagram for understanding the semiconductor device according to the embodiment of the present invention, namely, a diagram for representing an example of another embodiment mode.

As another embodiment mode, FIG. 7 indicates such a structure in a case in which the above-explained manufacturing steps are changed in such a manner that the fall-in portion of the embedding oxide film is formed before the gate electrode is formed. As represented in FIG. 7, there is a risk that the gate electrode film is formed in such a manner that this gate electrode film moves around an upper edge portion "A" of an STI trench. It is preferable to execute the formation of the fall-in portion of the embedding oxide film after the gate electrode has been formed in the above-described step (2) in view of suppressing electric changes, for example, electric fields are concentrated in the trench upper edge portion, and a threshold voltages of an MOS transistor is shifted.

As apparent from the foregoing description, in view of products having a small degree of these adverse influences and other aspects, the formation of the fall-in portion of the embedding oxide film may be carried out after the STI region has been formed (after manufacturing step (1)) before the transistor having the gate electrode is manufactured.

There are many possibilities that the crystalline defect occurs in such a case that the impurity is implanted into the silicon substrate, and thereafter, the crystal recovery annealing treatment is carried out. To this end, it is effective to execute the formation of the fall-in (i.e., recessed) portion of the embedding oxide film before this crystal recovery annealing treatment.

Also, when an STI structure is manufactured as indicated in FIG. 11A to FIG. 11D as the manufacturing method for the STI structure, this manufacturing method may especially become effective. This is because such a lowered region can be hardly formed in which a region adjacent to the trench of the embedding oxide film 103 is located lower than the surface of another embedding oxide film 103.

(1). After a pad oxide film 121 having a thickness of approximately 10 nm and a silicon nitride film 122 having a thickness of approximately 150 nm have been deposited on a silicon substrate 100 and these deposited films have been patterned, an oxide film 123 is deposited on this silicon nitride film B122. This oxide film 123 is left on side walls of edge portions of both the pad oxide film 121 and the silicon nitride film 122 by employing such a dry etching method capable of selectively etching away only a depth direction of this oxide film 121 (see FIG. 11A).

(2). While the oxide film 123 is employed as a mask, a trench having a depth of approximately 200 to 400 nm is formed in the silicon substrate 100 (see FIG. 11B).

(3). An internal portion of this trench is thermally oxidized at a temperature of about 1000° C. so as to form a thermal oxide film 102 having a thickness of 5 to 30 nm. Thereafter, an embedding insulating film is embedded inside the trench. For instance, such an embedding oxide film 103 as a silicon oxide, which has been formed by way of either the CVD method or the sputtering method, is embedded into the trench. Then, the resulting substrate is annealed for 1 hour to 2 hours at a temperature of 1000° C. to 1150° C. within either a diluted oxygen atmosphere or an N$_2$ atmosphere (see FIG. 11C).

(4). The embedding oxide film 103 is flattened by way of the CMP method, while the silicon nitride film 122 is employed as a stopper. Thereafter, the silicon nitride film 122 and the pad oxide film 121 are removed by employing phosphoric acid and hydrogen fluorine which are heated at a temperature of 150 to 200° C., respectively (see FIG. 11D).

Figure 11A:
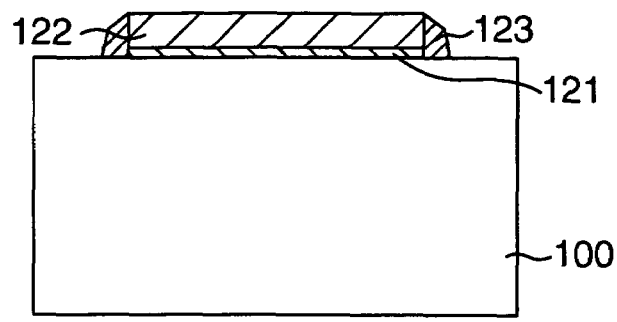
FIG. 11A to FIG. 11D are schematic diagrams for grasping the semiconductor device according to the embodiment of the present invention, namely, diagrams for showing an example of another embodiment mode.
Figure 11B:
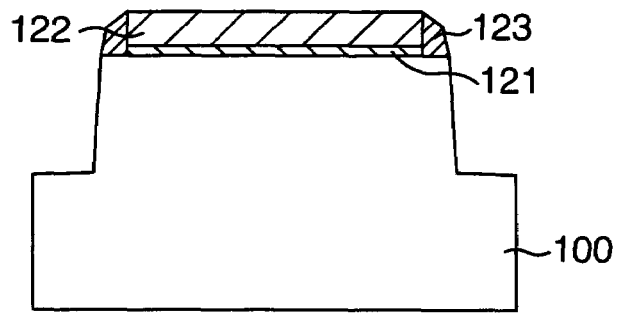
Figure 11C:
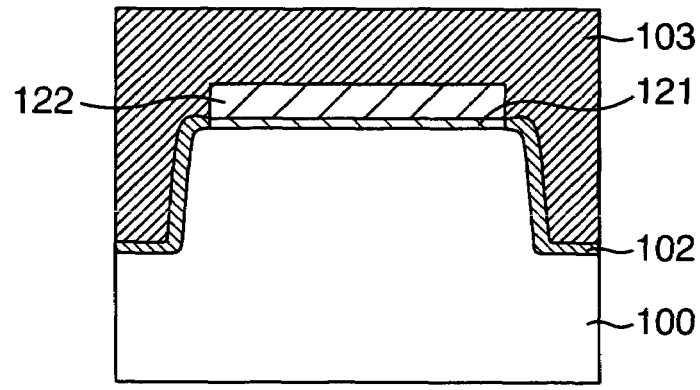
Figure 11D:
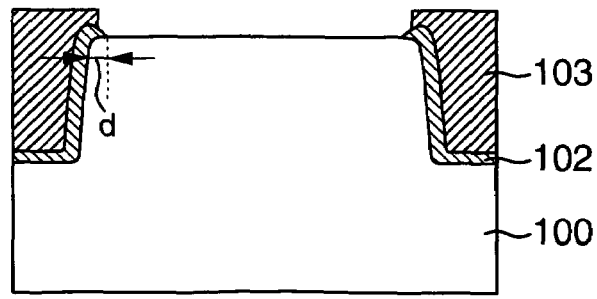
Figure 12A:
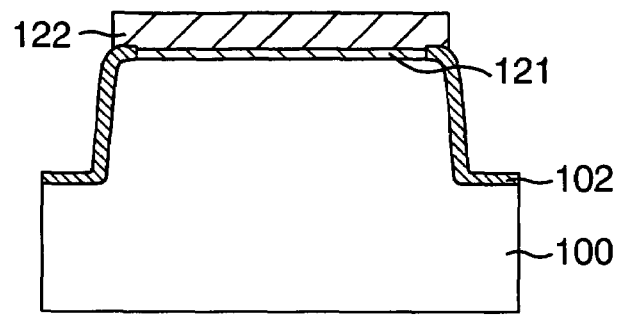
FIG. 12A to FIG. 12D are schematic diagrams for understanding the semiconductor device according to the embodiment of the present invention, namely, diagrams for representing an example of another embodiment mode.
Figure 12B:
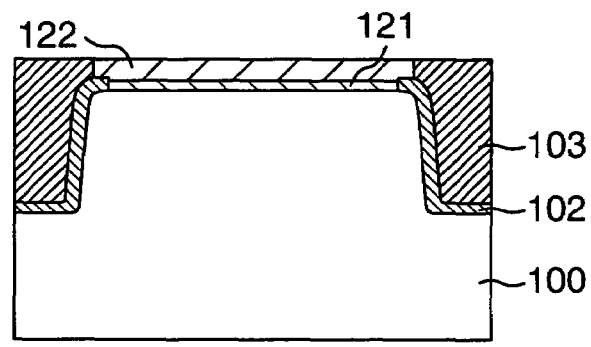
Figure 12C:
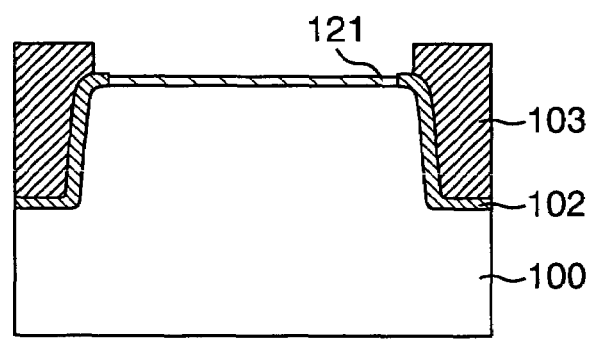
Figure 12D:
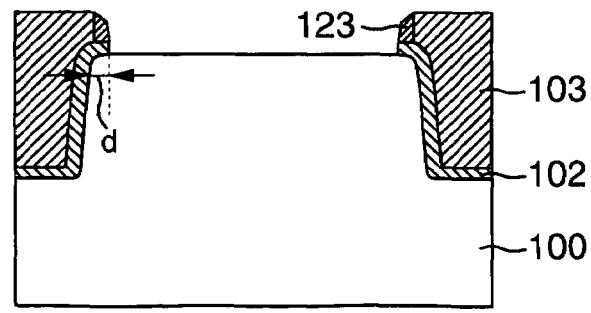
Figure 13A:
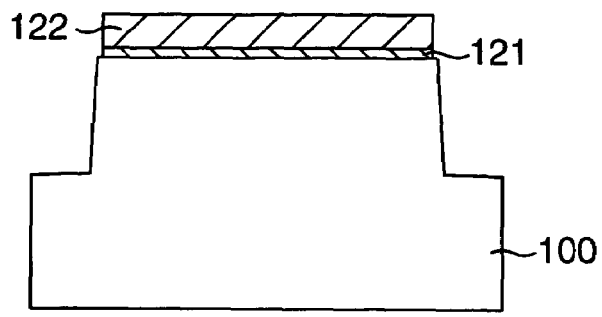
FIG. 13A to FIG. 13D are schematic diagrams for grasping the semiconductor device according to the embodiment of the present invention, namely, diagrams for showing an example of still another embodiment mode.
Figure 13B:
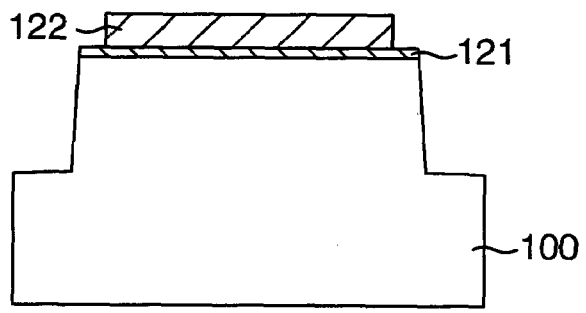
Figure 13C:
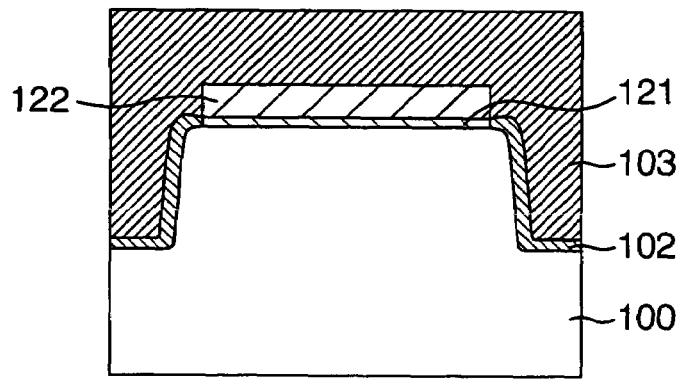
Figure 13D:
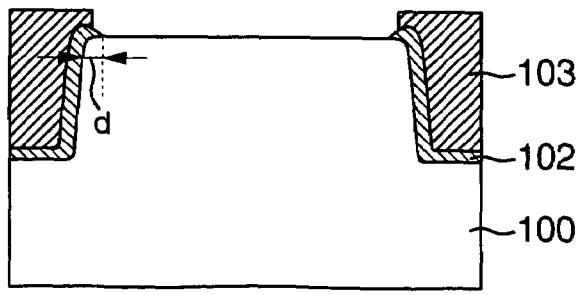

Since such a manufacturing method of the STI structure is employed, the embedding oxide film 103 may be deposited on the silicon substrate 100 by a distance "d" shown in FIG. 11D, and the above-explained lowered region of the embedding oxide film 103 can be hardly formed. In the case of such a manufacturing method, this method for forcibly forming the fall-in portion of the embedding oxide film may especially become effective.

Since the above-described manufacturing method is employed, a portion of the gate electrode is located in the element isolating region. Among the boundary planes of the embedding insulating film in the element isolating region, which are located opposite to the film deposited on this embedding insulating film, a first boundary plane in a first element isolating region where the gate electrode is positioned is formed at a position higher than a second boundary plane in a second element isolating region which is located around the first element isolating region. The transistor may be formed which owns such a relationship that the surface of the semiconductor device in the region where the gate electrode is arranged is located between the first boundary plane and the second boundary plane.

Furthermore, as indicated in FIG. 12A to FIG. 12D, when an STI structure is manufactured as the method of manufacturing the STI structure, the above-described lowered region of the embedding oxide film 103 can be hardly formed. As a result, the present invention may be especially effective even when this STI structure manufacturing method is employed.

(1). After a pad oxide film 121 having a thickness of approximately 10 nm and a silicon nitride film 122 having a thickness of approximately 150 nm have been deposited on a silicon substrate 100 and these deposited films have been patterned, while this silicon nitride film 122 is employed as a mask, a trench having a depth of approximately 200 to 400 nm is formed in the silicon substrate 100. Thereafter, an internal portion of this trench is thermally oxidized at a temperature of about 1000° C. so as to form a thermal oxide film 102 having a thickness of 5 to 30 nm (see FIG. 12A).

(2). An embedding insulating film is embedded inside the trench. For example, such an embedding oxide film 103 as a silicon oxide, which has been formed by way of either the CVD method or the sputtering method, is embedded into the trench. Then, the resulting substrate is annealed for 1 hour to 2 hours at a temperature of 1000° C. to 1150° C. within either a diluted oxygen atmosphere or an N$_2$ atmosphere so as to make the embedding oxide film 103 accurate. Thereafter, the embedding oxide film 103 is flattened by way of the CMP method, while the silicon nitride film 122 is employed as a stopper (see FIG. 12B).

(3). The silicon nitride film 122 is removed by employing phosphoric acid and hydrogen fluorine which are heated at a temperature of 150 to 200° C. (see FIG. 12C).

(4). An oxide film 123 is deposited on the silicon substrate 100, and then, this oxide film 123 is left only on a side wall of the embedding oxide film 103 by employing such a dry etching method capable of selectively etching away this oxide film 123 along only the depth direction thereof (see FIG. 12D). Thereafter, the resulting silicon substrate may be alternatively annealed at a temperature of approximately 1000° C. in order to make the oxide film 123 accurate.

Since such an STI structure manufacturing method is employed, the embedding oxide film 103 is deposited on the silicon substrate only by such a distance "d" shown in FIG.

12D, so that the above-described lowered region of the embedding oxide film 103 can be hardly formed. As a result, the present invention may be especially effective even when this STI structure manufacturing method is employed.

Furthermore, as indicated in FIG. 13A to FIG. 13D, when an STI structure is manufactured as the method of manufacturing the STI structure, the above-described lowered region of the embedding oxide film 103 can be hardly formed. As a result, the present invention may be especially effective even when this STI structure manufacturing method is employed.

(1). After a pad oxide film 121 having a thickness of approximately 10 nm and a silicon nitride film 122 having a thickness of approximately 200 to 250 nm have been deposited on a silicon substrate 100 and these deposited films have been patterned, while the silicon nitride film 122 is employed as a mask, a trench having a depth of approximately 200 to 400 nm is formed in the silicon substrate 100 (see FIG. 13A).

(2). Thereafter, a portion of the silicon nitride film 122 is removed by using phosphoric acid which has been heated at a temperature of approximately 150 to 200° C., and the silicon nitride film 122 is caused to retreat by a distance of 20 to 50 nm from the trench upper edge portion of the silicon substrate 100 (see FIG. 13B).

(3). An internal portion of this trench is thermally oxidized at a temperature of about 1000° C. so as to form a thermal oxide film 102 having a thickness of 5 to 30 nm. Furthermore, an embedding insulating film is embedded inside the trench. For instance, such an embedding oxide film 103 as a silicon oxide, which has been formed by way of either the CVD method or the sputtering method, is embedded into the trench. Then, the resulting substrate is annealed for 1 hour to 2 hours at a temperature of 1000° C. to 1150° C. within either a diluted oxygen atmosphere or an $N_2$ atmosphere so as to make the embedding oxide film 103 accurate (see FIG. 13C).

(4). The embedding oxide film 103 is flattened by way of the CMP method, while the silicon nitride film 122 is employed as a stopper. Thereafter, the silicon nitride film 122 and the pad oxide film 121 are removed by employing phosphoric acid and hydrogen fluorine which are heated at a temperature of 150 to 200° C., respectively (see FIG. 13B). Since such a manufacturing method of the STI structure is employed, the embedding oxide film 103 may be deposited on the silicon substrate 100 by a distance "d" shown in FIG. 13D, and the above-explained lowered region of the embedding oxide film 103 can be hardly formed. In the case of such a manufacturing method, this method for forcibly forming the fall-in portion of the embedding oxide film may especially become effective.

Figure 14A:
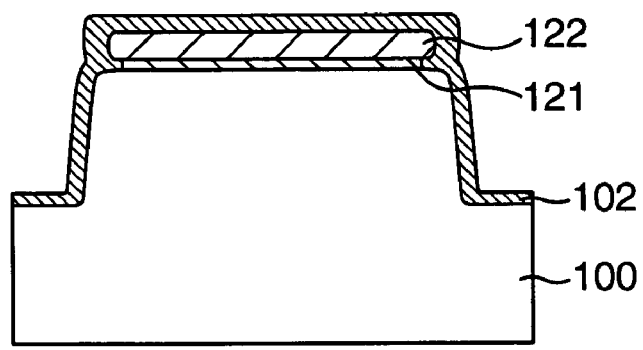
FIG. 14A to FIG. 14C are schematic diagrams for understanding the semiconductor device according to the embodiment of the present invention, namely, diagrams for representing an example of another embodiment mode.
Figure 14B:
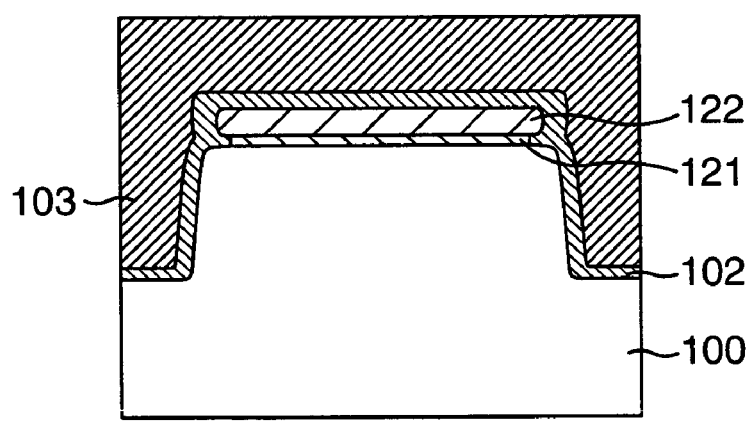
Figure 14C:
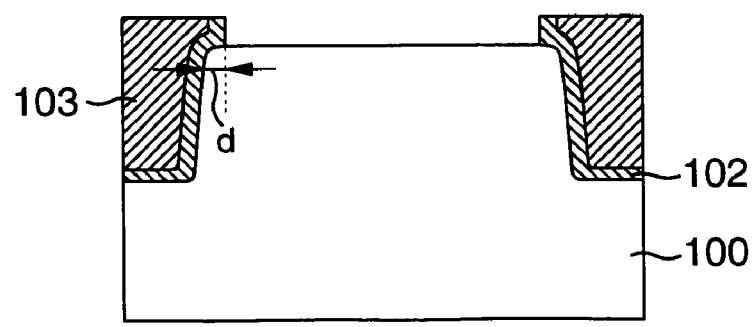

Furthermore, as indicated in FIG. 14A to FIG. 14C, when an STI structure is manufactured as the method of manufacturing the STI structure, the above-described lowered region of the embedding oxide film 103 can be hardly formed. As a result, the present invention may be especially effective even when this STI structure manufacturing method is employed.

(1). After a pad oxide film 121 having a thickness of approximately 10 nm and a silicon nitride film 122 having a thickness of approximately 150 nm have been deposited on a silicon substrate 100 and these deposited films have been patterned, while the silicon nitride film 122 is employed as a mask, a trench having a depth of approximately 200 to 400 nm is formed in the silicon substrate 100. Thereafter, an internal portion of this trench is thermally oxidized at a temperature of about 1000° C. so as to form a thermal oxide film 102 having a thickness of 5 to 30 nm by employing an ISSG (In-Situ Steam Generation) oxidizing furnace which is manufactured by AMAT corporation. In the ISSG oxidizing system, water vapor which may constitute an oxidizing agent is not formed outside this furnace, but both hydrogen and oxygen are conducted into the furnace in order to form water vapor. Thus, not only silicon but also a silicon nitride film may be oxidized. As a consequence, an oxide film may be formed on the surface of the silicon nitride film 122, so that this silicon nitride film 122 may be caused to retreat from the trench upper edge portion (see FIG. 14A).

(2). An embedding insulating film is embedded inside the trench. For instance, such an embedding oxide film 103 as a silicon oxide, which has been formed by way of either the CVD method or the sputtering method, is embedded into the trench. Then, the resulting substrate is annealed for 1 hour to 2 hours at a temperature of 1000° C. to 1150° C. within either a diluted oxygen atmosphere or an $N_2$ atmosphere so as to make the embedding oxide film 103 accurate. Thereafter, the embedding oxide film 103 is flattened by way of the CMP method, while the silicon nitride film 122 is employed as a stopper (FIG. 14B).

(3). The silicon nitride film 122 and the pad oxide film B121 are removed by employing phosphoric acid and hydrogen fluorine which are heated at a temperature of 150 to 200° C., respectively (see FIG. 14C).

Since such a manufacturing method of the STI structure is employed, the embedding oxide film 103 may be deposited on the silicon substrate 100 by a distance "d" shown in FIG. 14C, and the above-explained lowered region of the embedding oxide film 103 can be hardly formed. In the case of such a manufacturing method, this method for forcibly forming the fall-in portion of the embedding oxide film may especially become effective.

Figure 15A:
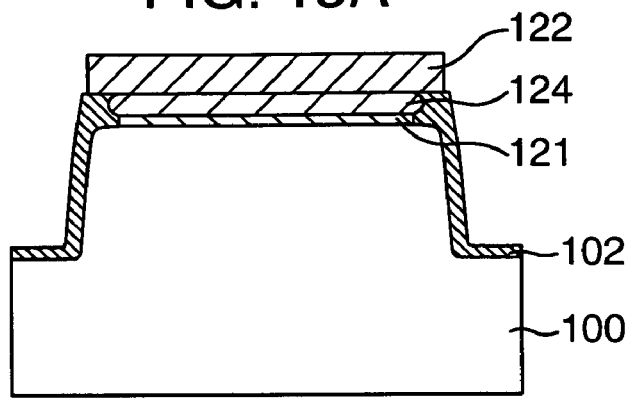
FIG. 15A to FIG. 15C are schematic diagrams for grasping the semiconductor device according to the embodiment of the present invention, namely, diagrams for showing an example of a further embodiment mode.
Figure 15B:
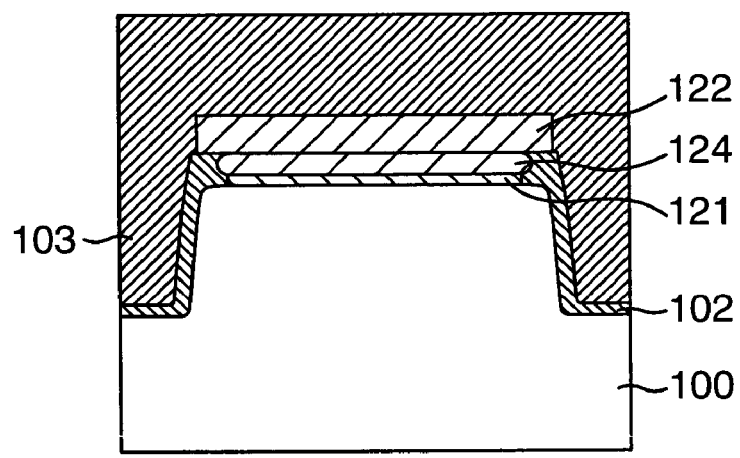
Figure 15C:
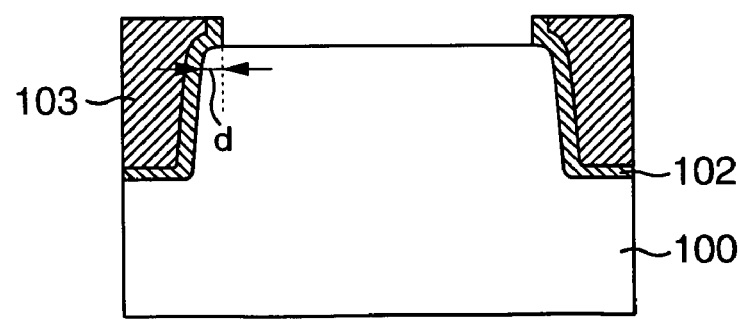

Furthermore, as indicated in FIG. 15A to FIG. 15C, when an STI structure is manufactured as the method of manufacturing the STI structure, the above-described lowered region of the embedding oxide film 103 can be hardly formed. As a result, the present invention may be especially effective even when this STI structure manufacturing method is employed.

(1). After a pad oxide film 121 having a thickness of approximately 10 nm, a polycrystal silicon film (otherwise, amorphous silicon film) 124 having a thickness of approximately 10 to 50 nm, and a silicon nitride film 122 having a thickness of approximately 150 nm have been sequentially deposited on a silicon substrate 100 and these deposited films have been patterned, while the silicon nitride film 122 is employed as a mask, a trench having a depth of approximately 200 to 400 nm is formed in the silicon substrate 100. Thereafter, an internal portion of this trench is thermally oxidized at a temperature of 1000° C. to 1150° C. so as to form a thermal oxide film 102 having a thickness of 5 to 30 nm. In this case, since the polycrystal silicon film 124 is oxidized, an oxide film having a thick thickness may be formed on a trench upper edge portion on the silicon substrate 100 (see FIG. 15A).

(2). An embedding insulating film is embedded inside the trench. For instance, such an embedding oxide film 103 as a silicon oxide, which has been formed by way of either the CVD method or the sputtering method, is embedded into the trench. Then, the resulting substrate is annealed for 1 hour to 2 hours at a temperature of 1000° C. to 1150° C. within either a diluted oxygen atmosphere or an $N_2$ atmosphere so as to make the embedding oxide film 103 accurate (see FIG. 15B).

(3). Thereafter, the embedding oxide film 103 is flattened by way of the CMP method, while the silicon nitride film 122 is employed as a stopper. Both the silicon nitride film 122 and the pad oxide film 121 are removed by employing phosphoric acid and hydrogen fluorine which are heated at a temperature of 150 to 200° C., respectively (see FIG. 15C).

Since such a manufacturing method of the STI structure is employed, the embedding oxide film 103 may be deposited on the silicon substrate 100 by a distance "d" shown in FIG. 15C, and the above-explained lowered region of the embedding oxide film 103 can be hardly formed. In the case of such a manufacturing method, this method for forcibly forming the fall-in portion of the embedding oxide film may especially become effective.

Furthermore, an HDP film which has been manufactured by employing high-density plasma of 1E10 to 1E12 atom/$cm^3$ as the method of manufacturing the embedding oxide film owns higher concentration than that of such a film which has been formed by way of either the CVD method or the sputtering method, and can be hardly removed by hydrogen fluorine. As a consequence, this HDP film can be hardly removed when the pad oxide film 121 and the sacrifice oxide film 125 are removed which are no longer required, and also, the above-explained lowered region can be hardly formed. Thereafter, in such a case that the HDP film is used, this method may especially become effective.

As the method of lowering the stress of the STI, there are two methods. In the first method, after the thermal oxide film 102 has been formed in the manufacturing step (1), the resulting substrate is thermally treated within NO gas, so that an oxynitride film is formed on both the bottom and side boundary surface planes at the interface between the silicon substrate and the thermal oxide film. Also, in the second method, the resulting substrate is exposed to nitrogen plasma so as to form an oxynitride film on the exposed surfaces on the bottom and side surface planes of the thermal oxide film. These two reducing methods may suppress diffusion of oxygen so as to lower the STI stress, but cannot completely prevent this diffusion of oxygen. As a consequence, even in the case that these reducing methods are carried out, this method may become effective.

In other words, in such a case that there is a stress which is produced due to the STI reason, this method may become effective.

Also, in the above-described embodiment, various structures related to field-effect transistors such as DRAMs and general-purpose MOSs have been described. When the inventive idea of the present invention is applied to semiconductor devices in which oxidation amounts of trenches are large such as flash memories, the present invention can have large effects.

Referring now to drawings, a semiconductor device according to a third embodiment of the present invention will be described in detail. It should be noted that the same reference numerals will be employed as those for denoting the structural elements having the same functions, and, therefore, repetitive explanations thereof are omitted.

Also, in this embodiment, it should be understood that an MOSFET (Metal Oxide Semiconductor Field-Effect Transistor) will be referred to as a general term of a "field-effect transistor", and will be abbreviated as an "MOS"; a p-channel type MOSFET will be abbreviated as a "PMOS"; an n-channel type MOSFET will be abbreviated as an "NMOS."

In this third embodiment, a description is made of such a case that the inventive idea of the present invention is applied to, for example, a flash memory having a storage capacity of 512 MB (megabits). It should also be noted that the present invention is not limited only to such a flash memory having the storage capacity of 512 MB, but may be applied to various sorts of flash memories having storage capacities smaller than 512 MB, for example, 256 MB, or large capacities, including larger than, or equal to 512 MB.

Figure 17:
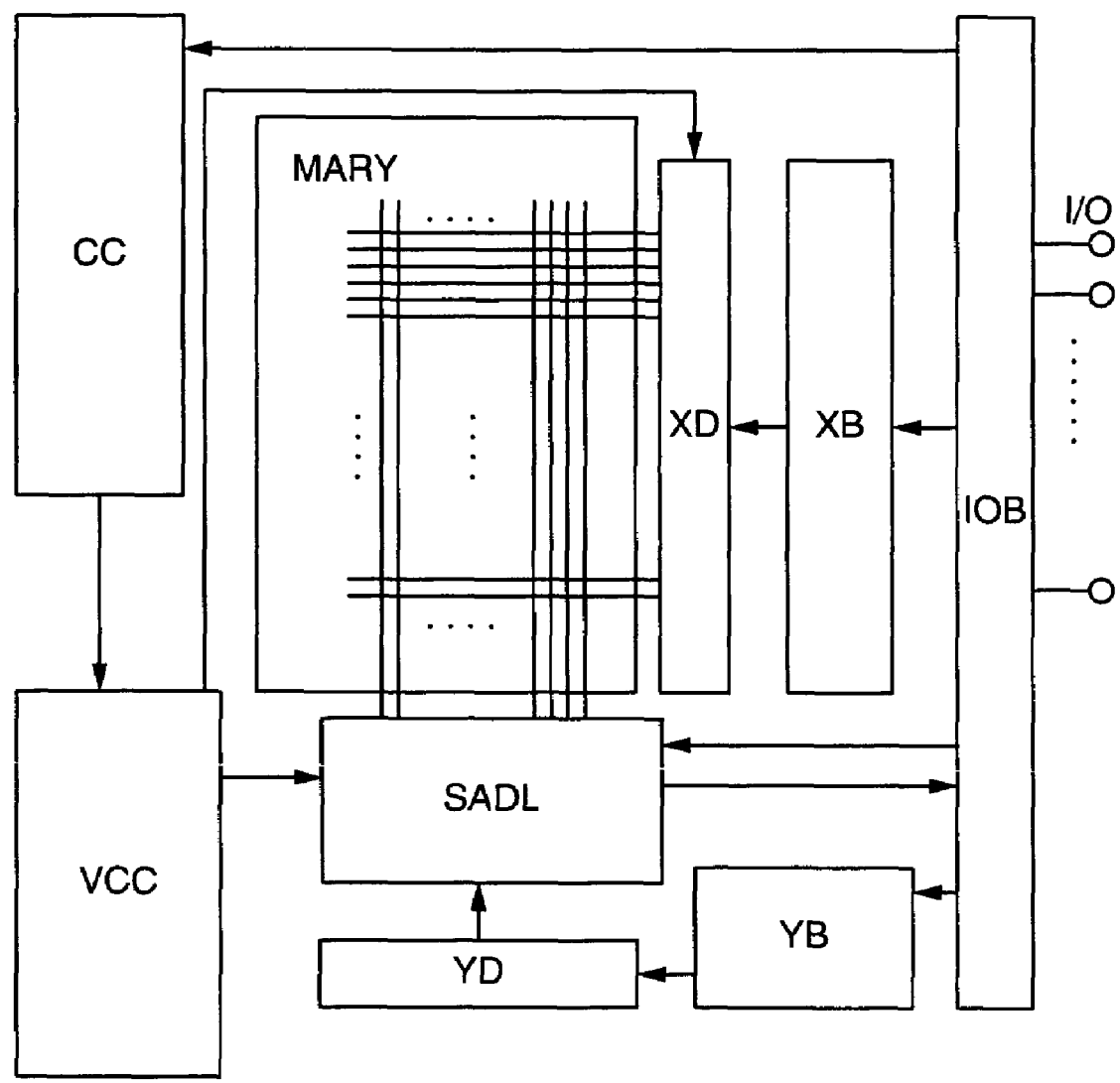
FIG. 17 is an explanatory diagram for explaining a block structure of a flash memory according to a third embodiment mode of the present invention.

FIG. 17 indicates a block construction of the above-described flash memory having the storage capacity of 512 MB according to an embodiment mode. First of all, an outline of the block construction of the flash memory according to this embodiment mode will now be explained.

With respect to a memory array "MARY", a column decoder "XD" for selecting a word line is connected, and also, a row decoder "YD" for selecting a bit line is connected via a sense amplifier data latch "SADL." An input/output buffer "IOB" is connected via a column address buffer "XB" to the column decoder XD, and, also, is connected via a row address buffer "YB" to the row decoder YD, and, further, is connected to both the sense amplifier data latch SADL and a control circuit CC. This control circuit CC is connected via a power supply control circuit VCC to both the column decoder XD and the sense amplifier latch SADL.

The control circuit CC is constituted by a command decoder, a power supply switching circuit, and a write/erase circuit. Also, the power supply control circuit VCC is constituted by a base voltage generating circuit, a write/erase voltage generating circuit, and a verify voltage generating circuit. In this case, the base voltage generating circuit corresponds to such a circuit for generating reference voltages which are inputted to the respective circuits in order that predetermined voltages of the write/erase voltage generating circuit and the verify voltage generating circuit are produced.

The memory array MARY is arranged by occupying a majority of a major surface of a semiconductor substrate. This memory array MARY owns a predetermined number of word lines which are arranged in parallel to a horizontal direction (as viewed in this drawing); a predetermined number of bit lines which are arranged in parallel to a vertical direction perpendicular to this horizontal direction; and a large number of two-layer gate structure type memory cells which are arranged in a matrix shape on essential cross points between these word lines and bit lines. The memory cells are group-divided into cell units in which (m+1) pieces of memory cells arranged along the same column are defined as one unit. This cell unit constitutes such a memory cell block that (n+1) pieces of memory cell units are defined as one unit.

Furthermore, the flash memory according to this embodiment mode employs a so-called "hierarchical bit line system." The bit lines of this memory array MARY are constituted by sub-bit lines and main bit lines. The sub-bit lines are formed by commonly coupling drains of (m+1) pieces of memory cells which constitute each of the cell units. The main bit lines are made to which (p+1) pieces of sub-bit lines arranged on the same column are selectively connected via selecting MOSs provided on the drain sides.

Sources of (m+1) pieces of memory cells which constitute each of the cell units of the memory array MARY are commonly jointed to corresponding local source lines, and these local source lines are coupled via the selecting MOSs provided on the source sides to a common source line. Control gates of (n+1) pieces of memory cells which are arranged on the same column of the memory array MARY are commonly coupled to the corresponding word lines. Both the selecting MOSs provided on the drain sides and the selecting MOSs provided on the source sides are commonly coupled to either (p+1) pieces of drain-sided block selecting signal lines or (p+1) pieces of source-sided block selecting signal lines, which are arranged in parallel to the word lines.

Figure 18:
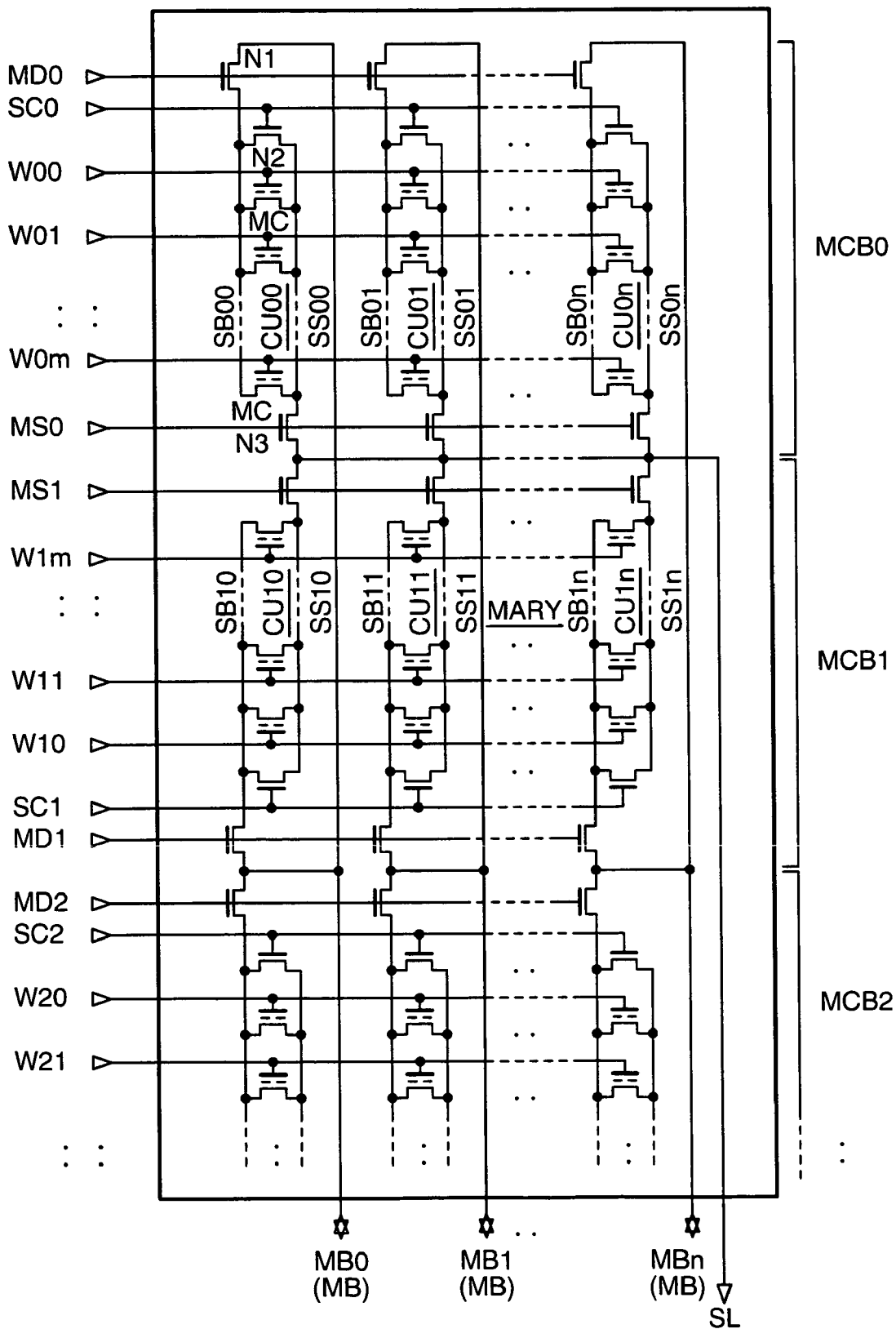
FIG. 18 is a partial circuit diagram for indicating an example of a memory array contained in the flash memory of FIG. 17.

Next, FIG. 18 shows a circuit diagram for partially showing a circuit of a memory array contained in the flash memory of FIG. 17. With reference to this drawing, a concrete structure of this memory array will now be explained. These circuits are arranged by NMOSs.

As indicated in FIG. 18, the memory array MARY of the flash memory according to this embodiment mode contains (p+1) pieces of memory cell blocks MCB0 to MCBp (in FIG. 18, only memory cell block MCB0, memory cell block MCB1, memory cell block MCB2, and circuit portions related to these memory blocks, which will be similarly applied to the following explanations). Each of these memory cell blocks contains (m+1) pieces of word lines W00 to W0m, which are arranged in parallel to a horizontal direction of this drawing, and, also, (n+1) pieces of main bit lines MB0 to MBn (MB), which are arranged in parallel to a vertical direction of this drawing, and (m+1)×(n+1) pieces of two-layer gate structure type memory cells MC which are arranged on essential cross points between these word lines and main bit lines in a matrix shape respectively. Although not specifically limited, the memory array MARY is constructed of, for example, an AND type array. A memory cell which constitutes the memory cell blocks MCB0 to MCBp is group-divided into (n+1) pieces of cell units CU00 to CU0n, or CUp0 to CUpn, while (m+1) pieces of these cell units arranged on the same column are employed as one unit. Drains of (m+1) pieces of memory cells which constitute these cell units are commonly coupled to corresponding sub-bit lines SB00 to SB0n, or SBp0 to SBpn, whereas sources of these memory cells MC are commonly coupled to corresponding local source lines SS00 to SS0n, respectively. Also, the sub-bit lines SB00 to SB0n, or SBp0 to SBpn of each of the cell units are coupled to the corresponding main bit lines MB0 to MBn via n-channel type drain-sided selecting MOSN1 whose gates are connected to the corresponding block selecting signal lines MD0 to MDp provided on the drain sides, whereas the local source lines SS00 to SS0n, or SSp0 to SSpn of each of the cell units are coupled to a common source line via n-channel type source-sided selecting MOSN3 whose gates are connected to the corresponding block selecting signal lines MS0 to MSp provided on the source sides.

Each of the cell units of the memory cell blocks MCB0 to MCBp further contains the drains which are commonly coupled to (m+1) pieces of memory cells MC corresponding thereto, namely the sub-bit lines SB00 to SB0n, or SBp0 to SBpn; and the sources which are commonly coupled to (m+1) pieces of memory cells MC corresponding thereto, namely n-channel type shortcircuit MOSN2 which are provided between the local source lines SS00 to SS0n, or SSP0 to SSpn, respectively. The gates of (n+1) pieces of shortcircuit MOSN2 which are contained in each of the memory cell blocks are commonly coupled to the block selecting signal lines SC0 to SCp for selecting the corresponding shortcircuit MOS, respectively.

Figure 19:
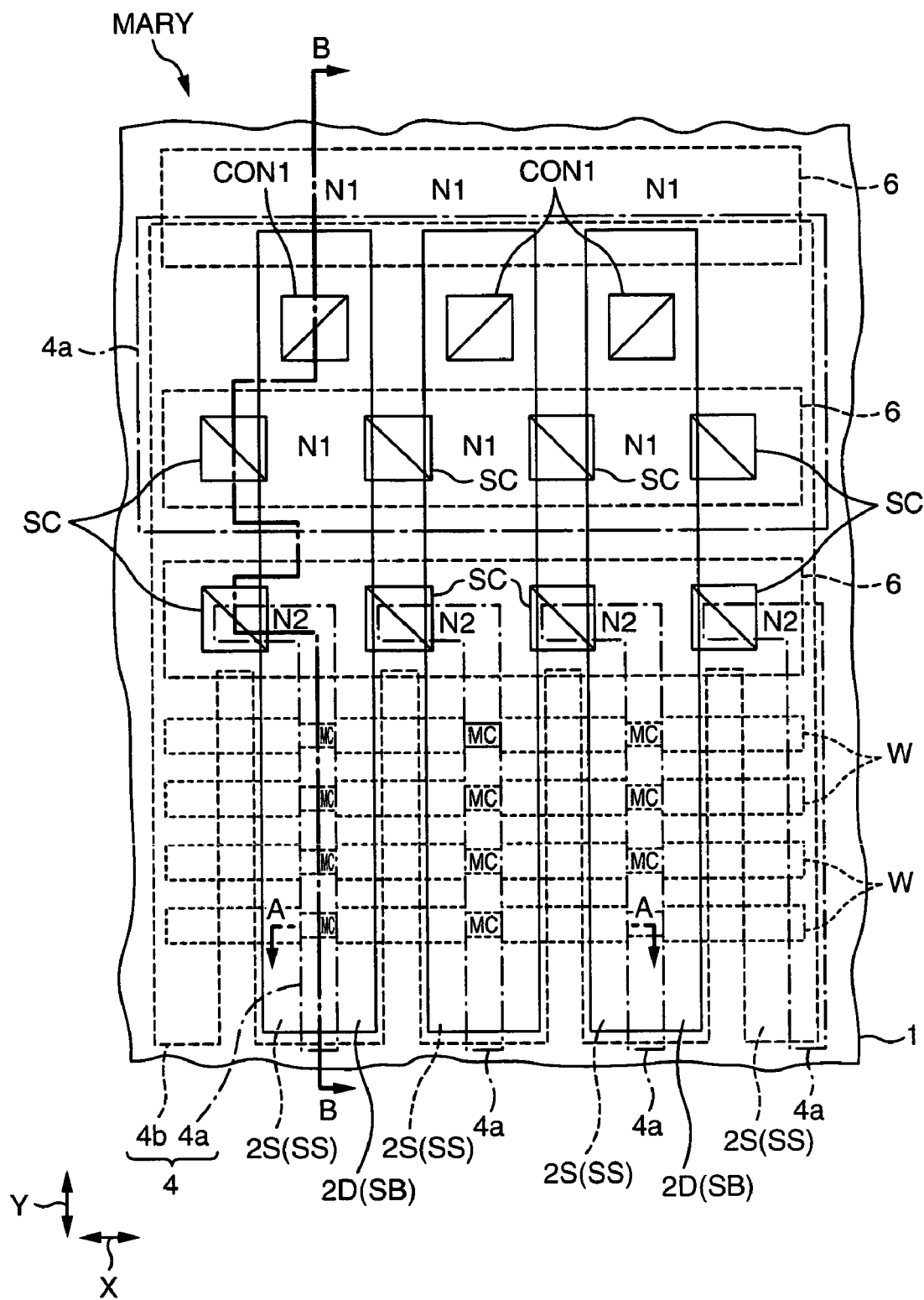
FIG. 19 is a plan view for indicating a major portion of the memory array shown in FIG. 17.
Figure 20:
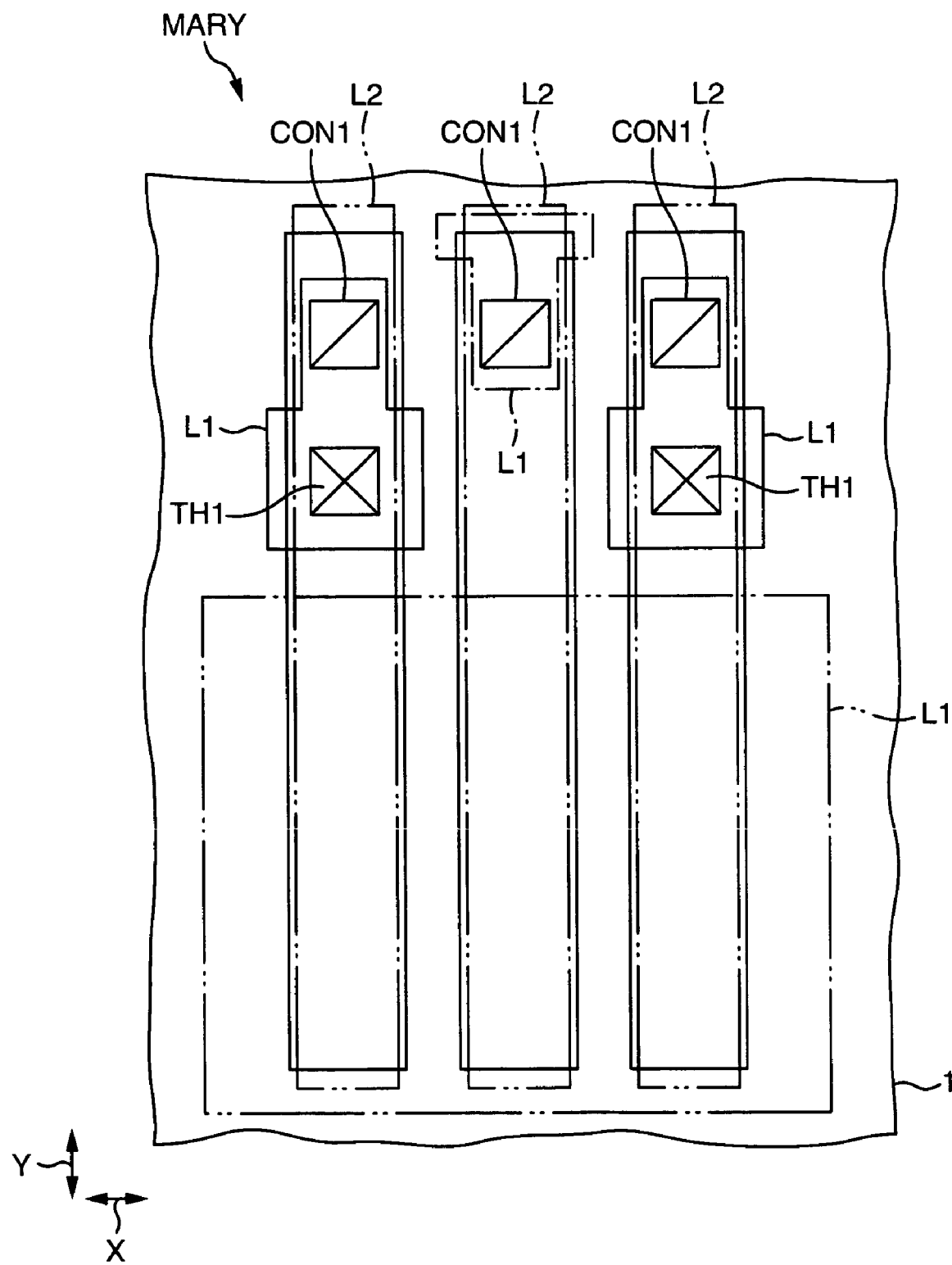
FIG. 20 is a plan view for showing the same plane region as that of FIG. 19, and for indicating a major portion of a layout layer located higher than that of FIG. 3.
Figure 21A:
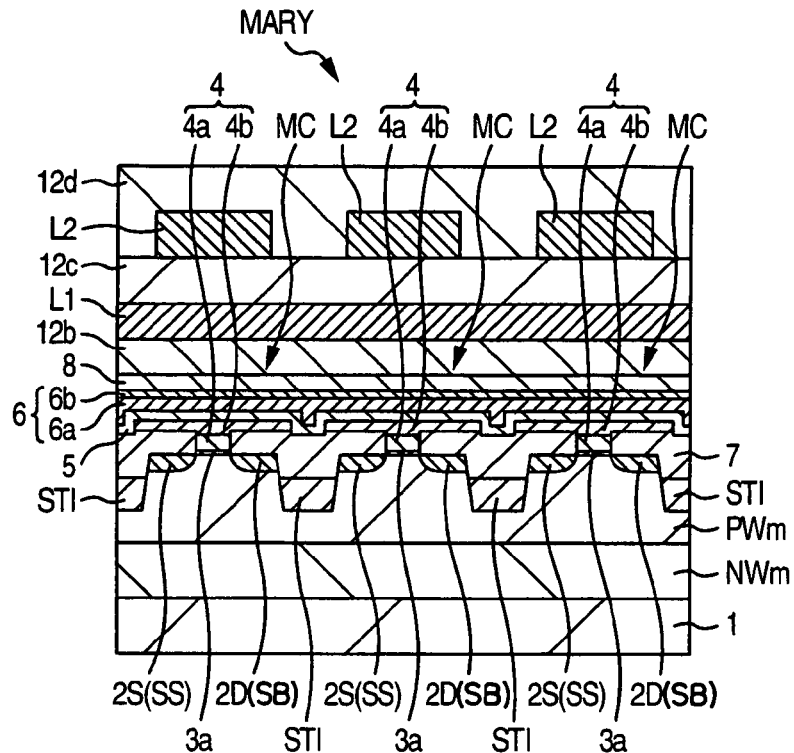
FIG. 21A is a sectional view for showing a major portion of the memory array, taken along a line A—A of FIG. 19.
Figure 21B:
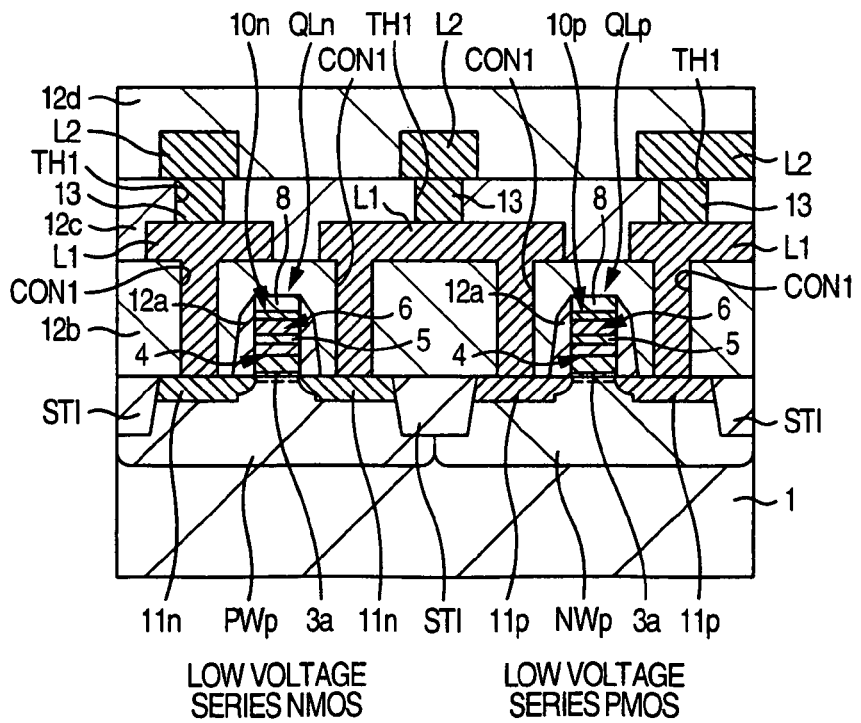
FIG. 21B is a sectional view for indicating a major portion of a peripheral circuit region.
Figure 22:
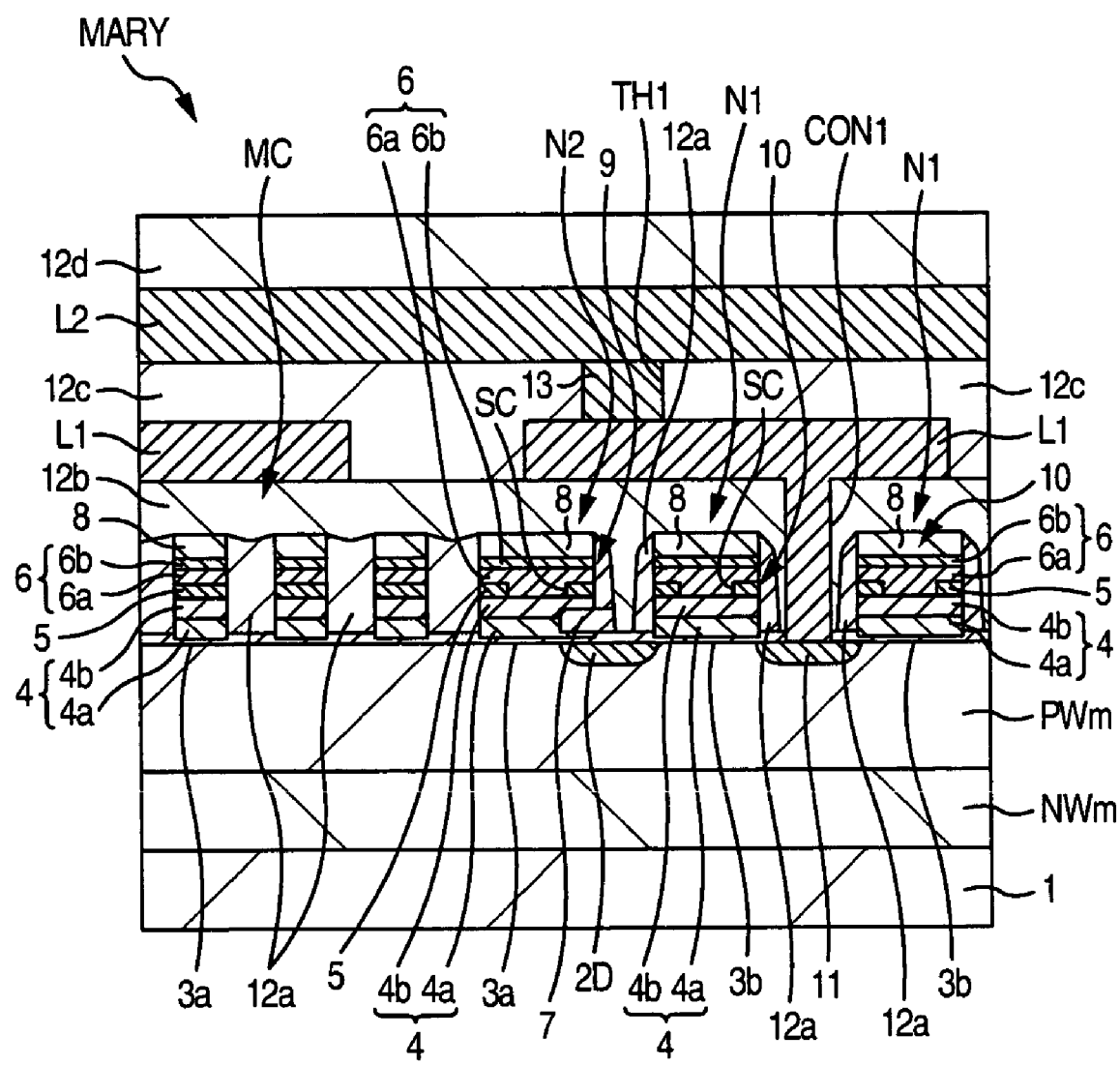
FIG. 22 is a sectional view for representing a major portion of the memory array, taken along a line B—B of FIG. 19.

Next, both an element arrangement and an element structure of the flash memory according to this embodiment mode will now be explained with reference to FIG. 19 to FIG. 22. FIG. 19 is a plan view for showing a major portion of the memory array. FIG. 20 is a plan view for indicating a major portion of a layout layer of an upper layer, as compared with that of FIG. 19, similar to the plane region of FIG. 19. FIG. 21A and FIG. 21B are sectional views for indicating major portions of the memory array and peripheral circuit regions. FIG. 22 is a sectional view of the memory array, taken along a line B to B (namely, such a line that channel portion of memory cell is cut along a Y direction intersected with word line). A peripheral circuit generally refers to a relative circuit which controls the memory array, and transmits/receives data with respect to this memory array.

It should also be noted that the memory array shown in FIG. 21A corresponds to a sectional view of the memory array, taken along a line A to A (namely, such a line that memory array is cut along elongate direction (X direction) on word line W). In the peripheral circuit region shown in FIG. 21B, circuit elements different from the memory array are formed. Both a low-voltage series NMOS and a low-voltage series PMOS shown in the peripheral circuit region correspond to such MOSs used in the peripheral circuits, the drive voltages of which are relatively low, for example, approximately 1.8V to 3.3V. However, such MOSs, which are used in the peripheral circuits and are formed in the peripheral circuit region, the drive voltages of which are relatively high, are omitted in this embodiment mode. Also, in this case, both the sectional views of FIG. 21A and FIG. 21B, and also, the sectional view of FIG. 22 will be mainly explained. However, a plane structure will be explained with reference to the portion covered by FIG. 19 and FIG. 20 in this Specification.

A semiconductor substrate 1 which constitutes the above-described semiconductor chip is made of, for example, p type silicon single crystal. A p-well "PWm" made by conducting, for example, boron (B) is formed in the semiconductor substrate 1 of the memory array MARY, whereas both a p-well "PWp" made by conducting, for instance, boron, and also an n-well "NWp" made by conducting, for example, either phosphor (P) or arsenic (As) are formed in the semiconductor substrate 1 of the peripheral circuit region.

Although not specifically limited thereto, the p-well PWm is embedded in n-well NWm which is shown as an under layer thereof, and the n-well NWp is formed on the side portion of the p-well PWm, and is electrically isolated from the semiconductor substrate 1. The n-well NWm is made by conducting, for example, either phosphor or arsenic into the semiconductor substrate 1, and may have such a function capable of suppressing, or avoiding noise produced from other elements formed on the semiconductor substrate 1 and entering via the semiconductor substrate 1 into the p-well PWm (namely, memory cell MC). Also, this function is capable of setting a potential at the p-well PWm to a predetermined value independent from the semiconductor substrate 1.

For example, a trench type isolating portion (shallow trench isolation) STI is formed in a major plane of the semiconductor substrate 1. The trench isolating portion STI is formed by embedding an insulating film into a trench etched in the semiconductor substrate 1, while the insulating film of the trench isolating portion STI is made of, for example, a silicon oxide, etc. The trench isolating portions STI in the memory array are arranged in a plane belt shape along the Y direction in such a manner that interlayers among a plurality of memory cells MC arranged along the elongate direction (X direction) of the word lines are electrically isolated from each other. The trench isolating portions may constitute a stripe-shaped activated region having a width narrower than, or equal to, for example, 1 µm.

Also, in the memory array MARY, an upper surface of the insulating film of the trench isolating portion STI is caused to fall (i.e., is recessed) from the surface of the semiconductor substrate 1, and a recess amount is relatively large, for example, approximately 80 nm. This recess amount implies such a fall amount defined from the surface of the semiconductor substrate 1 up to the upper surface of the insulating film of the trench isolating portion STI. As explained above, since the trench isolating portion STI is made of such a structure that the recess amount is relatively large, an upper portion of the side wall of the trench may become a free plane. As a result, when the semiconductor substrate is thermally treated at a temperature higher than, or equal to 800° C., a stress produced in the semiconductor substrate 1 may be reduced.

In such a peripheral circuit region that a width of an activated region is wider than, or equal to 1 µm, and patterns are arranged in a relatively coarse manner, the upper plane of the insulating film of the trench isolating portion STI is flattened in such a manner that this upper plane is made substantially coincident with the surface of the semiconductor substrate 1. A recess amount is equal to zero, or is relatively small, for example, 0 to approximately 40 nm.

In the peripheral circuit region, the gate electrodes of the MOSs are continuously present from the active region to the trench isolating portion STI. As a result, when such a trench isolating portion STI having a large recess amount is employed in the peripheral circuit region, electric field concentration may occur in edge portions of an active region, so that a gate insulating film of an MOS may be easily destroyed, or break-down. To avoid such a breakdown problem, it is desirable to reduce the recess amount of the trench isolating portion STI in the peripheral circuit region to zero, or a relatively small recess amount. It should be understood that since the activated region of the peripheral circuit region is made larger than the active region of the memory array, the stress which is produced in the semiconductor substrate 1 by the trench isolating portion STI may be dispersed, and thus, an occurrence of such a crystalline defect may be suppressed even when the recess amount is not made large in the peripheral circuit region.

Each of the memory cells MC contains one pair of n type semiconductor regions 2S and 2D formed in the semiconductor substrate 1; an insulating film 3a formed on the major plane (active region) of the semiconductor substrate 1; a conductive film 4 for a floating gate electrode, which is formed on this insulating film 3a; an interlayer film 5 formed on this conductive film 4; and also, another conductive film 6 for a control gate electrode formed on this interlayer film 5.

The n type semiconductor region 2S of the memory cell MC corresponds to such a region for constructing a source region, and is formed by a portion of the above-described local source line SS. Also, the n type semiconductor region 2D of the memory cell MC corresponds to such a region for constructing a drain region, and is formed by a portion of the above-described sub-bit line SB. Both the local source line SS and the sub-bit line SB are formed in such a manner that these lines SS/SB are elongated in a plane-belt shape along the Y direction in parallel to each other in order to sandwich a plurality of memory cells MCs in a plane manner, which are arranged along the Y direction. These local source line and sub-bit line SS/SB may constitute such an area which is commonly used by a plurality of these sandwiched memory cells MC.

In this embodiment mode, this n type semiconductor region 2S (namely, local source line SS), and the n type semiconductor region 2D (namely, sub-bit line SB) are formed in such a manner that, for example, arsenic is conducted into the semiconductor substrate 1 in concentration of, for instance, approximately $10^{14}/cm^2$. As a result, a shallow junction between the semiconductor regions 2S and 2D can be realized, and, furthermore, the impurity concentration can be increased while an occurrence of a short channel effect may be suppressed, or prevented, so that very fine processing operation can be realized, reliability can be secured, and lowering of the resistance (sheet resistance) can be realized. It should also be noted that the local source line SS is electrically connected to the common source line SL (see FIG. 18) formed by the metal film via the selecting MOSN3, and the sub-bit line SB is electrically connected to the main bit line MB formed by the metal film via the selecting MOSN1.

The insulating film 3a beneath the floating gate electrode of the memory cell MC is made of, for example, a silicon oxide having a thickness of approximately 9 to 10 nm. This insulating film 3a may constitute an electron penetrating region (namely, tunnel insulating film) in such a case that such electrons which may contribute to write, or erase information may be injected from the semiconductor substrate 1 into the conductive film 4 for the floating gate electrode, and/or such electrons held by this conductive film 4 are ejected into the semiconductor substrate 1.

The conductive film 4 for the floating gate electrode is constituted by a two-layer conductive film, namely, a lower layer conductive film 4a and an upper layer conductive film 4b sequentially stacked thereon. Any of the lower layer conductive film 4a and the upper layer conductive film 4b is made of polycrystal silicon having a low resistance, into which an impurity has been conducted. A thickness of the lower layer conductive film 4a is selected to be, for example, approximately 70 nm, and a thickness of the upper layer conductive film 4b is selected to be, for instance, approximately 40 nm.

It should be noted that as represented in the sectional view (see FIG. 21A) taken along the X direction of FIG. 19, a sectional view of this conductive film 4 is formed as a T-shape, in which the width of the upper layer conductive film 4b is made wider than the width of the lower layer conductive film 4a. As a result, while the gate length of the memory cell MC is kept short, a counter area of the conductive film 4 for the floating gate electrode can be increased with respect to the conductive film 6 for the control gate electrode, and thus, a capacitance formed between the control gate electrode and the floating gate electrode can be increased. As a consequence, while the very fine memory cell MC is maintained, the operation efficiency of the memory cell MC can be improved.

Also, since an insulating film 7 made of, for example, a silicon oxide is interposed between the upper layer conductive film 4b of the conductive film 4 for the floating gate electrode and the semiconductor substrate 1, one pair of n type semiconductor regions 2S/2D may be insulated from the conductive film 4b.

The surface of the upper layer conductive film 4b for the floating gate electrode is covered by the interlayer film 5. As a result, the conductive film 4 for the floating gate electrode is insulated from the conductive film 6 for the control gate electrode. The interlayer film 5 is formed in such a manner that, for example, silicon oxide films are stacked via silicon nitride films on silicon oxide films. A thickness of this interlayer film 5 is selected to be, for instance, approximately 15 nm. The conductive film 6 for the control gate electrode corresponds to such an electrode which is used to read, write, and erase information. This conductive film 6 is formed with the word line W in an integral form, and is constituted by a portion of this word line W. The conductive film 6 (namely, word line W) for the control gate electrode is formed in such a way that, for example, a two-layer conductive film, namely, a lower layer conductive film 6a and an upper layer conductive film sequentially stacked thereon. The lower layer conductive film 6a is made of, for example, polycrystal silicon having a low resistance and a thickness of approximately 100 nm. The upper layer conductive film 6b is made of, for example, a tungsten silicide (WSi$_x$) having a thickness of approximately 80 nm, and is stacked under such a condition that this upper layer conductive film 6b is electrically connected to the lower layer conductive film 6a.

Since this upper layer conductive film 6b is provided, the electric resistance of the word line W may be lowered, so that the operating speed of the flash memory can be improved. It should also be noted that the structure of this conductive film 6 is not limited only to the above-described structure, but may be changed into various sorts of modified structures. For example, such a structure may be employed in which a metal film such as tungsten may be stacked via a barrier conductive film such as a tungsten nitride on polycrystal silicon having a low resistance. In this alternative case, since the electric resistance of the word line W may be greatly lowered, the operating speed of the flash memory can be, furthermore, improved. It should also be noted that a cap insulating film 8 made of, for example, a silicon oxide is formed on the word line W.

Such MOS structures as a low voltage series "NMOSQLn", a low voltage series "PMOSQLp", a shortcircuit "MOSN2", and a selecting "MOSN1" may be formed by the same manufacturing process as that of the abovedescribed memory cell MC. The gate electrodes of these MOSs (namely, gate electrode 10n of low voltage series NMOSQLn, gate electrode 10p of low voltage series PMOSQLp, gate electrode 9 of shortcircuit MOSN2, and gate electrode 10 of selecting MOSN1) own such a stacking structure that the conductive film 6 for the control gate electrode is stacked via the interlayer film 5 on the conductive film 4 for the floating gate electrode. While the conductive film 4 and the conductive film 6 are electrically connected via a contact hole SC to each other, the cap insulating film 8 is formed on the conductive film 6.

Furthermore, these MOSs own sources and drains, which have been separately formed. For example, the n-type semiconductor region 11n is formed in the low voltage series NMOSQLn; the p type semiconductor region 11p is formed in the low voltage series PMOSQLp; and also, the n type semiconductor region 11 is formed in the selecting MOSN1. The gate insulating films of the low voltage series NMOSQLn, the low voltage series PMOSQLp, and the shortcircuit MOSN2 are constituted by the same layer as the insulating film 3a which constitutes the tunnel insulating film of the memory cell MC, whereas the gate insulating film of the selecting MOSN1 is constructed of the insulating film 3b which is made of, for example, a silicon oxide having a thickness of approximately 20 nm. It should be understood that both the tunnel insulating film of the memory cell MC and the gate insulating film of the low voltage series MOS are constituted by the insulating films 3a of the same layer in this embodiment mode, but the present invention is not limited only thereto, for example, it may be constituted by insulating films of different layers.

Furthermore, insulating films 12a made of, for example, a silicon oxide are employed so as to cover a side surface of the conductor film 4 for the floating gate electrode, a side surface of the conductive film 6 for the control gate electrode, side surfaces of these gate electrodes 9, 10, 10n, 10p, and a side surface of the cap insulating film 8. In particular, intermediate portions among the word lines W which are located adjacent to each other along the above-explained gate width direction are embedded by the insulating film 12a. An insulating film 12b made of, for instance, a silicon oxide is deposited on such insulating films 12a and conductive film 6.

A first layer wiring line L1 made of, for example, tungsten is formed on this insulating film 12b. The preselected first layer wiring line L1 is electrically connected via a contact hole CON1 pierced in the insulating film 12b to the n type semiconductor region 11n of the low voltage series NMOSQLn, the p type semiconductor region 11p of the low voltage series PMOSQLp, and the n type semiconductor region 11 of the selecting MOSN1.

In addition, another insulating film 12c made of, for example, a silicon oxide is deposited on the insulating film 12b, so that the surface of the first layer wiring line L1 is covered by this insulating film 12c. A second layer wiring line L2 is formed on this insulating film 12c. This second layer wiring line L2 is manufactured by sequentially stacking, for instance, a titanate nitride, aluminum, and a titanate nitride in this order from a lower layer. This second layer wiring line L2 is electrically connected to the first layer wiring line L1 via a plug 13 which is embedded inside a through hole "TH1" pierced in the insulating film 12c. The surface of this second layer wiring line L2 is covered by another insulating film 12d made of, for example, a silicon oxide. Further, although not shown in the drawing, a third layer wiring line is formed on this insulating film 12d. This third layer wiring line is manufactured by sequentially stacking, for instance, a titanate nitride, aluminum, and a titanate nitride in this order from a lower layer. This third layer wiring line is electrically connected to the second layer wiring line L2 via a through hole pierced in the insulating film 12d.

Next, a description is made of an example of a flash memory manufacturing method in accordance with manufacturing step sequences.

Figure 23:
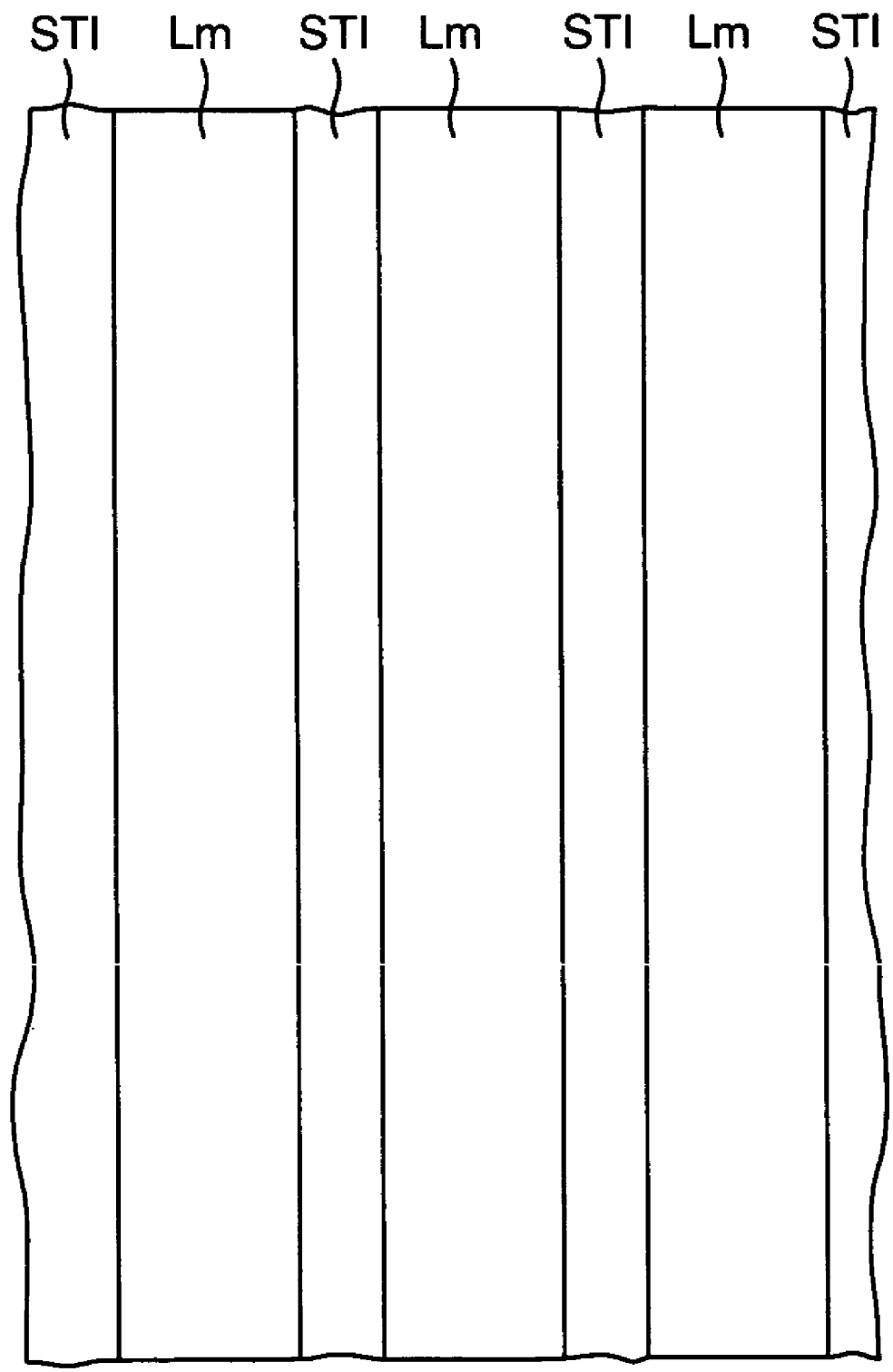
FIG. 23 is a plan view for showing a major portion of the flash memory of FIG. 17 during a manufacturing step thereof.
Figure 24:
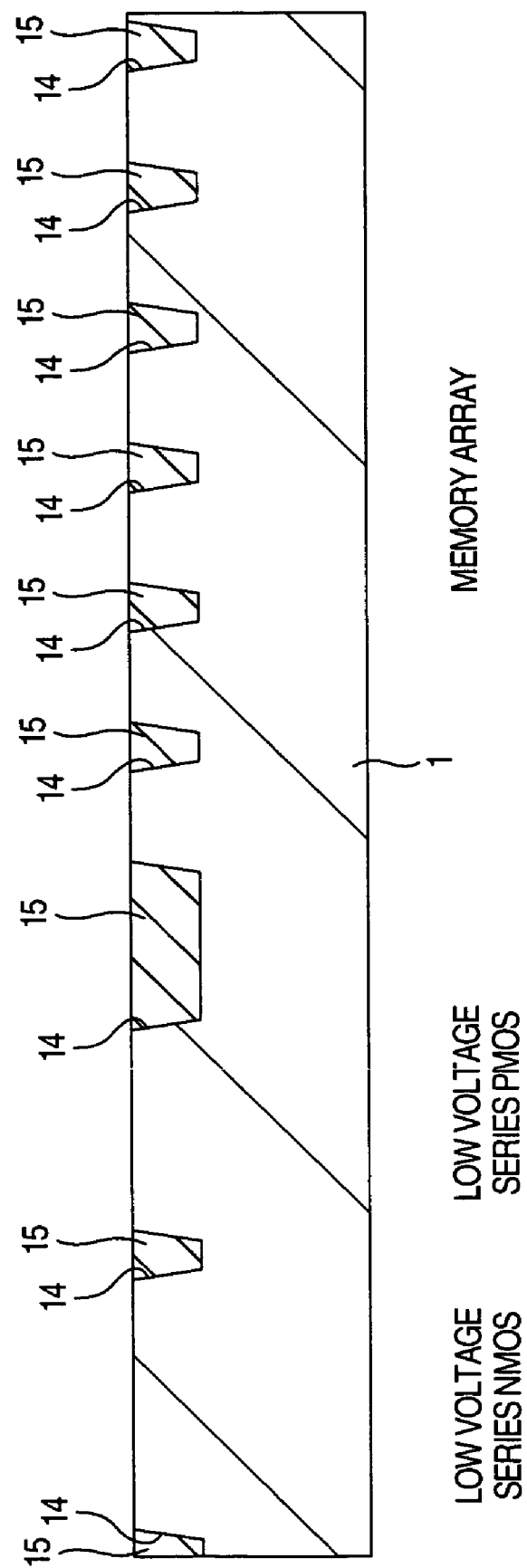
FIG. 24 is a sectional view for showing a major portion of the flash memory during the same manufacturing step as that of FIG. 23.

FIG. 23 and FIG. 24 are diagrams for schematically showing manufacturing steps of the flash memory according to this embodiment mode. FIG. 23 is a plan view for indicating a major portion of the memory array (containing both shortcircuit MOS and selecting MOS) corresponding to FIG. 20. FIG. 24 is a sectional view for indicating a major portion containing both the memory array and the peripheral circuit region of the flash memory corresponding to FIG. 21. The memory array in this embodiment mode corresponds to the A—A line sectional view of FIG. 19 (similarly applied to subsequent drawings). Both a low voltage series NMOS and another low voltage series PMOS are exemplified in the peripheral circuit region.

First, as shown in FIG. 23 and FIG. 24, shallow type isolating portions "STI" and active regions "Lm" arranged in such a manner that the activated regions Lm are surrounded by these shallow type isolating portions STI are formed in a major surface of a semiconductor substrate 1 made of silicon single crystal. In this manufacturing stage, this semiconductor substrate 1 is a semiconductor thin plate having a substantially circular shape (as viewed in plane), which is referred to as a "semiconductor wafer."

The shallow type isolating portion STI may be manufactured in accordance with, for instance, the below-mentioned manufacturing method. After an isolating trench 14 has been formed in a predetermined place of the semiconductor substrate 1, this resulting semiconductor substrate 1 is processed by a thermal oxidization process in order to form a silicon oxide film having a thickness of approximately 5 to 20 nm (not shown). Subsequently, an insulating film 15 made of, for example, a silicon oxide is deposited on the major surface of the semiconductor substrate 1 by way of either a CVD method or a sputtering method. Furthermore, the insulating film 15 is left within the isolating trench 14 of a memory array in such a manner that the surface of this insulating film 15 is made substantially coincident with the major surface of the semiconductor substrate 1 by polishing this surface of the insulating film 15 by way of a CMP (Chemical Mechanical Polishing) method, or the like.

Figure 25:
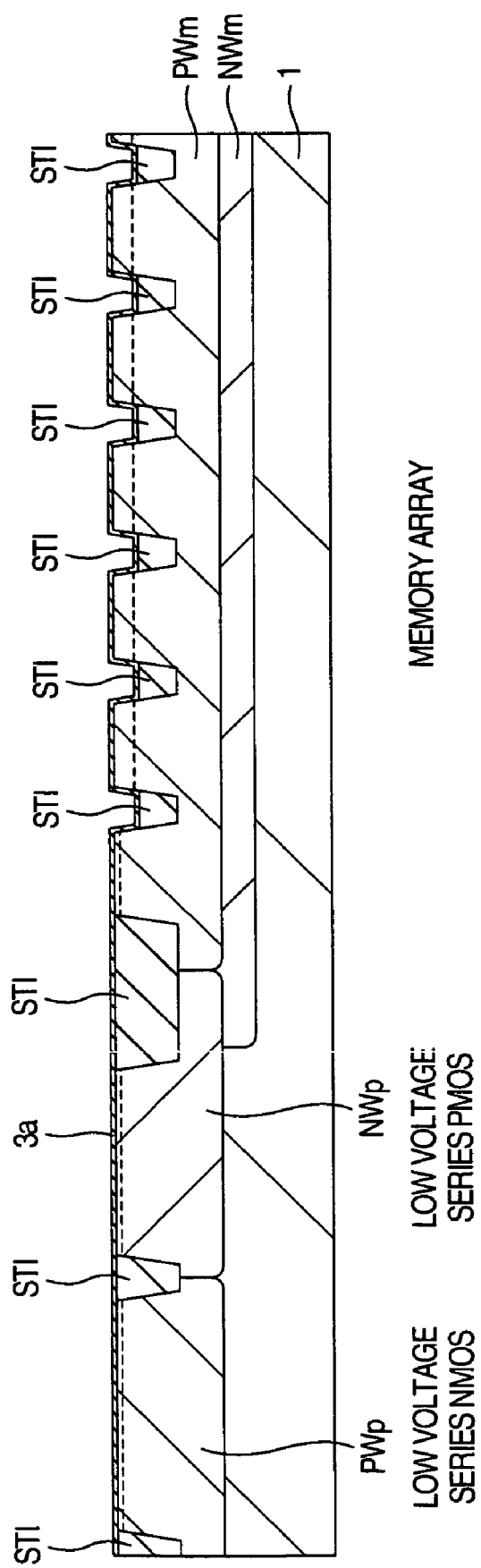
FIG. 25 is a sectional view for representing a major portion of the same portion as that of FIG. 24 during a manufacturing step of the flash memory subsequent to FIG. 23 and FIG. 24.

Next, FIG. 25 is a sectional view for indicating a major portion of the semiconductor substrate at the same place as that of FIG. 24 in a subsequent manufacturing step. First, after the peripheral circuit region has been covered by a photoresist pattern, while this photoresist pattern is employed as a mask, a preselected amount of the insulating film 15 embedded inside the isolating trench 14 of the memory array is etched back. Thereafter, a thermal treatment is carried out at a temperature of approximately 1000° C. with respect to the semiconductor substrate 1 in order to make the insulating film 15 accurate. As a result, such an isolating portion STI whose recess amount is approximately 0 to 40 nm is formed in the peripheral circuit region, and also, another isolating portion STI whose recess amount is approximately 80 nm is formed in the memory array.

Subsequently, a preselected impurity is selectively conducted into a predetermined portion of the semiconductor substrate 1 by way of an ion implantation method, or the like by predetermined energy so as to form an embedding n-well NWm, a p well PWm, another p well PWp, and an N well NWp.

Next, two sorts of insulating films 3a and 3b having different thicknesses are formed. First, a thicker insulating film having a thickness of, for example, approximately 20 nm is formed on the major surface of the semiconductor substrate 1 by way of a thermal oxidization method, or the like. Subsequently, a photoresist pattern is formed in such a manner that both the memory array (excluding selecting MOS) and the peripheral circuit region are exposed over this thicker insulating film, and other regions are covered. Thereafter, while this portion is used as an etching mask, the thicker insulating film exposed from this portion is etch-removed by way of a wet etching method, or the like. Then, after this photoresist pattern has been removed, the semiconductor substrate 1 is again thermally oxidized so as to form a tunnel oxide film on the memory array. As a result, a relatively thinner insulating film 3a having a thickness of, for example, 9 nm is formed on both the memory array (excluding selecting MOS region) and the peripheral circuit region, whereas a relatively thicker insulating film 3b having a thickness of, for example, 25 nm is formed in the selecting MOS region (see FIG. 22).

Figure 26:
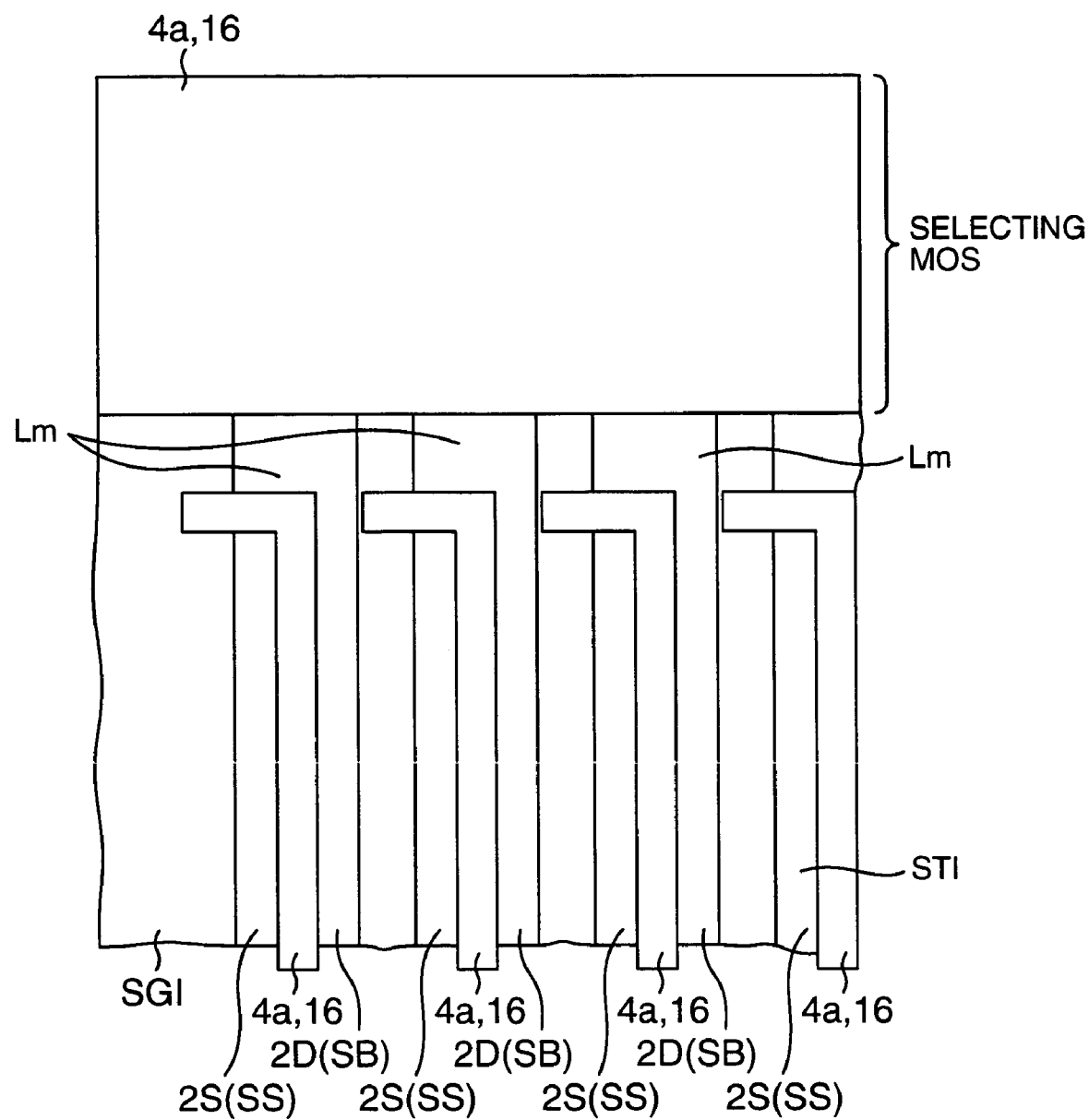
FIG. 26 is a plan view for indicating a major portion of the same portion as that of FIG. 23 during a manufacturing step of the flash memory subsequent to FIG. 25.
Figure 27:
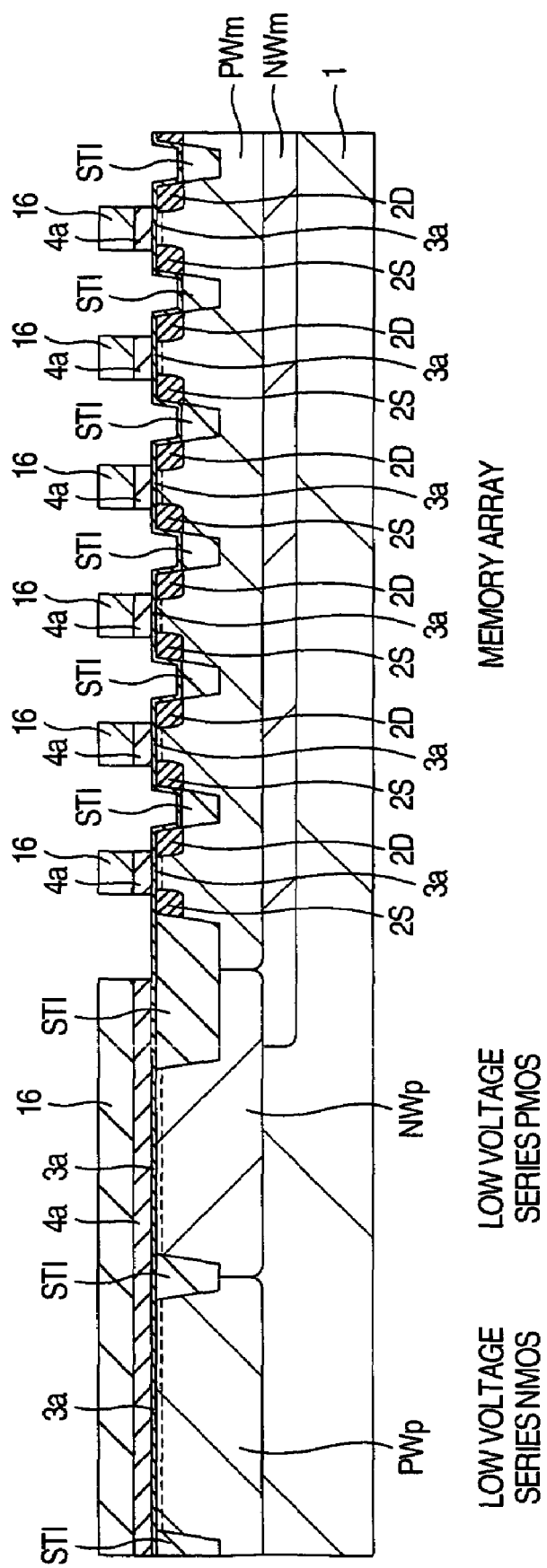
FIG. 27 is a sectional view for indicating a major portion of the same portion as that of FIG. 24 as to the flash memory during the same manufacturing step as that of FIG. 26.

Next, FIG. 26 is a plan view for showing a major portion of the semiconductor substrate at the same place as that of FIG. 23 in a subsequent manufacturing step. FIG. 27 is a sectional view for indicating a major portion of the semiconductor substrate at the same place as that of FIG. 24 in a subsequent manufacturing step.

First, both a lower layer conductive film 4a made of low-resistance polycrystal silicon having a thickness of, for example, 70 nm, and an insulating film 16 made of a silicon nitride, or the like have been sequentially deposited on the major surface of the semiconductor substrate 1, in the order beginning with the lower layer, by way of the CVD method, or the like. Both the insulating film 16 and the lower layer conductive film 4a are then treated by employing both the photolithography technique and the dry etching technique, so that the lower layer conductive film 4a, which will form a floating gate electrode in the memory array, is patterned. In this case, both the peripheral circuit region and the selecting MOS region are entirely covered by both the lower layer conductive film 4a and the insulating film 16. Subsequently, since an impurity (for example, arsenic) used to form sources/drains of the memory cell is conducted into the semiconductor substrate 1 by way of the ion implantation method, or the like, one pair of n type semiconductor regions 2S and 2D (namely, local source line SS and sub-bit line SB) are formed. In this case, both the peripheral circuit region and the selecting MOS region are covered by the lower layer conductive film 4a.

Figure 28:
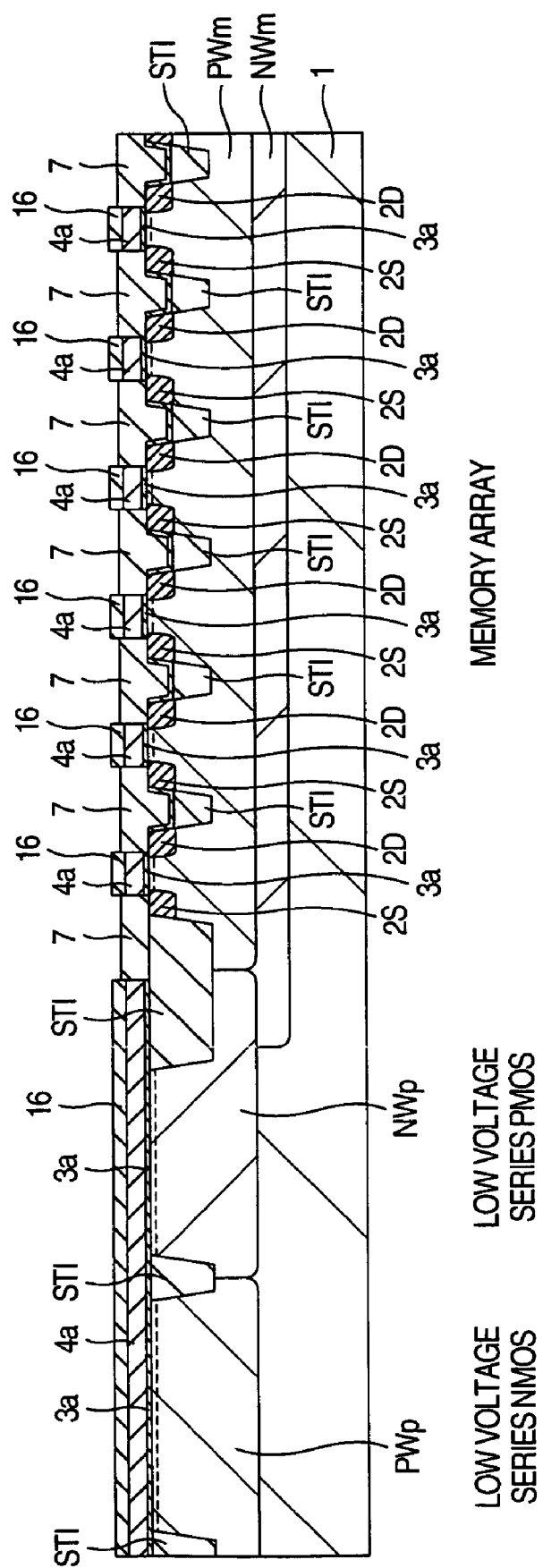
FIG. 28 is a sectional view for representing a major portion of the same portion as that of FIG. 24 during manufacturing step of the flash memory subsequent to FIG. 26 and FIG. 27.

Next, FIG. 28 is a sectional view for indicating a major portion of the semiconductor substrate at the same place as that of FIG. 24 in a subsequent manufacturing step.

In this step, after an insulating film 7 made of, for example, a silicon oxide has been deposited on the major surface of the semiconductor substrate 1 at a first step, this deposited insulating film 7 is polished by way of the CMP method in such a manner that this insulating film 7 is left within a recess on the major surface of the semiconductor substrate 1. Further, this polished insulating film 7 is etched by way of the dry etching method, or the like. As a result, the major surface of the semiconductor substrate 1 is flattened. Also, an upper layer conductive film for a floating gate electrode (will be explained later) which is deposited on this flattened major surface is made not to be in contact with the n type semiconductor regions 2S and 2D for the source and drain of the memory cell. In this case, although the insulating film 16 is also removed, the upper layer conductive film may function so as to protect the under layer.

Figure 29:
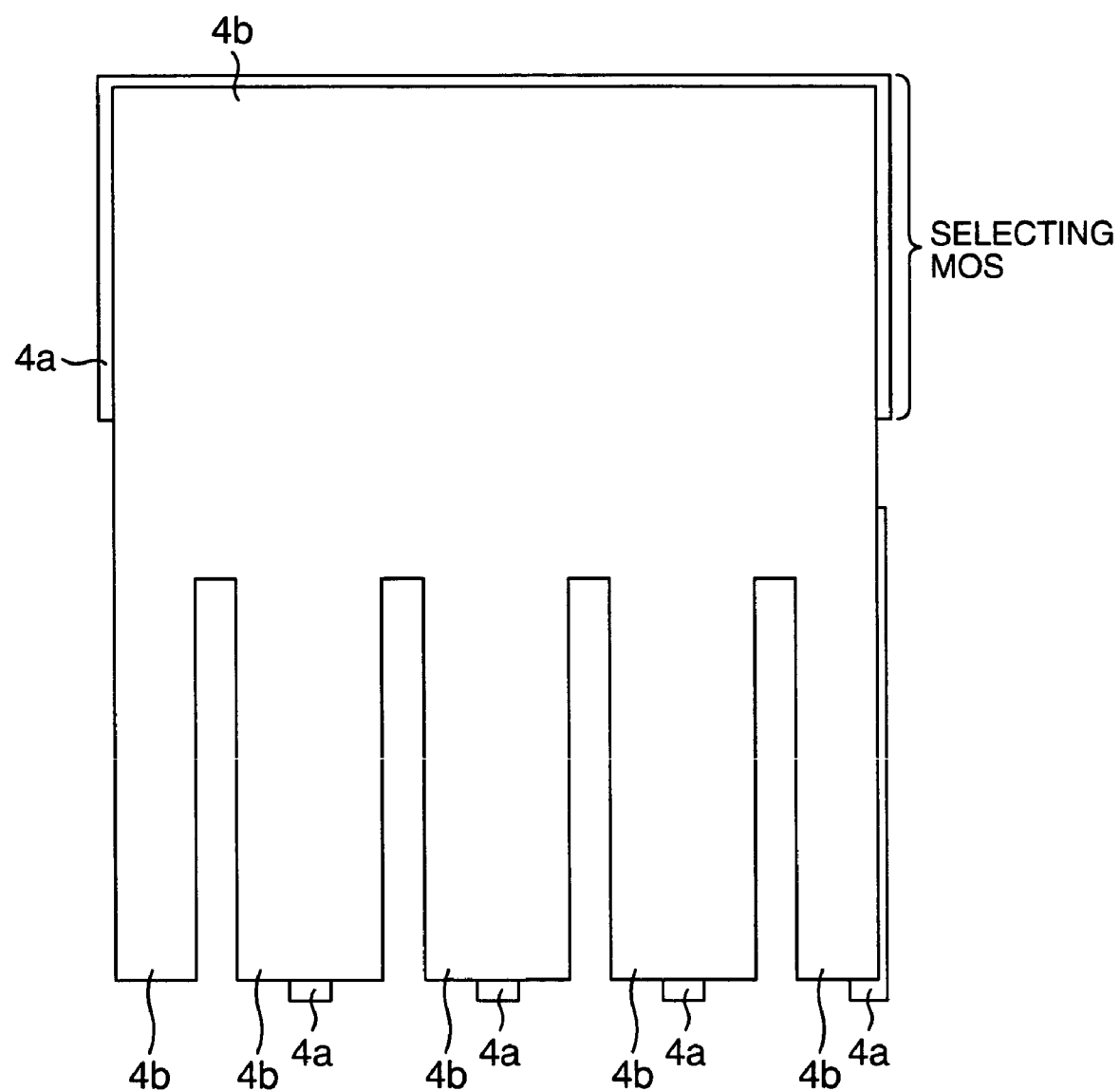
FIG. 29 is a plan view for indicating a major portion of the same portion as that of FIG. 23 during manufacturing step of the flash memory subsequent to FIG. 28.
Figure 30:
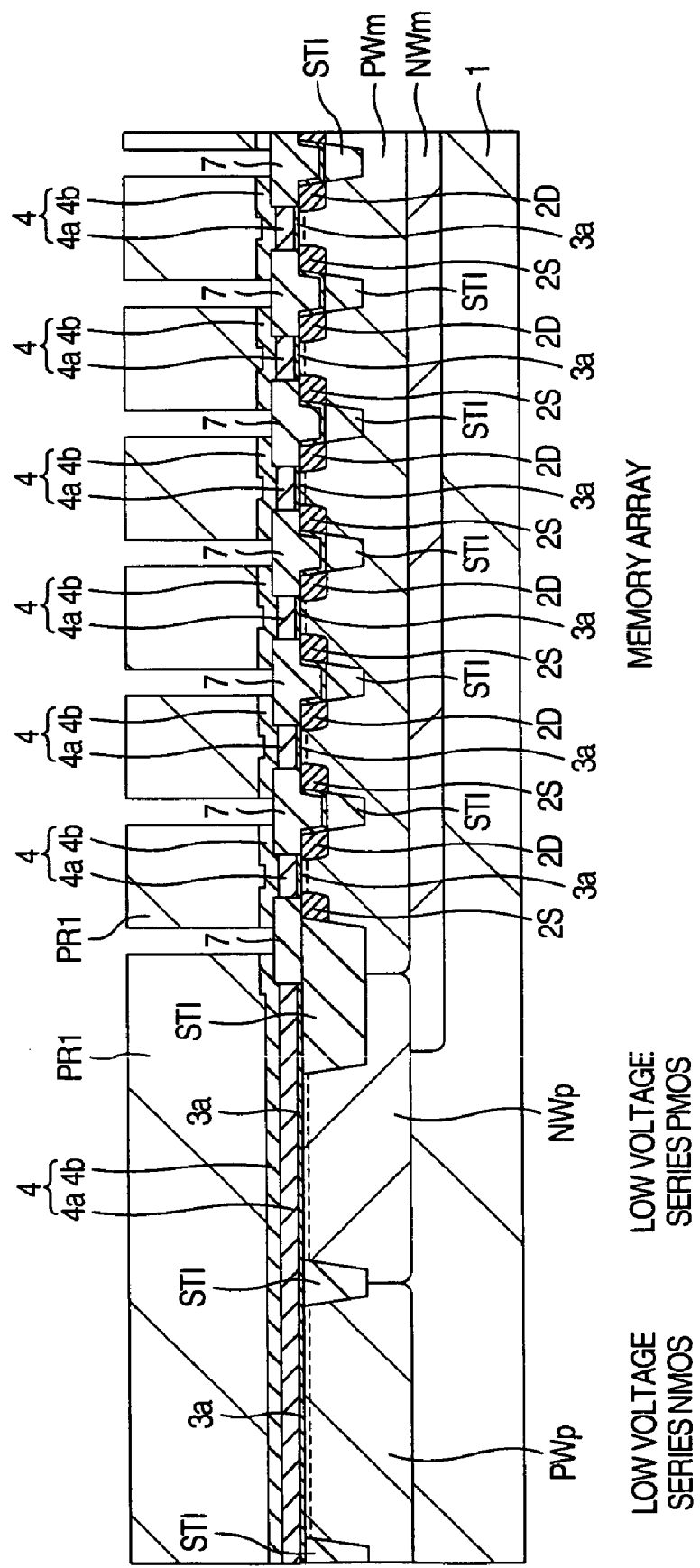
FIG. 30 is a sectional view for indicating a major portion of the same portion as that of FIG. 24 as to the flash memory during the same manufacturing step as that of FIG. 29.

Next, FIG. 29 is a plan view for showing a major portion of the semiconductor substrate at the same place as that of FIG. 23 in a subsequent manufacturing step. FIG. 30 is a sectional view for indicating a major portion of the semiconductor substrate at the same place as that of FIG. 24 in a subsequent manufacturing step.

First, after an upper layer conductive film 4b which is made of low-resistance polycrystal silicon having a thickness of, for example, approximately 40 nm has been deposited on the major surface of the semiconductor substrate 1, a photoresist pattern "PR1" is formed on this deposited upper layer conductive film 4b by way of the photolithography technique. While this photoresist pattern PR1 is employed as an etching mask, since the upper layer conductive film 4b exposed from this photoresist pattern is removed by the dry etching method, or the like, such a floating gate electrode is formed which is constructed of both the lower layer conductive film 4a and the upper layer conductive film 4b. It should be noted the peripheral circuit region, the shortcircuit MOS region, and the selecting MOS region are entirely covered by the upper layer conductive layer 4b.

Figure 31:
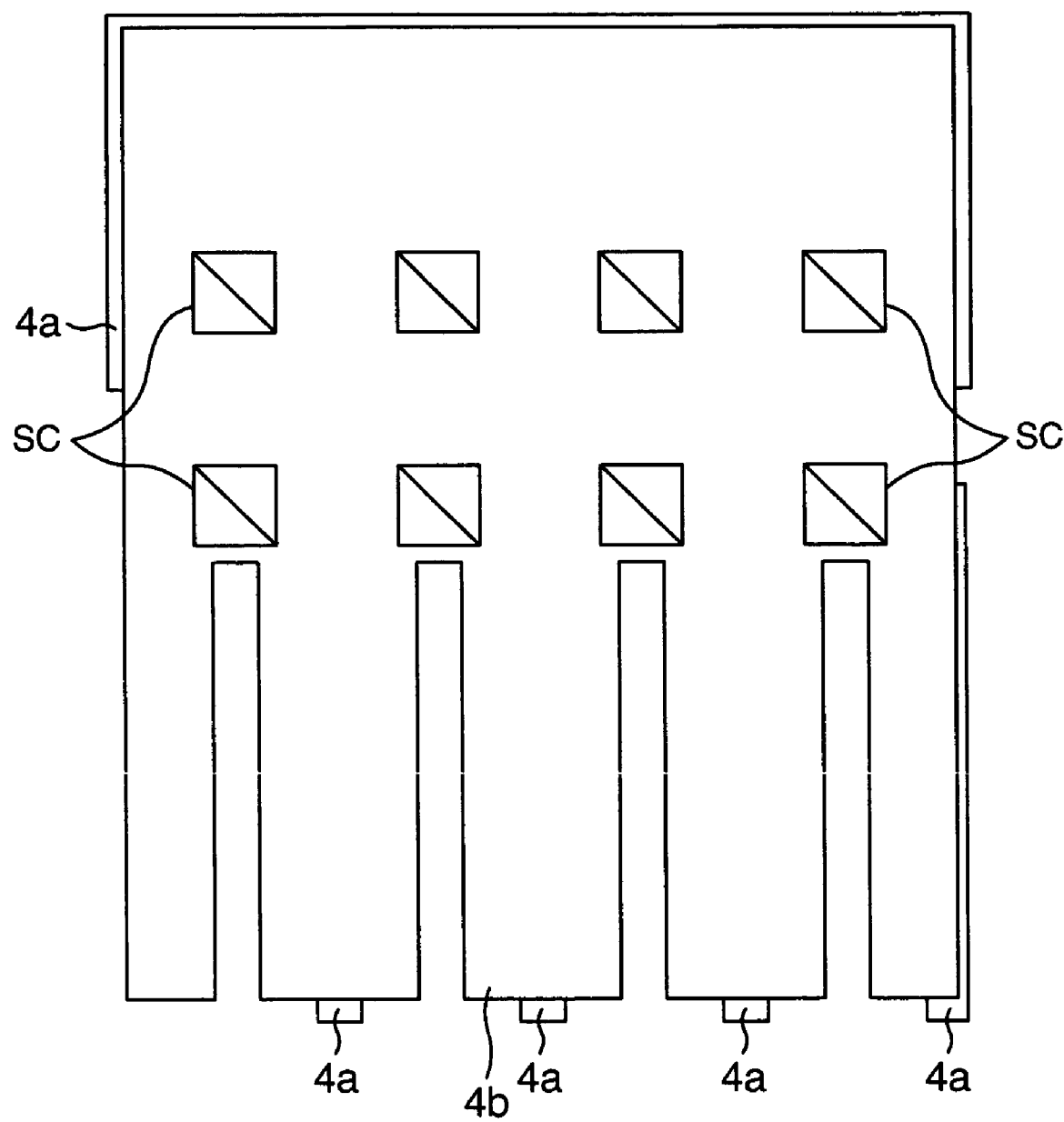
FIG. 31 is a plan view for representing a major portion of the same portion as that of FIG. 23 during manufacturing step of the flash memory subsequent to FIG. 29 and FIG. 30.
Figure 32:
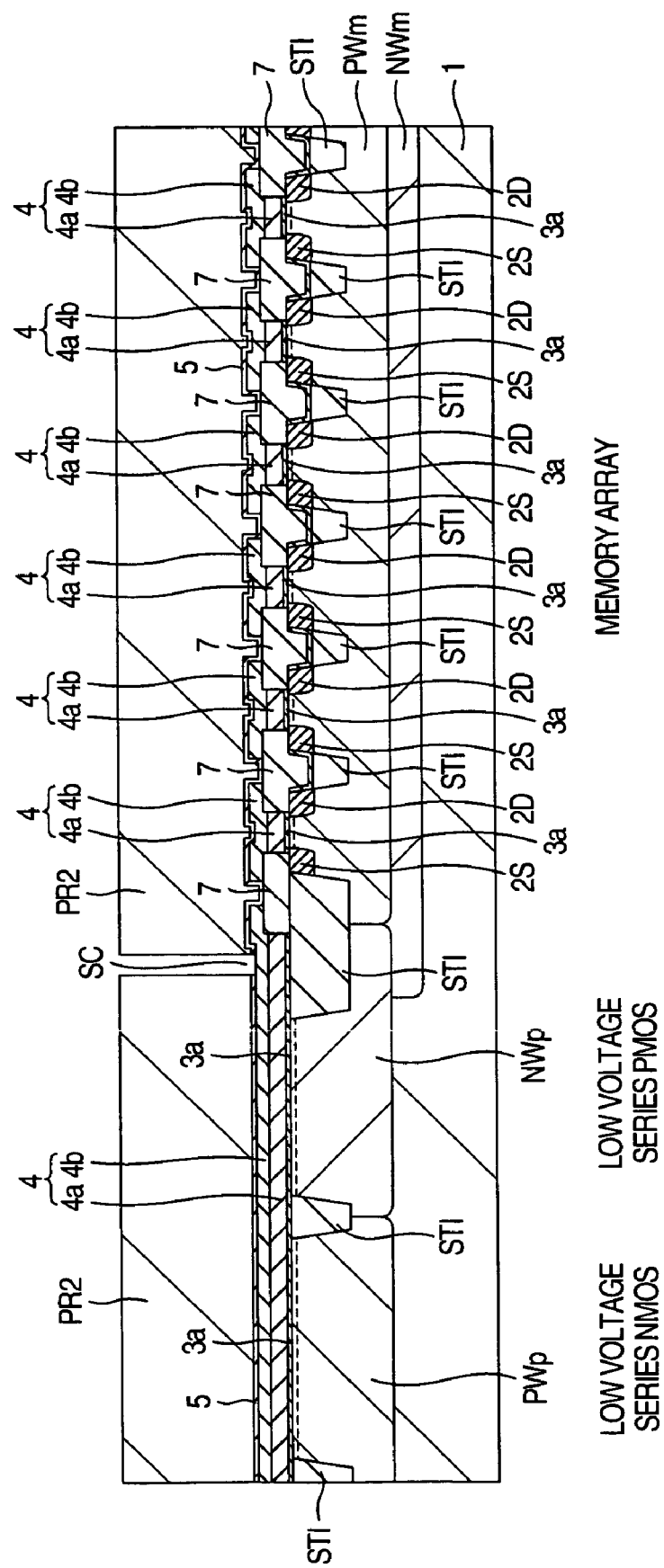
FIG. 32 is a sectional view for indicating a major portion of the same portion as that of FIG. 24 as to the flash memory during the same manufacturing step as that of FIG. 31.

Next, FIG. 31 is a plan view for showing a major portion of the semiconductor substrate at the same place as that of FIG. 23 in a subsequent manufacturing step. FIG. 32 is a sectional view for indicating a major portion of the semiconductor substrate at the same place as that of FIG. 24 in a subsequent manufacturing step.

In this step, first of all, for instance, since a silicon oxide film, a silicon nitride film, and a silicon oxide film are sequentially deposited on the semiconductor substrate 1 way of the CVD method, or the like, an interlayer film 5 having a thickness of, for example, approximately 15 nm is formed. Thereafter, a photoresist pattern PR2 used to form a contact hole SC is formed on this interlayer film 5 by way of the photolithography technique. Subsequently, while this photoresist pattern PR2 is employed as an etching mask, such an interlayer film 5 exposed from this photoresist pattern PR2 is removed by way of the dry etching method, or the like, so that a contact hole SC is formed in this interlayer film 5. It should be understood that in FIG. 31, the contact holes SC of an upper column are arranged on a gate electrode forming region of the selecting MOS, whereas the contact holes SC of a lower column are arranged on a gate electrode forming region of the shortcircuit MOS. Also, in FIG. 32, although the contract hole SC is not illustrated in the peripheral circuit region, such a contact hole SC that a portion of the conductive film 4b is exposed on these gate electrode forming regions of the MOSs at another position which is not shown in this sectional view of FIG. 32.

Figure 33:
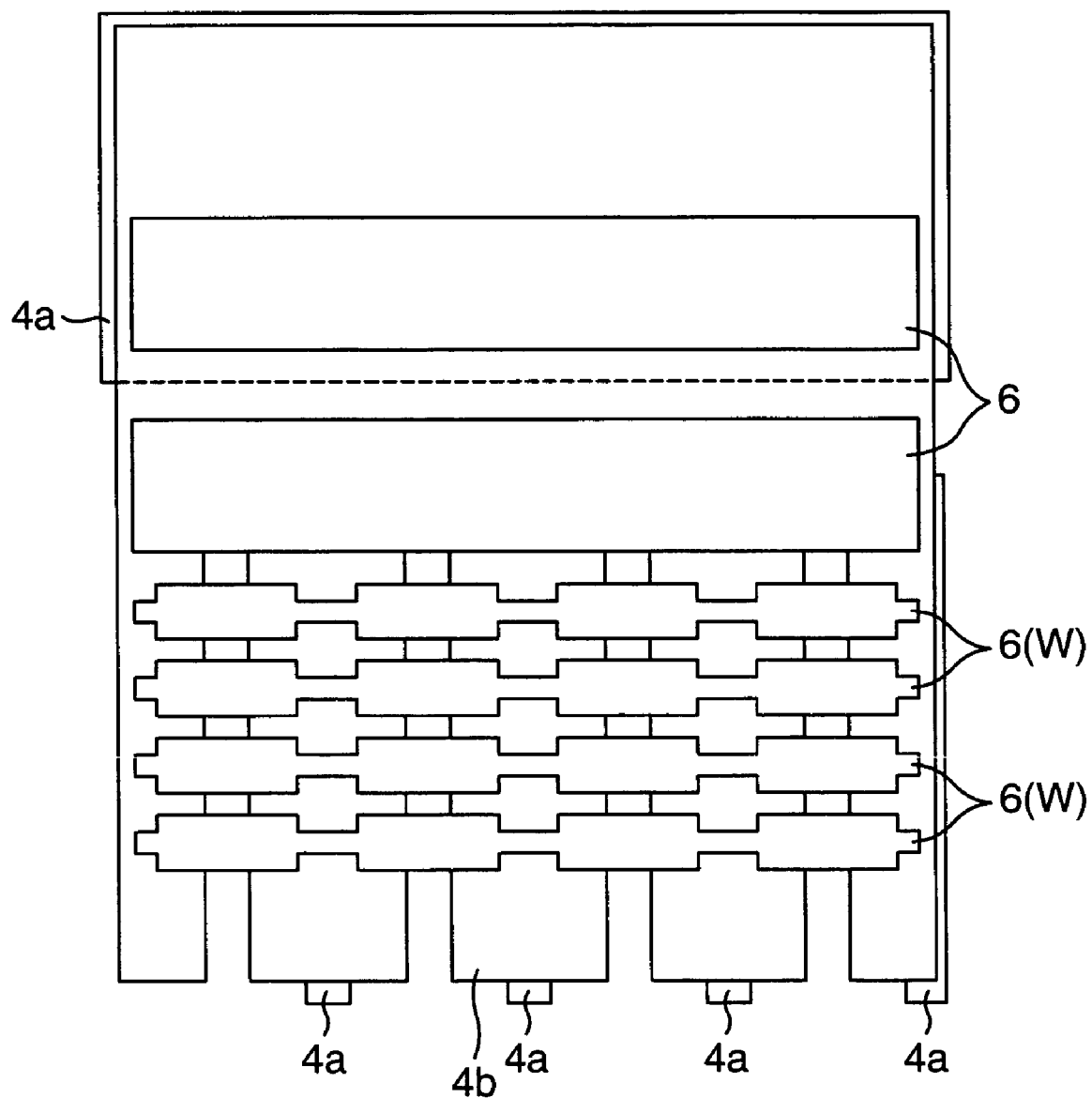
FIG. 33 is a plan view for representing a major portion of the same portion as that of FIG. 23 during manufacturing step of the flash memory subsequent to FIG. 31 and FIG. 32.
Figure 34:
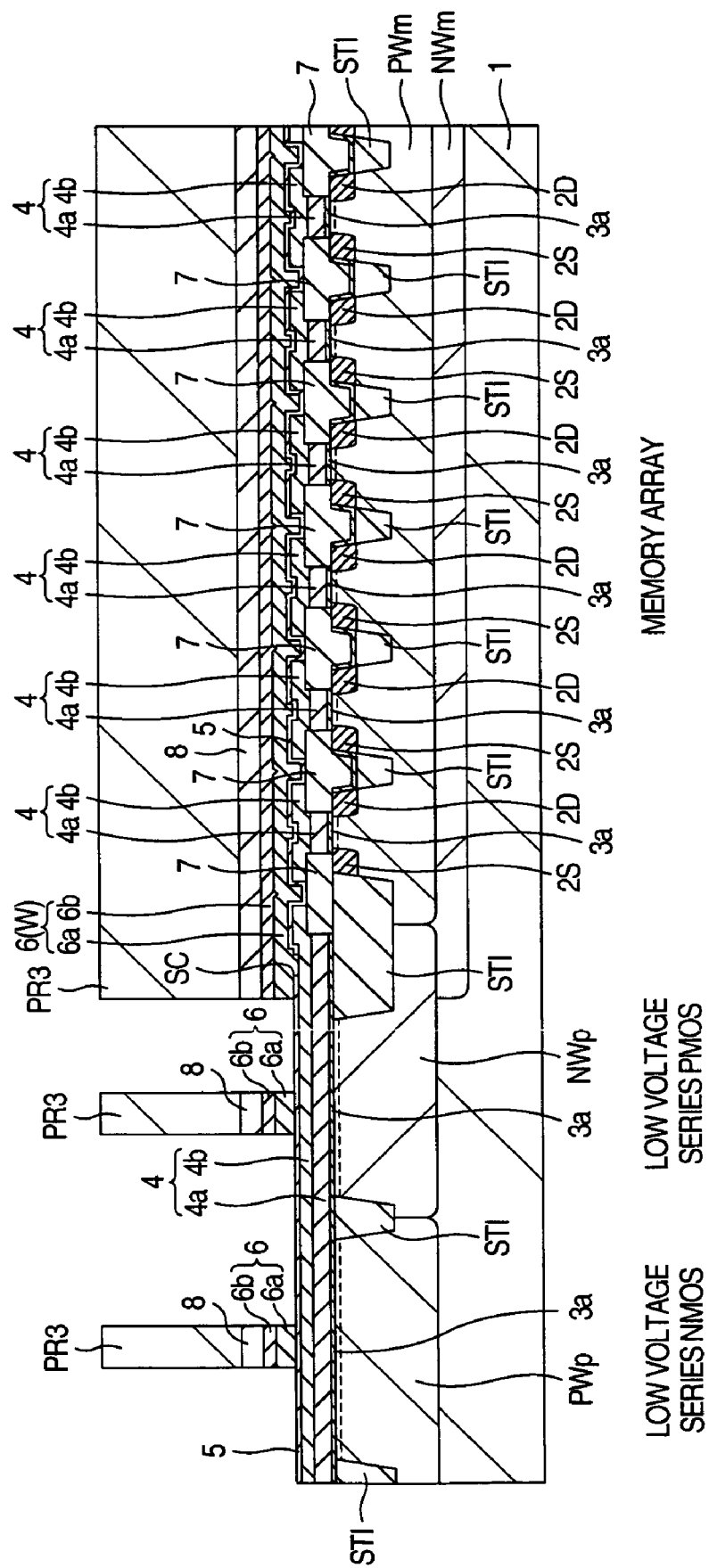
FIG. 34 is a sectional view for indicating a major portion of the same portion as that of FIG. 24 as to the flash memory during the same manufacturing step as that of FIG. 33.

Next, FIG. 33 is a plan view for showing a major portion of the semiconductor substrate at the same place as that of FIG. 23 in a subsequent manufacturing step. FIG. 34 is a sectional view for indicating a major portion of the semiconductor substrate at the same place as that of FIG. 24 in a subsequent manufacturing step.

In this step, first of all, after a lower layer conductive film 6a made of, for example, polycrystal silicon having a low resistance, an upper layer conductive film 6b made of a tungsten silicide etc, and a cap insulating film 8 made of a silicon oxide etc, have been deposited on the semiconductor substrate 1 in this order of the lower layer by way of the CVD method or the like, a photoresist pattern "PR3" is formed on these deposited films by way of the photolithography technique. While this photoresist pattern PR3 is employed as an etching mask, the cap insulating film 8, the upper layer conductive film 6b, and the lower layer conductive film 6a, which are exposed from this photoresist pattern PR3, are removed by the dry etching method, or the like. As a result, a control gate electrode (word line W) is formed in the memory array, whereas a portion of a gate electrode of each of these MOSs is formed in other regions, the peripheral circuit region, the shortcircuit MOS region, the selecting MOS region, and the like. In this etching treatment, the interlayer film 5 may function as an etching stopper.

Figure 35:
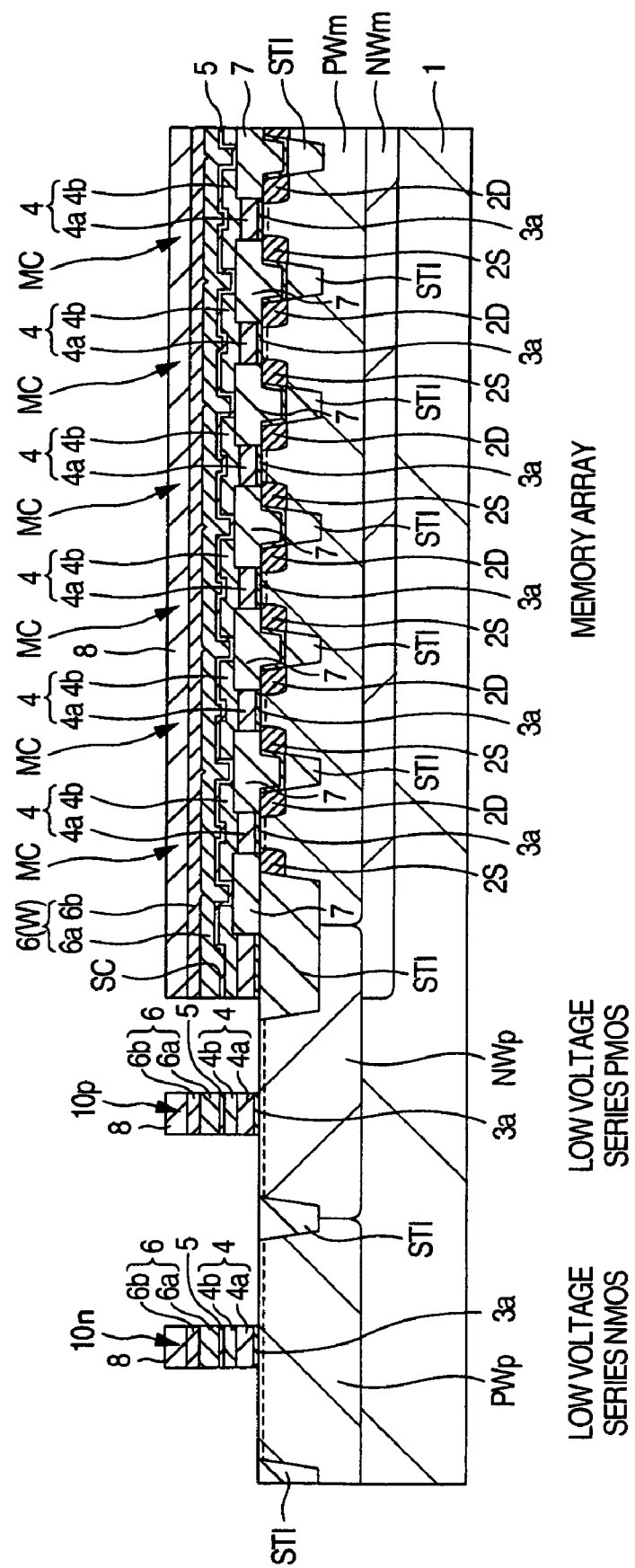
FIG. 35 is a sectional view for representing a major portion of the same portion as that of FIG. 24 during manufacturing step of the flash memory subsequent to FIG. 33 and FIG. 34.

Next, FIG. 35 is a sectional view for indicating a major portion of the semiconductor substrate at the same place as that of FIG. 24 in a subsequent manufacturing step.

In this step, first of all, while both the cap insulating film 8 and the conductive film 6 are used as an etching mask, the interlayer film 5, the upper layer conductive film 4b, and the lower layer conductive film 4a, which are located in a lower layer thereof, are etched away by the dry etching method, or the like. As a consequence, the conductive films 4 are patterned in a self-alignment manner with respect to the conductive film 6, so that the conductive films 4 may have the same shape along the word line direction.

As a consequence, both a control gate electrode and a floating gate electrode of a memory cell MC are accomplished in the memory array. In other words, such a 2-layer gate electrode structure may be accomplished in which the conductive film 6 for the control gate electrode is stacked via the interlayer film 5 on the conductive film 4 for the floating gate electrode. The floating gate electrode of the memory cell MC is completely insulated from the control gate electrode.

Also, in the peripheral circuit region, both a gate electrode 10n of a low voltage series NMOS and a gate electrode 10p of a low voltage series PMOS are accomplished. In the gate electrode of each of these MOSs, both the conductive film 4 and the conductive film 6 are electrically connected to each other via the contact hole SC. Although not shown in the drawing, both a gate electrode of a shortcircuit MOS and a gate electrode of a selecting MOS are also formed in both the shortcircuit MOS region and the selecting MOS region, respectively.

Figure 36:
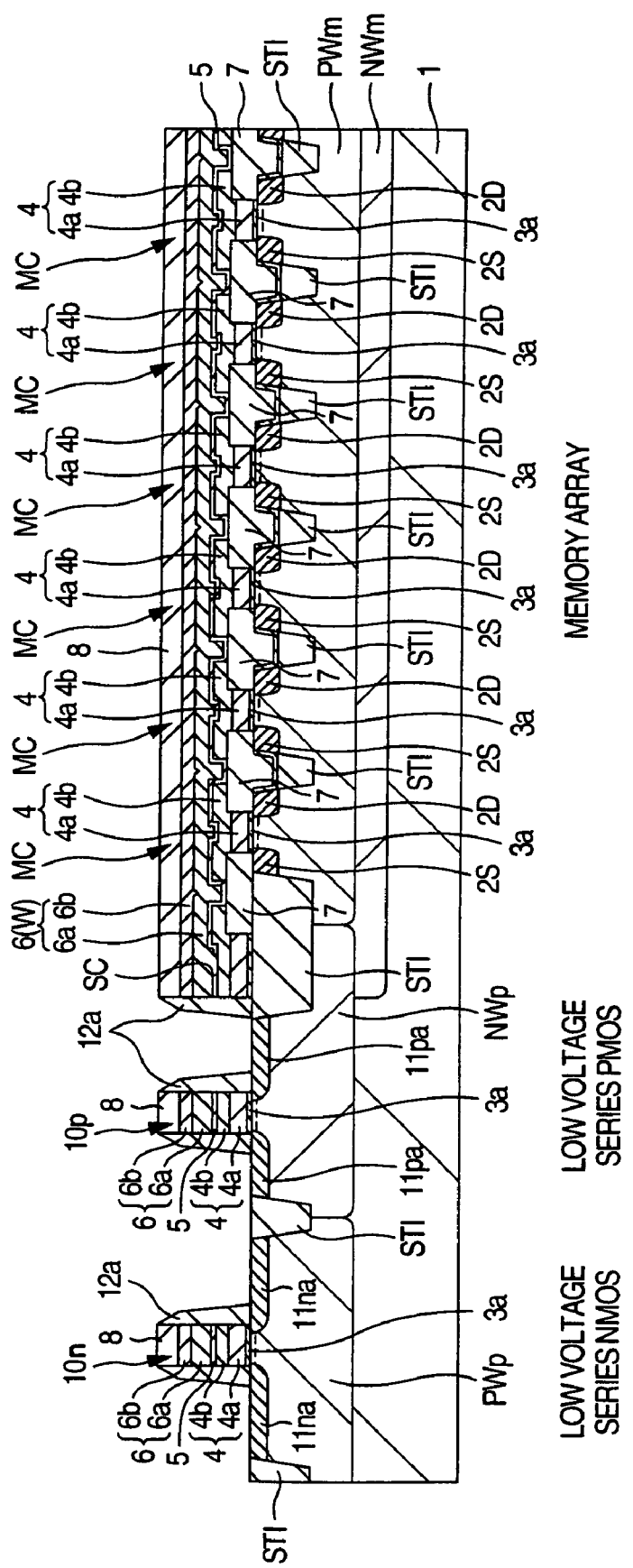
FIG. 36 is a sectional view for indicating a major portion of the same portion as that of FIG. 24 during manufacturing step of the flash memory subsequent to FIG. 35.

Next, FIG. 36 is a sectional view for indicating a major portion of the semiconductor substrate at the same place as that of FIG. 24 in a subsequent manufacturing step.

In this case, in the peripheral circuit region, semiconductor regions of the respective MOSs are separately formed, the impurity concentration of which is relatively low. For instance, an n type semiconductor region 11na is formed in the low voltage series NMOS, and a p type semiconductor region 11pa is formed in the low voltage series PMOS. In the n type semiconductor region 11na, for example, arsenic is conducted, whereas boron is conducted in the p type semiconductor region 11pa. Although not shown in the drawing, both a semiconductor region of a shortcircuit MOS and a semiconductor region of a selecting MOS are also formed in both the shortcircuit MOS region and the selecting MOS region, respectively.

Subsequently, after an insulating film made of, for example, a silicon oxide has been deposited on the major surface of the semiconductor device 1 by way of the CVD method, or the like, this deposited insulating film is etched back by using the anisotropic dry etching method, or the like. As a result, an insulating film 12a is formed on a side surface of the gate electrode 10n of the low voltage series NMOS and a side surface of the gate electrode 10p of the low voltage series PMOS. Although not shown in the drawing, the insulating films 12a are formed on side surfaces of both the gate electrode of the shortcircuit MOS and the side surface of the selecting MOS, respectively. Intermediate areas among the word lines W located adjacent to each other are embedded by this insulating film 12a.

Figure 37:
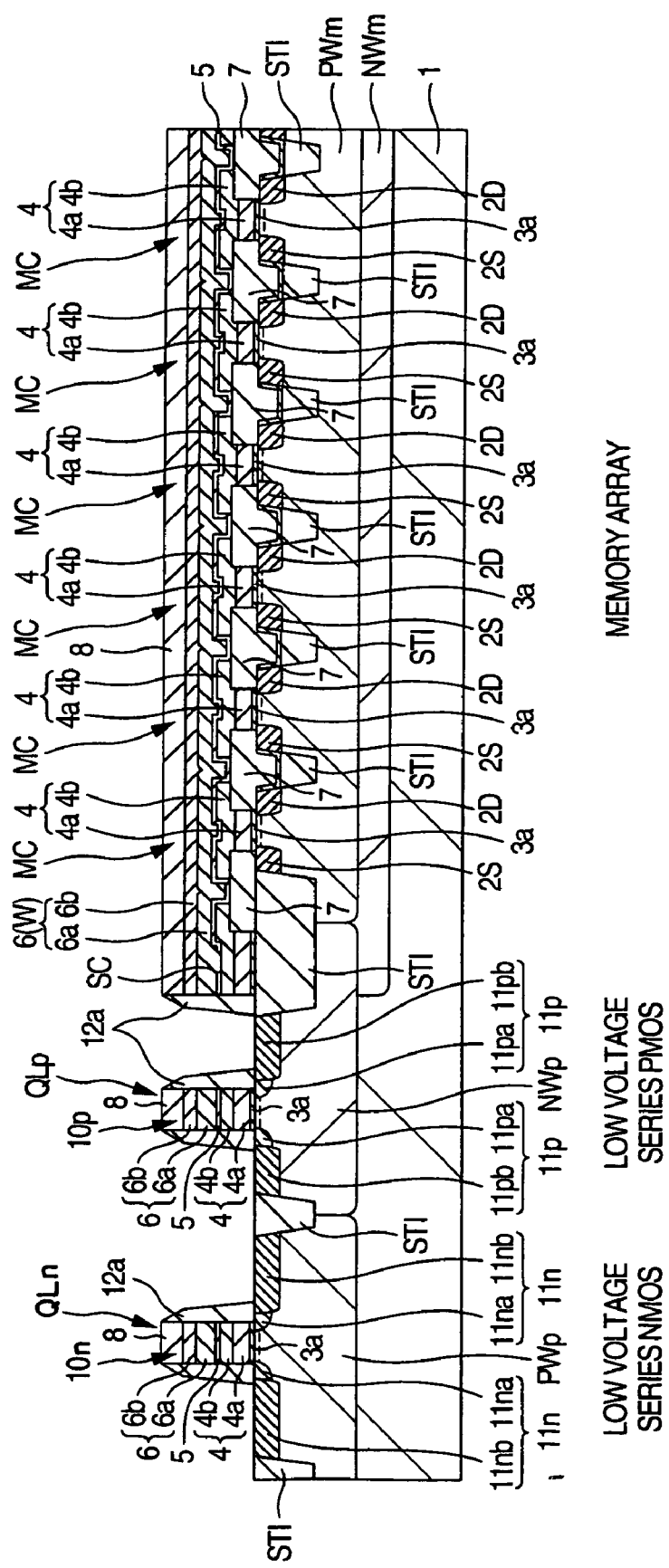
FIG. 37 is a sectional view for indicating a major portion of the same portion as that of FIG. 24 during manufacturing step of the flash memory subsequent to FIG. 36.

Next, FIG. 37 is a sectional view for indicating a major portion of the semiconductor substrate at the same place as that of FIG. 24 in a subsequent manufacturing step.

In this manufacturing step, within the peripheral circuit region, the shortcircuit MOS region, and the selecting MOS region, semiconductor regions of the respective MOSs are separately formed, the impurity concentration of which is relatively high. For instance, an n type semiconductor region 11nb is formed in the low voltage series NMOS, and a p type semiconductor region 11pb is formed in the low voltage series PMOS. In the n type semiconductor region 11nb, for example, arsenic is conducted, whereas boron is conducted in the p type semiconductor region 11pb. As a consequence, one pair of n type semiconductor regions 11a for sources/drains of the low voltage series NMOS, and, also, one pair of p type semiconductor regions 11p for sources/drains of the low voltage series PMOS are formed. In the peripheral circuit region, both a low voltage series NMOSQLn and another low voltage series PMOSQLp are accomplished. Although not shown in the drawing, one pair of n type semiconductor regions for sources/drains of the selecting MOS are formed.

Figure 38:
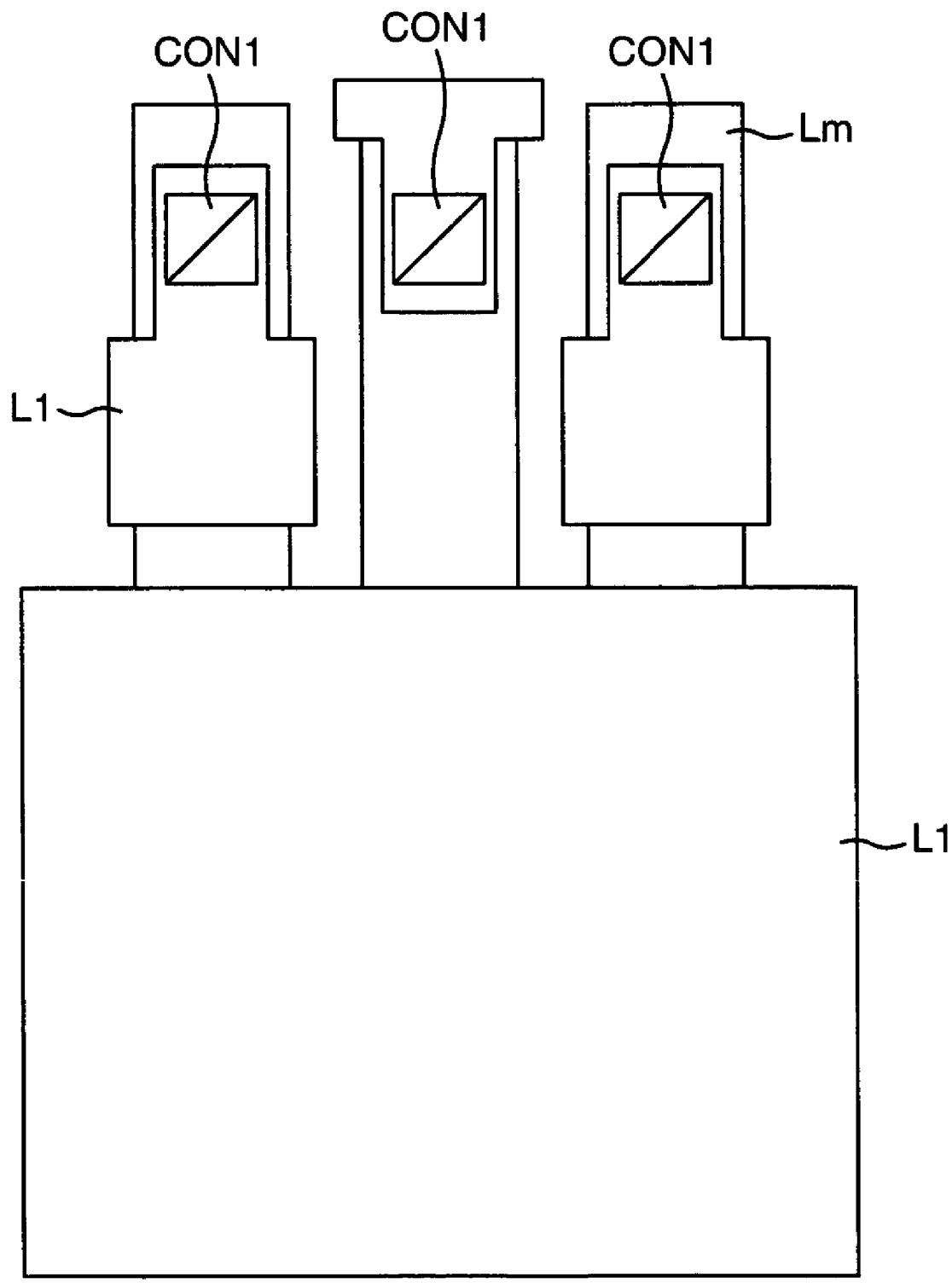
FIG. 38 is a plan view for indicating a major portion of the same portion as that of FIG. 23 during manufacturing step of the flash memory subsequent to FIG. 37.
Figure 39:
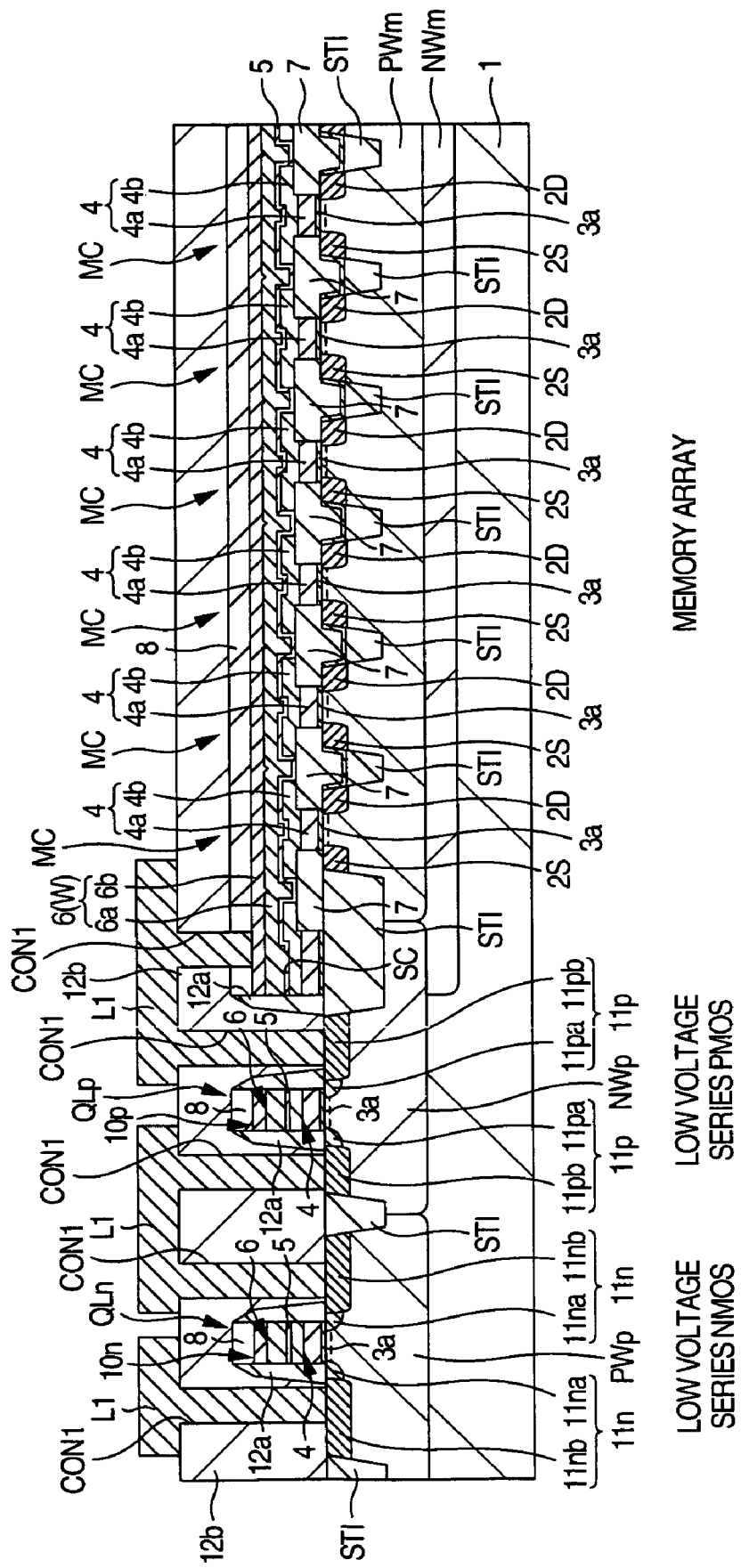
FIG. 39 is a sectional view for indicating a major portion of the same portion as that of FIG. 24 as to the flash memory during the same manufacturing step as that of FIG. 38.

Next, FIG. 38 is a plan view for showing a major portion of the semiconductor substrate at the same place as that of FIG. 23 in a subsequent manufacturing step. FIG. 39 is a sectional view for indicating a major portion of the semiconductor substrate at the same place as that of FIG. 24 in a subsequent manufacturing step.

In this manufacturing step, an insulating film 12b made of, for example, a silicon oxide is deposited on the semiconductor substrate 1 by way of the CVD method, or the like. Thereafter, a contact hole "CON1" is pierced in this deposited insulating film 12b by way of both the photolithography technique and the dry etching technique in such a manner that a portion (source/drain region of each MOS) of the semiconductor substrate 1, a portion of the word line W, and a portion of a gate electrode of a predetermined MOS are exposed.

Subsequently, after such a metal film as tungsten and the like has been deposited on this semiconductor substrate 1 by way of the sputtering method, or the like, this deposited metal film is patterned by using the photolithography technique and the dry etching technique, so that a first layer wiring line "L1" (including common source line) is formed. The first layer wiring line L1 is electrically and properly connected via the contact hole CON1 to one pair of these semiconductor regions for the source/drain of each MOS, the gate electrode thereof, and the word line W thereof.

Figure 40:
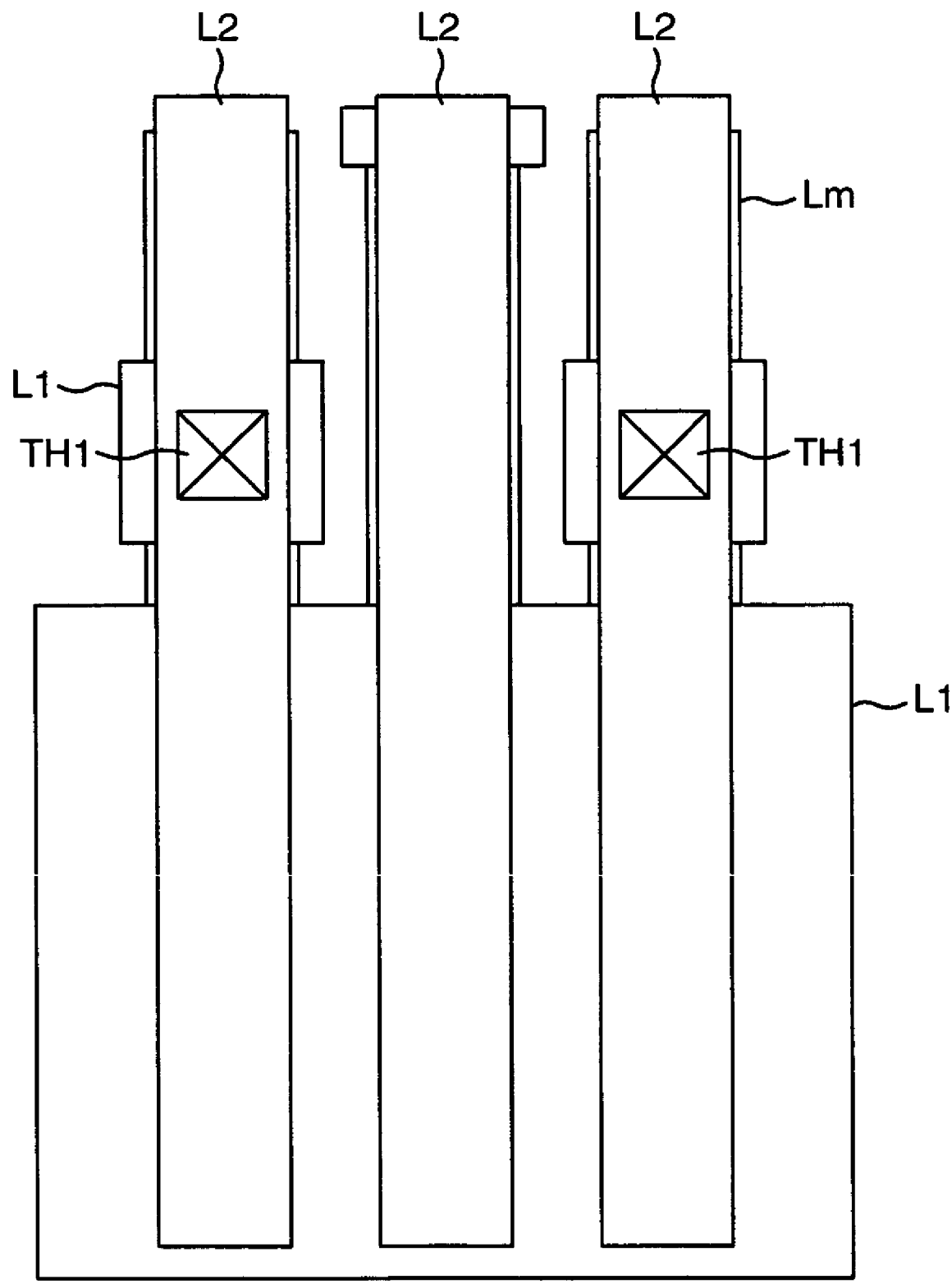
FIG. 40 is a plane view for representing a major portion of the same portion as that of FIG. 23 during manufacturing step of the flash memory subsequent to FIG. 38 and FIG. 39.
Figure 41:
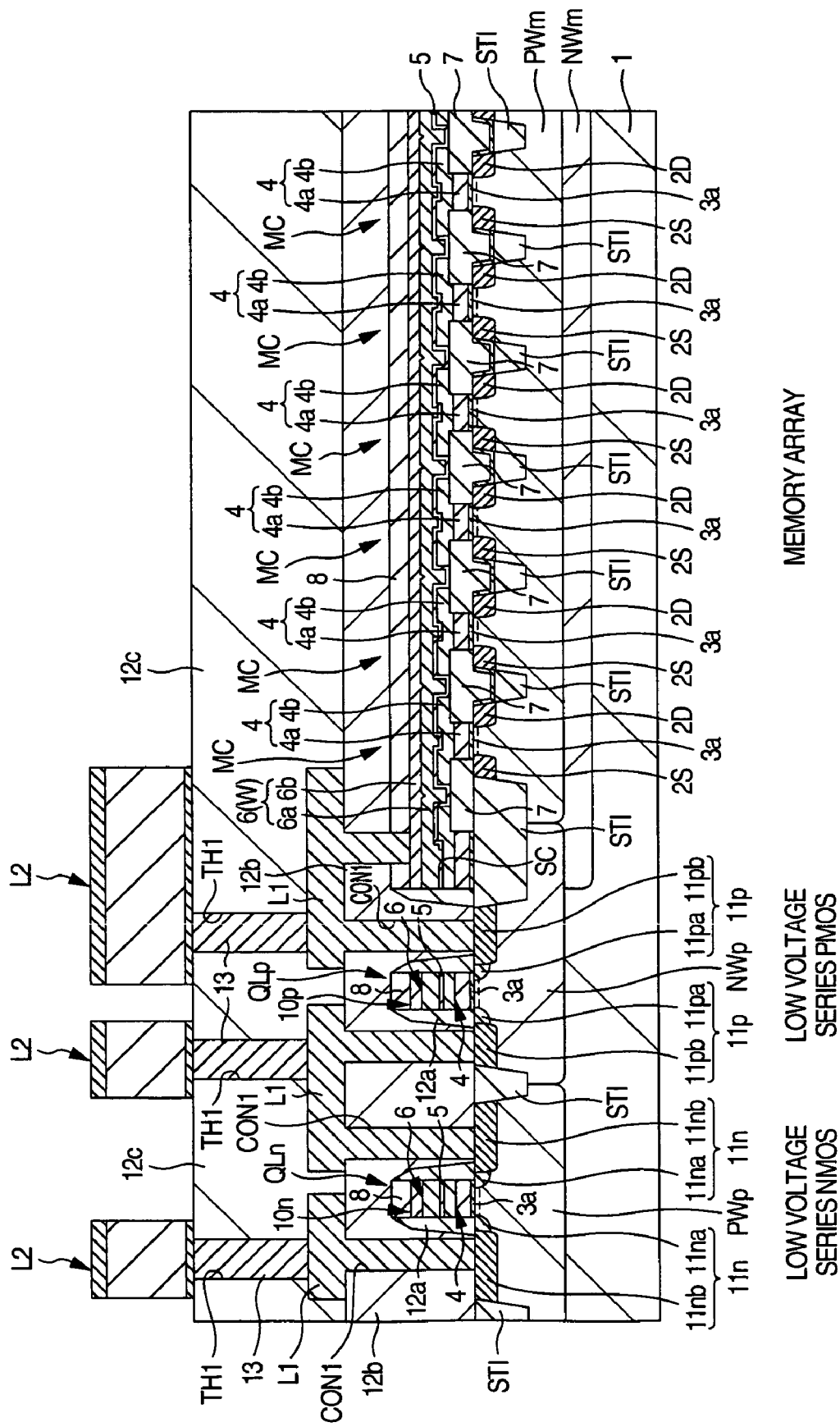
FIG. 41 is a sectional view for indicating a major portion of the same portion as that of FIG. 24 as to the flash memory during the same manufacturing step as that of FIG. 40.

Next, FIG. 40 is a plan view for showing a major portion of the semiconductor substrate at the same place as that of FIG. 23 in a subsequent manufacturing step. FIG. 41 is a sectional view for indicating a major portion of the semiconductor substrate at the same place as that of FIG. 24 in a subsequent manufacturing step.

In this manufacturing step, after such an insulating film 12c made of, for instance, a silicon oxide has been deposited on the semiconductor substrate 1 by way of the CVD method, or the like, a through hole "TH1" is pierced in this deposited insulating film 12c by utilizing both the photolithography technique and the dry etching technique in such a manner that a portion of the first layer wiring line L1 is exposed. Subsequently, after such a metal film as tungsten is deposited on this semiconductor substrate 1 by way of either the sputtering method or the CVD method, this deposited metal film is polished by the CMP method in such a manner that this metal film is left within the through hole TH1, so that a plug 13 is formed within this through hole TH1. Thereafter, for example, a titanate nitride, aluminum, and a titanate nitride are sequentially deposited on the semiconductor substrate 1, in that order. Then, these deposited layers are patterned by using both the photolithography technique and the dry etching technique, so that a second layer wiring line L2 (containing main bit line) is formed. The second layer wiring line L2 is electrically connected via the plug 13 to the first layer wiring line L1.

Next, FIG. 42 is a sectional view for indicating a major portion of the semiconductor substrate at the same place as that of FIG. 24 in a subsequent manufacturing step.

In this manufacturing step, after such an insulating film 12d made of, for instance, a silicon oxide has been deposited on the semiconductor substrate 1 by way of the CVD method, or the like, a through hole "TH2" is pierced in this deposited insulating film 12d by utilizing both the photolithography technique and the dry etching technique in such a way that a portion of the second layer wiring line L2 is exposed in a similar forming manner to the above-explained through hole TH1. Subsequently, similar to the above-described plug 13, after a plug 17 made of tungsten has been formed within the through hole TH2, a third layer wiring line L3 which is constituted by, for example, a titanate nitride, aluminum, and a titanate nitride is formed on the semiconductor substrate 1 in a similar manner to the second layer wiring line L2. The third layer wiring line L3 is electrically connected via the plug 17 to the second layer wiring line L2.

Thereafter, after a surface protection film has been formed on the semiconductor substrate 1, an opening is formed in a portion of this surface protection film in such a manner that a portion of the third layer wiring line L3 is exposed, and a bonding pad is formed, so that a flash memory may be manufactured.

As previously explained, in accordance with this embodiment mode, since the isolating portion STI of the memory array, in which the width of the active region "Lm" is made relatively narrow and the pattern density is made relatively high may be employed as the recess structure having the relatively large recess amount, the stresses caused by the isolating portion STI in the semiconductor substrate 1 can be reduced. As a result, while the crystalline defect of the semiconductor substrate 1 is suppressed, the margin of the junction leak of the memory cells can be improved.

Furthermore, since the margin of the junction leak of the memory cells can be improved, the sizes of the memory cells can be reduced, so that the high-speed writing characteristic can be realized by reducing the gate lengths, and also, the size of the semiconductor chip can be shortened.

While the present invention made by the Inventors has been described in the concrete manner based upon the various embodiment modes of the present invention, the present invention is not limited thereto, but may be modified, changed, and substituted without departing from the technical spirit and scope of the present invention.

For example, the above-described embodiment has explained such a case that the inventive idea of the present invention is applied to the AND type flash memory. Alternatively, the inventive idea of the present invention may be similarly applied to all of such short-shaped memory element products having repetition characteristic, to which very fine needs and low power consumption needs are highly required, while these memory elements may involve NOR type flash memories and DRAMs (Dynamic Random Access Memories). Also, a similar effect may be achieved even in SRAMs (Static Random Access Memories) and/or logic semiconductor devices.

It should be further understood by those skilled in the art that although the foregoing detailed description has been made using the embodiments disclosed herein, the invention is not to be construed as being limited thereto and that various changes and modifications may be made without departing from the spirit of the invention and the scope of the appended claims.

The invention claimed is:

1. A semiconductor device comprising:
   a semiconductor substrate;
   an element isolating region having a trench formed in said semiconductor substrate and an insulating film which is embedded into said trench; and
   an active region formed in said semiconductor substrate and including a well region in which a gate insulating film is formed thereon and a gate electrode is formed on the gate insulating film, said well region having ion implanted source and drain diffusion regions provided in correspondence to said gate electrode,
   wherein the embedded insulating film in said trench has a bottom surface plane extended deeper into said semiconductor substrate than said diffusion regions and surrounds said active region, in a plan view thereof,
   wherein the embedded insulating film has a recessed upper plane surface surrounding at least said source and drain diffusion regions to prevent crystalline defects caused by said element isolation region at vicinity of said diffusion regions, the recessed upper plane surface defining a depth, extended from a plane surface of said semiconductor substrate, substantially the same as or greater than that of the depth of the peak concentration of the impurity profile of each of said source and drain diffusion regions, and wherein an oxynitride film is formed along side and bottom surface planes of the embedded insulating film in said trench and interfacing with said silicon substrate.

2. A semiconductor device as claimed in claim 1 wherein:

a thermal oxide film is provided along both bottom and sidewall of said trench and said oxynitride film is formed along side and bottom surface planes of said thermal oxide film interfacing with said silicon substrate.

3. A semiconductor device as claimed in claim 1 wherein:

said depth of said recessed upper plane surface is larger than a thickness of said gate insulating film.

4. A semiconductor device as claimed in claim 1 wherein:

said depth of said recessed upper plane surface is larger than a distance defined from a surface of said semiconductor substrate to said depth where the impurity profile of said ion implanted source and drain regions is at peak concentration.

5. A semiconductor device as claimed in claim 1 wherein:

said embedding insulating film has a recessed upper plane surface throughout said trench except where said gate electrode is positioned.

6. A semiconductor device as claimed in claim 1 wherein:

the recessed upper plane surface defines a depth measured from a location on said plain surface of the substrate midway between an edge of the gate electrode and the near sidewall of the trench.

7. A semiconductor device comprising:

a semiconductor substrate including a plurality of active regions where elements are formed in a well region, and an element isolating region for mutually isolating said plural active regions from each other;

a gate electrode formed via a gate insulating film on a surface of each of the active regions of said semiconductor substrate, wherein each element of an active region has ion implanted source and drain diffusion regions provided in correspondence to said gate electrode thereof; and a trench formed in the element isolating region of said semiconductor substrate, into which an insulating film is embedded, wherein the embedded insulating film in said trench has a bottom surface plane extended deeper into said semiconductor substrate than said diffusion regions and surrounds each of said active regions, in a plan view thereof, wherein the embedded insulating film has a recessed upper plane surface surrounding at least said source and drain diffusion regions to prevent crystalline defects caused by said element isolation region at vicinity of said diffusion regions, the recessed upper plane surface defining a depth, extended from a plane surface of said semiconductor substrate, substantially the same as or greater than that of the depth of the peak concentration of the impurity profile of each of said source and drain diffusion regions, and wherein an oxynitride film is formed along side and bottom surface planes of the embedded insulating film in said trench and interfacing with said silicon substrate.

8. A semiconductor device as claimed in claim 7 wherein:

a thermal oxide film is provided along both bottom and sidewall of said trench and said oxynitride film is formed along side and bottom surface planes of said thermal oxide film interfacing with said silicon substrate.

9. A semiconductor device as claimed in claim 7 wherein:

said depth of said recessed upper plane surface is larger than a thickness of said gate insulating film.

10. A semiconductor device as claimed in claim 7 wherein:

said depth of said recessed upper plane surface is larger than a distance defined from a surface of said semiconductor substrate to said depth where the impurity profile of said ion implanted source and drain regions is at peak concentration.

11. A semiconductor device as claimed in claim 7 wherein:

said embedding insulating film has a recessed upper plane surface throughout said trench except where said gate electrode is positioned.

12. A semiconductor device as claimed in claim 7 wherein:

the recessed upper plane surface defines a depth measured from a location on said plain surface of the substrate midway between an edge of the gate electrode and the near sidewall of the trench.

* * * * *